United States Patent
Joshi et al.

(10) Patent No.: US 9,866,829 B2
(45) Date of Patent: Jan. 9, 2018

(54) CODING OF SYNTAX ELEMENTS THAT CORRESPOND TO COEFFICIENTS OF A COEFFICIENT BLOCK IN VIDEO CODING

(71) Applicant: QUALCOMM Incorporated, San Diego, CA (US)

(72) Inventors: Rajan Laxman Joshi, San Diego, CA (US); Jianle Chen, San Diego, CA (US); Wei-Jung Chien, San Diego, CA (US); Vadim Seregin, San Diego, CA (US); Joel Sole Rojals, La Jolla, CA (US); Marta Karczewicz, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 658 days.

(21) Appl. No.: 13/744,086

(22) Filed: Jan. 17, 2013

(65) Prior Publication Data

US 2013/0188699 A1    Jul. 25, 2013

Related U.S. Application Data

(60) Provisional application No. 61/589,384, filed on Jan. 22, 2012, provisional application No. 61/592,300, (Continued)

(51) Int. Cl.
*H04N 19/134* (2014.01)
*H04N 19/50* (2014.01)
(Continued)

(52) U.S. Cl.
CPC .... *H04N 19/00569* (2013.01); *H03M 7/4006* (2013.01); *H04N 19/102* (2014.11); (Continued)

(58) Field of Classification Search
CPC .... H04N 19/102; H04N 19/13; H04N 19/134; H04N 19/18; H04N 19/70
See application file for complete search history.

(56) References Cited

U.S. PATENT DOCUMENTS

2006/0017592 A1*   1/2006   Shim et al. ............ 341/50
2006/0158355 A1    7/2006   Jeon et al.
(Continued)

FOREIGN PATENT DOCUMENTS

CN    102186075 A    9/2011
CN    102238387 A    11/2011
(Continued)

OTHER PUBLICATIONS

W. Yu et al., "A High Performance CABAC Decoding Architechture," IEEE Trans. on Consumer Electronics, vol. 51, No. 4, pp. 1352-1359, Nov. 2005.*
(Continued)

*Primary Examiner* — William C Vaughn, Jr.
*Assistant Examiner* — Michael J Hess

(57) ABSTRACT

A video encoder performs multiple coding passes on coefficients in a coefficient block. During each coding pass, the video encoder encodes a different set of syntax elements for coefficients in the coefficient block. A video decoder uses the syntax elements for a coefficient to determine the value of the coefficient. When the video encoder performs a coding pass, the video encoder selects a coding context for a syntax element based at least in part on a syntax element generated in an earlier coding pass for a non-causal coefficient and based at least in part on a value of a syntax element generated during the current coding pass for a causal coefficient. The video encoder entropy encodes the syntax element based on the selected coding context. A video decoder performs a similar series of coding passes in which the video decoder selects coding contexts and entropy decodes the syntax elements.

48 Claims, 15 Drawing Sheets

Related U.S. Application Data filed on Jan. 30, 2012, provisional application No. 61/606,300, filed on Mar. 2, 2012, provisional application No. 61/606,304, filed on Mar. 2, 2012, provisional application No. 61/606,338, filed on Mar. 2, 2012, provisional application No. 61/625,062, filed on Apr. 16, 2012, provisional application No. 61/625,072, filed on Apr. 16, 2012.

(51) Int. Cl.

| | | |
|---|---|---|
| H03M 7/40 | (2006.01) | |
| H04N 19/176 | (2014.01) | |
| H04N 19/70 | (2014.01) | |
| H04N 19/13 | (2014.01) | |
| H04N 19/129 | (2014.01) | |
| H04N 19/102 | (2014.01) | |
| H04N 19/103 | (2014.01) | |
| H04N 19/18 | (2014.01) | |
| H04N 19/42 | (2014.01) | |

(52) U.S. Cl.
CPC ......... *H04N 19/103* (2014.11); *H04N 19/129* (2014.11); *H04N 19/13* (2014.11); *H04N 19/134* (2014.11); *H04N 19/176* (2014.11); *H04N 19/18* (2014.11); *H04N 19/42* (2014.11); *H04N 19/50* (2014.11); *H04N 19/70* (2014.11)

(56) References Cited

U.S. PATENT DOCUMENTS

| | | | |
|---|---|---|---|
| 2008/0219578 A1 | 9/2008 | Lee | |
| 2009/0232204 A1 | 9/2009 | Lee et al. | |
| 2009/0279797 A1 | 11/2009 | Choi et al. | |
| 2011/0206135 A1 | 8/2011 | Drugeon et al. | |
| 2012/0008675 A1 | 1/2012 | Karczewicz et al. | |
| 2012/0014433 A1 | 1/2012 | Karczewicz et al. | |
| 2012/0082218 A1 | 4/2012 | Misra et al. | |
| 2012/0082233 A1* | 4/2012 | Sze et al. | 375/240.18 |
| 2012/0121011 A1 | 5/2012 | Coban et al. | |
| 2012/0230418 A1 | 9/2012 | Sole Rojals et al. | |
| 2013/0101046 A1* | 4/2013 | Korodi et al. | 375/240.18 |
| 2014/0140400 A1* | 5/2014 | George et al. | 375/240.12 |
| 2015/0003514 A1* | 1/2015 | Hsu et al. | 375/240.02 |

FOREIGN PATENT DOCUMENTS

| | | |
|---|---|---|
| WO | 2010063184 A1 | 6/2010 |
| WO | 2011128303 A2 | 10/2011 |
| WO | 2011128366 A1 | 10/2011 |
| WO | 2012051033 A1 | 4/2012 |
| WO | 2012068021 A1 | 5/2012 |
| WO | 2013012819 A2 | 1/2013 |
| WO | 2013106710 A2 | 7/2013 |
| WO | 2013108639 A1 | 7/2013 |

OTHER PUBLICATIONS

C.-H. Kim et al., "Parallel Decoding of Context-Based Adaptive Binary Arithmetic Codes Based on Most Probably Symbol Prediction," IEICE Trans. on Information and Systems, vol. E90-D, No. 2, pp. 609-612, Feb. 2007.*
J.-H. Lin et al., "Parallelization of Context-Based Adaptive Binary Arithmetic Coders," IEEE Trans. on Signal Processing, vol. 54, No. 10, pp. 3702-3711, Oct. 2006.*
V. Sze, et al., "Parallel CABAC for Low Power Video Coding," in IEEE International Conf. on Image Processing, Oct. 2008.*
Sze, V. et al., "A High Throughput CABAC Algorithm Using Syntax Element Partitioning." Image Processing (ICIP), 2009 16$^{th}$ IEEE International Conference 2009 pp. 773-776.*
Bross et al., "High Efficiency Video Coding (HEVC) text specification draft 10 (for FDIS & Last Call)," Joint Collaborative Team on Video Coding, JCTVC-L1003_v34, Jan. 14-23, 2013, 310 pp.
Bross et al., "High efficiency video coding (HEVC) text specification draft 6," Joint Collaborative Team on Video Coding, JCTVC-H1003, Nov. 21-30, 2011, 259 pp.
Bross et al., "High efficiency video coding (HEVC) text specification draft 7," Joint Collaborative Team on Video Coding, JCTVC-I1003_D2, Apr. 27-May 7, 2012, 290 pp.
Bross et al., "High efficiency video coding (HEVC) text specification draft 8," Joint Collaborative Team on Video Coding, JCTVC-J1003_D7, Jul. 11-20, 2012, 261 pp.
Bross et al., "High efficiency video coding (HEVC) text specification draft 9," Joint Collaborative Team on Video Coding, JCTVC-K1003_v7, Oct. 10-19, 2012, 290 pp.
Bross et al., "WD4: Working Draft 4 of High-Efficiency Video Coding," Joint Collaborative Team on Video Coding, JCTVC-F803_d2, Jul. 14-22, 2011, 226 pp.
Bross et al., "WD5: Working Draft 5 of High-Efficiency Video Coding," Joint Collaborative Team on Video Coding, JCTVC-G1103_d2, Nov. 21-30, 2011, 214 pp.
Budagavi et al.,"Parallel context processing techniques for high coding efficiency entropy coding in HEVC", Joint Collaborative Team on Video Coding, JCTVC-B088, Jul. 21-24, 2010, 11 pp.
Chen et al: "Non-CE1: throughput improvement on CABAC coefficients level coding", Joint Collaborative Team on Video Coding, JCTVC-H0554, Feb. 1-10, 2012, 6 pp.
International Search Report and Written Opinion—PCT/US2013/022178—ISA/EPO—dated Apr. 26, 2013—20 pp.
International Telecommunication Union, "Advanced video coding for generic audiovisual services," Standardization Sector of ITU, Jun. 2011, 674 pp.
McCann et al., "High Efficiency Video Coding (HEVC) Test Model 5 (HM 5) Encoder Description", Joint Collaborative Team on Video Coding, JCTVC-G1102, Nov. 21-30, 2011, 45 pp.
Nguyen et al: "Improved Context Modeling for Coding Quantized Transform Coefficients in Video Compression", IEEE Picture Coding Symposium, Dec. 8-10, 2010, 4 pp.
Nguyen et al., "Non-CE11: Proposed Cleanup for Transform Coefficient Coding," Joint Collaborative Team on Video Coding, Document JCTVC-H0228, Feb. 1-10, 2012, 9 pp.
Sole Rojals et al., "Transform Coefficient Coding in HEVC", IEEE Transactions on Circuits and Systems for Video Technology, vol. 22, No. 12, Dec. 2012, 13 pp.
Sole Rojals et al., "CE11: Scanning Passes of Residual Data in HE", Joint Collaborative Team on Video Coding, JCTVC-G320, Nov. 21-30, 2011, 3 pp.
Sullivan et al., "Meeting report of the seventh meeting of the Joint Collaborative Team on Video Coding (JCT-VC), Geneva, CH, Nov. 21-30, 2011," Joint Collaborative Team on Video Coding, Document: JCTVC-G1100, Nov. 21-30, 2011, 305 pp.
Sze, et al., "Parallel Context Processing of Coefficient Level", Joint Collaborative Team on Video Coding, JCTVC-F130, Jul. 14-22, 2011, 4 pp.
Wiegand et al., "WD2: Working Draft 2 of High-Efficiency Video Coding", Joint Collaborative Team on Video Coding, JCTVC-D503, Jan. 20-28, 2011, 153 pp.
Wiegand et al., "WD3: Working Draft 3 of High-Efficiency Video Coding," Joint Collaborative Team on Video Coding, JCTVC-E603, Mar. 16-23, 2011,193 pp.
Wiegand et al.,"WD1: Working Draft 1 of High-Efficiency Video Coding", Joint Collaborative Team on Video Coding, JCTVC-C403, Oct. 7-15, 2010, 137 pp.
U.S. Appl. No. 13/738,565, filed Jan. 10, 2013, by Vadim Seregin.
Bross, et al., "High efficiency video coding (HEVC) text specification draft 6," JCTVC-H1003, Joint Collaborative Team on Video Coding (JCT-VC) of ITU-T SG16 WP3 and ISO/IEC JTC1/SC29/WG11, 8th Meeting: San José, CA, USA, Feb. 1-10, 2012, 259 pp.
ITU-T H.265, Series H: Audiovisual and Multimedia Systems, Infrastructure of audiovisual services—Coding of moving video, Advanced video coding for generic audiovisual services, The International Telecommunication Union. Apr. 2013, 317 pp.

(56) References Cited

OTHER PUBLICATIONS

Response to Written Opinion dated Apr. 26, 2013, from International Application No. PCT/US2013/022178, filed on Jul. 1, 2013.
Second Written Opinion from International Application No. PCT/US2013/022178, dated Feb. 13, 2014, 14 pp.
International Preliminary Report on Patentability—PCT/US2013/022178, The International Bureau of WIPO—Geneva, Switzerland, dated Jun. 3, 2014.
Seregin, et al., "Non-CE11: Support Modification for Parallel Calculation of Significant Map Contexts", Joint Collaborative Team on Video Coding (JCT-VC) of ITU-T SG16 WP3 and ISO/IEC JTC1/SC29/WG11, 8th Meeting: San Jose, CA, USA, Feb. 1-10, 2012, JCTVC-H0427_r3, 6 pp.
Sole, et al., "CE11: Unified scans for the significance map and coefficient level coding in high efficiency", JCTVC-F288, Joint Collaborative Team on Video Coding (JCT-VC) of ITU-T SG16 WP3 and ISO/IEC JTC1/SC29/WG11, 6th Meeting: Torino (Italy), Dec. 11, 2012, 9 pp.
Hannuksela, M.M., "Test Model for AVC based 3D video coding," ISO/IEC JTC1/SC29/WG11 MPEG2012/N12558, Mar. 2012, 18 pages.
Bross, et al., "WD4: Working Draft 4 of High-Efficiency Video Coding," 6th Meeting; JCT-VC Meeting; (Joint Collaborative Team on Video Coding (JCT-VC) of ITU-T SG16 WP3 and ISO/IEC JTC1/SC29/WG11); Jul. 14-22, 2011; document No. JCTVC-F803_d6, Nov. 20, 2011, 229 pp.
Sole, et al., "CE11: Scanning Passes of Residual Data in HE," 7th Meeting; JCT-VC Meeting; (Joint Collaborative Team on Video Coding (JCT-VC) of ITU-T SG16 WP3 and ISO/IEC JTC1/SC29/WG11); Nov. 21-30, 2011;document No. JCTVC-G320, Nov. 21, 2011; 7 pp.
Sole, et al., "Non-CE11: Diagonal sub-block scan for HE residual coding," JCT-VC Meeting; (Joint Collaborative Team on Video Coding (JCT-VC) of ITU-T SG16 WP3 and ISO/IEC JTC1/SC29/WG11); Nov. 21-30, 2011, document No. JCTVC-G323, Nov. 29, 2011, 9 pp.
Bross, et al., "WD5: Working Draft 5 of High-Efficiency Video Coding," 7th Meeting; JCT-VC Meeting; (Joint collaborative Team on Video Coding (JCT-VC) of ITU-T SG16 WP3 and ISO/IEC JTC1/SC29/WG11); Nov. 21-30, 2011, document No. JCTVC-G1003_d0, Feb. 1, 2012; 238 pp.
Bross, et al., "WD5: Working Draft 5 of High-Efficiency Video Coding," 7th Meeting; JCT-VC Meeting; (Joint collaborative Team on Video Coding (JCT-VC) of ITU-T SG16 WP3 and ISO/IEC JTC1/SC29/WG11); Nov. 21-30, 2011, document No. JCTVC-G1103_d9, 237 pp.
Bross, et al., "High Efficiency Video Coding (HEVC) text specification draft 9," 11th Meeting; JCT-VC Meeting; (Joint Collaborative Team on Video Coding (JCT-VC) of ITU-T SG16 WP3 and ISO/IEC JTC1/SC29/WG11); Oct. 10-19, 2012, document No. JCTVC-K1003_v8, Nov. 7, 2012, 292 pp.
Ross, et al., "WD5: Working Draft 5 of High-Efficiency Video Coding," 7th Meeting; JCT-VC Meeting; (Joint Collaborative Team on Video Coding (JCT-VC) of ITU-T SG16 WP3 and ISO/IEC JTC1/SC29/WG11); Nov. 21-30, 2011, document No. JCTVC-G1103_d0, 238 pp.

\* cited by examiner

CODING OF SYNTAX ELEMENTS THAT CORRESPOND TO COEFFICIENTS OF A COEFFICIENT BLOCK IN VIDEO CODING

This application claims the benefit of:
U.S. Provisional Patent Application No. 61/589,384, filed Jan. 22, 2012;
U.S. Provisional Patent Application No. 61/592,300, filed Jan. 30, 2012;
U.S. Provisional Patent Application No. 61/606,300, filed Mar. 2, 2012;
U.S. Provisional Patent Application No. 61,606,304, filed Mar. 2, 2012;
U.S. Provisional Patent Application No. 61/606,338, filed Mar. 2, 2012;
U.S. Provisional Patent Application No. 61/625,062, filed Apr. 16, 2012; and
U.S. Provisional Patent Application No. 61/625,072, filed Apr. 16, 2012,
the entire content of each of which is incorporated herein by reference.

TECHNICAL FIELD

This disclosure relates to video coding and compression and, in particular, to the coding of coefficients in video coding.

BACKGROUND

Digital video capabilities can be incorporated into a wide range of devices, including digital televisions, digital direct broadcast systems, wireless broadcast systems, personal digital assistants (PDAs), laptop or desktop computers, tablet computers, e-book readers, digital cameras, digital recording devices, digital media players, video gaming devices, video game consoles, cellular or satellite radio telephones, so-called "smart phones," video teleconferencing devices, video streaming devices, and the like. Digital video devices implement video compression techniques, such as those described in the standards defined by MPEG-2, MPEG-4, ITU-T H.263, ITU-T H.264/MPEG-4, Part 10, Advanced Video Coding (AVC), the High Efficiency Video Coding (HEVC) standard presently under development, and extensions of such standards. The video devices may transmit, receive, encode, decode, and/or store digital video information more efficiently by implementing such video compression techniques.

Video compression techniques perform spatial (intra-picture) prediction and/or temporal (inter-picture) prediction to reduce or remove redundancy inherent in video sequences. For block-based video coding, a video slice (i.e., a video frame or a portion of a video frame) may be partitioned into video blocks, which may also be referred to as tree blocks, coding units (CUs) and/or coding nodes. Video blocks in an intra-coded (I) slice of a picture are encoded using spatial prediction with respect to reference samples in neighboring blocks in the same picture. Video blocks in an inter-coded (P or B) slice of a picture may use spatial prediction with respect to reference samples in neighboring blocks in the same picture or temporal prediction with respect to reference samples in other reference pictures. Pictures may be referred to as frames, and reference pictures may be referred to a reference frames.

Spatial or temporal prediction results in a predictive block for a block to be coded. Residual data represents pixel differences between the original block to be coded and the predictive block. An inter-coded block is encoded according to a motion vector that points to a block of reference samples forming the predictive block, and the residual data indicates the difference between the coded block and the predictive block. An intra-coded block is encoded according to an intra-coding mode and the residual data. For further compression, the residual data may be transformed from the pixel domain to a transform domain, resulting in residual coefficients, which then may be quantized. The quantized coefficients, initially arranged in a two-dimensional array, may be scanned in order to produce a one-dimensional vector of coefficients, and entropy coding may be applied to achieve even more compression.

SUMMARY

In general, this disclosure describes techniques for coding coefficients of a coefficient block in video coding. The coefficients may comprise transformed coefficients corresponding to a set of residual pixel values associated with a video block that are predictively coded and transformed into a frequency domain. Alternatively, if a transform is not applied to a residual sample block, the coefficients may be residual samples in a sample domain. In particular, a video encoder generates a coefficient block and performs multiple coding passes on coefficients in the coefficient block. During each coding pass, the video encoder encodes a different set of syntax elements for coefficients in the coefficient block. A video decoder may use the syntax elements for a coefficient to determine the value of the coefficient. When the video encoder performs a coding pass other than an initial coding pass, the video encoder may select a coding context for a syntax element based at least in part on a value of a syntax element generated in an earlier coding pass for a non-causal coefficient and based at least in part on a value of a syntax element generated during the current coding pass for a causal coefficient. The non-causal coefficient occurs after the coefficient and the causal coefficient occurs before the coefficient according to a coding order of the current coding pass. The video encoder may entropy encode the syntax element based on the selected coding context. A video decoder may perform a similar series of coding passes in which the video decoder selects coding contexts and entropy decodes the syntax elements of coefficients.

In one aspect, this disclosure describes a method for encoding video data. The method comprises generating, based on a residual sample block, a coefficient block. In addition, the method comprises encoding, during a first coding pass of coefficients of the coefficient block, a first set of syntax elements that correspond to coefficients of the coefficient block. Furthermore, the method comprises encoding, during a second coding pass of the coefficients of the coefficient block, a second set of syntax elements that correspond to coefficients of the coefficient block. Encoding the second set of syntax elements comprises generating a first syntax element, the first syntax element being in the second set of syntax elements and corresponding to a current coefficient of the coefficient block. Encoding the second set of syntax elements also comprises selecting, based at least in part on a second syntax element and a third syntax element, a coding context for the first syntax element. The second syntax element is in the first set of syntax elements and corresponds to a non-causal coefficient. The third syntax element is in the second set of syntax elements and corresponds to a causal coefficient, the non-causal coefficient occurring after the current coefficient in a coding order of the second coding pass, the causal coefficient occurring before the current coefficient in the coding order of the second coding pass. In addition, encoding the second set of syntax elements comprises entropy encoding, based at least in part on the coding context selected for the first syntax element, the first syntax element.

In another aspect, this disclosure describes a video encoding device that comprises one or more processors configured to generate, based on a residual sample block, a coefficient block. The one or more processors are also configured to encode, during a first coding pass of coefficients of the coefficient block, a first set of syntax elements that correspond to coefficients of the coefficient block. In addition, the one or more processors are configured to encode, during a second coding pass of the coefficients of the coefficient block, a second set of syntax elements that correspond to coefficients of the coefficient block. The one or more processors are configured such that during the second coding pass the one or more processors generate a first syntax element, the first syntax element being in the second set of syntax elements and corresponding to a current coefficient of the coefficient block. During the second coding pass, the one or more processors also select, based at least in part on a second syntax element and a third syntax element, a coding context for the first syntax element. The second syntax element is in the first set of syntax elements and corresponds to a non-causal coefficient. The third syntax element is in the second set of syntax elements and corresponds to a causal coefficient, the non-causal coefficient occurring after the current coefficient in a coding order of the second coding pass, the causal coefficient occurring before the current coefficient in the coding order of the second coding pass. In addition, during the second coding pass, the one or more processors entropy encode, based at least in part on the coding context selected for the first syntax element, the first syntax element.

In another aspect, this disclosure describes a video encoding device comprising means for generating, based on a residual sample block, a coefficient block. The video encoding device also comprises means for encoding, during a first coding pass of coefficients of the coefficient block, a first set of syntax elements that correspond to coefficients of the coefficient block. In addition, the video encoding device comprises means for encoding, during a second coding pass of the coefficients of the coefficient block, a second set of syntax elements that correspond to coefficients of the coefficient block. The means for encoding the second set of syntax element comprises means for generating a first syntax element, the first syntax element being in the second set of syntax elements and corresponding to a current coefficient of the coefficient block. The means for encoding the second set of syntax elements also comprises means for selecting, based at least in part on a second syntax element and a third syntax element, a coding context for the first syntax element. The second syntax element is in the first set of syntax elements and corresponds to a non-causal coefficient. The third syntax element is in the second set of syntax elements and corresponds to a causal coefficient, the non-causal coefficient occurring after the current coefficient in a coding order of the second coding pass, the causal coefficient occurring before the current coefficient in the coding order of the second coding pass. The means for encoding the second set of syntax elements also comprises means for entropy encoding, based at least in part on the coding context selected for the first syntax element, the first syntax element.

In another aspect, this disclosure describes a computer-readable storage medium that stores instructions that, when executed by one or more processors of a video encoding device, configure the video encoding device to generate, based on a residual sample block, a coefficient block. The instructions also configure the video encoding device to encode, during a first coding pass of coefficients of the coefficient block, a first set of syntax elements that correspond to coefficients of the coefficient block. The instructions also configure the video encoding device to encode, during a second coding pass of the coefficients of the coefficient block, a second set of syntax elements that correspond to coefficients of the coefficient block. The instructions configure the video encoding device such that during the second coding pass the video encoding device generates a first syntax element, the first syntax element being in the second set of syntax elements and corresponding to a current coefficient of the coefficient block. The instructions also configure the video encoding device such that during the second coding pass, the video encoding device selects, based at least in part on a second syntax element and a third syntax element, a coding context for the first syntax element. The second syntax element is in the first set of syntax elements and corresponds to a non-causal coefficient. The third syntax element is in the second set of syntax elements and corresponds to a causal coefficient, the non-causal coefficient occurring after the current coefficient in a coding order of the second coding pass, the causal coefficient occurring before the current coefficient in the coding order of the second coding pass. In addition, the instructions configure the video encoding device such that during the second coding pass, the video encoding device entropy encodes, based at least in part on the coding context selected for the first syntax element, the first syntax element.

In another aspect, this disclosure describes a method for decoding video data. The method comprises decoding, during a first coding pass of coefficients of a coefficient block, a first set of syntax elements that correspond to coefficients of the coefficient block. The method also comprises decoding, during a second coding pass of the coefficients of the coefficient block, a second set of syntax elements that correspond to coefficients of the coefficient block. Performing the second coding pass comprises selecting, based at least in part on a second syntax element and a third syntax element, a coding context for a first syntax element, the first syntax element being in the second set of syntax elements and corresponding to a current coefficient of the coefficient block. The second syntax element is in the first set of syntax elements and corresponds to a non-causal coefficient. The third syntax element is in the second set of syntax elements and corresponds to a causal coefficient, the non-causal coefficient occurring after the current coefficient in a coding order of the second coding pass, the causal coefficient occurring before the current coefficient in the coding order of the second coding pass. Performing the second coding pass also comprises entropy decoding, based at least in part on the coding context selected for the first syntax element, the first syntax element. In addition, performing the second coding pass comprises generating, based on the coefficients of the coefficient block, a residual sample block.

In another aspect, this disclosure describes a video decoding device that comprises one or more processors configured to decode, during a first coding pass of coefficients of a coefficient block, a first set of syntax elements that correspond to coefficients of the coefficient block. The one or more processors are also configured to decode, during a second coding pass of the coefficients of the coefficient block, a second set of syntax elements that correspond to coefficients of the coefficient block. The one or more processors are configured such that during the second coding pass the one or more processors select, based at least in part on a second syntax element and a third syntax element, a coding context for a first syntax element, the first syntax element being in the second set of syntax elements and corresponding to a current coefficient of the coefficient block. The second syntax element is in the first set of syntax elements and corresponds to a non-causal coefficient. The third syntax element is in the second set of syntax elements and corresponds to a causal coefficient, the non-causal coefficient occurring after the current coefficient in a coding order of the second coding pass, the causal coefficient occurring before the current coefficient in the coding order of the second coding pass. The one or more processors are also configured such that during the second coding pass, the one or more processors entropy decode, based at least in part on the coding context selected for the first syntax element, the first syntax element. Furthermore, the one or more processors are configured to generate, based on the coefficients of the coefficient block, a residual sample block.

In another aspect, this disclosure describes a video decoding device comprising means for decoding, during a first coding pass of coefficients of a coefficient block, a first set of syntax elements that correspond to coefficients of the coefficient block. The video decoding device also comprises means for decoding, during a second coding pass of the coefficients of the coefficient block, a second set of syntax elements that correspond to coefficients of the coefficient block. The means for performing the second coding pass comprises means for selecting, based at least in part on a second syntax element and a third syntax element, a coding context for a first syntax element, the first syntax element being in the second set of syntax elements and corresponding to a current coefficient of the coefficient block. The second syntax element is in the first set of syntax elements and corresponds to a non-causal coefficient. The third syntax element is in the second set of syntax elements and corresponds to a causal coefficient, the non-causal coefficient occurring after the current coefficient in a coding order of the second coding pass, the causal coefficient occurring before the current coefficient in the coding order of the second coding pass. The means for performing the second coding pass also comprises means for entropy decoding, based at least in part on the coding context selected for the first syntax element, the first syntax element. Furthermore, the video decoding device comprises means for generating, based on the coefficients of the coefficient block, a residual sample block.

In another aspect, this disclosure describes a computer-readable storage medium that stores instructions that, when executed by one or more processors of a video decoding device, configure the video decoding device to decode, during a first coding pass of coefficients of a coefficient block, a first set of syntax elements that correspond to coefficients of the coefficient block. The instructions also configure the video decoding device to decode, during a second coding pass of the coefficients of the coefficient block, a second set of syntax elements that correspond to coefficients of the coefficient block. The instructions configure the video encoding device such that during the second coding pass the video decoding device selects, based at least in part on a second syntax element and a third syntax element, a coding context for a first syntax element, the first syntax element being in the second set of syntax elements and corresponding to a current coefficient of the coefficient block. The second syntax element is in the first set of syntax elements and corresponds to a non-causal coefficient. The third syntax element is in the second set of syntax elements and corresponds to a causal coefficient, the non-causal coefficient occurring after the current coefficient in a coding order of the second coding pass, the causal coefficient occurring before the current coefficient in the coding order of the second coding pass. The instructions also configure the video decoding device such that during the second coding pass, the video decoding device entropy decodes, based at least in part on the coding context selected for the first syntax element, the first syntax element. Furthermore, the instructions configure the video decoding device to generate, based on the coefficients of the coefficient block, a residual sample block.

The details of one or more examples of the disclosure are set forth in the accompanying drawings and the description below. Other features, objects, and advantages will be apparent from the description, drawings, and claims.

DETAILED DESCRIPTION

Figure 1:
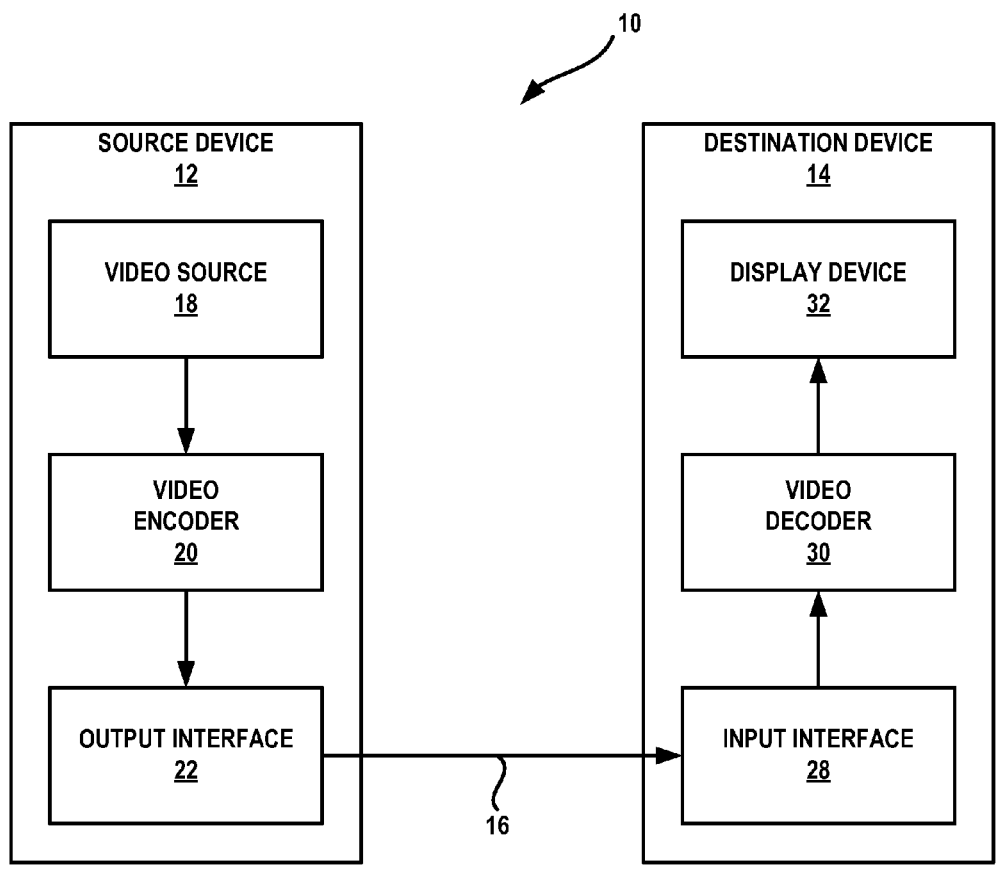
FIG. 1 is a block diagram illustrating an example video coding system that may utilize the techniques described in this disclosure.

During video encoding, a video encoder may generate a residual sample block by subtracting, from samples of an original sample block, corresponding samples of a predictive sample block. In some cases, the video encoder may then apply one or more transforms to the residual sample block in order to generate a coefficient block. In other cases, the video encoder does not apply a transform to the residual sample block. If the video encoder does not apply a transform to a residual sample block, the video coder may handle the residual sample block in the same or similar manner as a coefficient block. Hence, for ease of explanation, this disclosure may refer to the residual sample block as a coefficient block and samples in the residual sample block as coefficients. It should be understood however, that discussion of a coefficient block and coefficients may apply to a residual sample block and residual samples if the video encoder does not apply a transformation to the residual sample block.

The video encoder may process each coefficient in the coefficient block according to a particular coding order. When the video encoder processes a coefficient in the coefficient block, the video encoder may generate and entropy encode a set of syntax elements for the coefficient. A video decoder may be able to determine a value of the coefficient based on the set of syntax elements for the coefficient. To entropy encode a syntax element for a coefficient, the video encoder may select a coding context for the syntax element and then use the selected coding context for the syntax element to entropy encode the syntax element. The video encoder may select the coding context for the syntax element based on the values of syntax elements of previously-processed coefficients that are in a context neighborhood of the coefficient.

The approach described above for processing coefficients may have several disadvantages. For example, the approach described above can make it difficult to parallelize the processing of multiple coefficients of the coefficient block. In another example, the approach described above may require the video encoder (and the video decoder) to store the absolute values of coefficients for use in selecting coding contexts. Storing such absolute values may increase the amount of storage required in a video coding device.

The techniques of this disclosure may address these issues and others. In accordance with the techniques of this disclosure, a video encoder may perform multiple coding passes to generate and encode syntax elements of coefficients of a coefficient block. The video encoder may perform each of the coding passes according to the same coding order or according to two or more different coding orders. When the video encoder performs a coding pass other than an initial coding pass, the video encoder may select a coding context for a current syntax element based at least in part on a value of a syntax element generated in an earlier coding pass for a non-causal coefficient and based at least in part on a value of a syntax element generated during the current coding pass for a causal coefficient. The non-causal coefficient occurs after the current coefficient (i.e., the coefficient being coded) and the causal coefficient occurs before the current coefficient according to a coding order of the current coding pass. The video encoder may entropy encode the current syntax element based on the selected coding context. By selecting the coding context for coding a current syntax element of a current coefficient based at least in part on syntax elements of one or more non-causal coefficients, the video encoder may improve the accuracy with which the video encoder selects the coding context. At the same time, by selecting the coding context based at least in part on syntax elements of one or more non-causal coefficients, the video encoder may be able select a coding context without relying so heavily on causal syntax elements, which the video encoder may be processing in parallel with the current coefficient.

For example, the video encoder may encode, during a first coding pass of coefficients of a coefficient block, a first set of syntax elements that correspond to coefficients of the coefficient block. Furthermore, the video encoder may encode, during a second coding pass of the coefficients of the coefficient block, a second set of syntax elements that correspond to the coefficients of the coefficient block. When the video encoder performs the second coding pass, the video coder may generate a first syntax element. The first syntax element is in the second set of syntax elements and corresponds to a current coefficient of the coefficient block. The video encoder may select, based at least in part on a second syntax element and a third syntax element, a coding context for the first syntax element. The second syntax element is in the first set of syntax elements and corresponds to a non-causal coefficient. The third syntax element is in the second set of syntax elements and corresponds to a causal coefficient. The non-causal coefficient occurs after the current coefficient in a coding order of the second coding pass. The causal coefficient occurs before the current coefficient in the coding order. The video encoder may entropy encode, based at least in part on the coding context selected for the first syntax element, the first syntax element.

The attached drawings illustrate examples. Elements indicated by reference numbers in the attached drawings correspond to elements indicated by like reference numbers in the following description. In this disclosure, elements having names that start with ordinal words (e.g., "first," "second," "third," and so on) do not necessarily imply that the elements have a particular order. Rather, such ordinal words may merely be used to refer to different elements of a same or similar type.

FIG. 1 is a block diagram illustrating an example video coding system 10 that may utilize the techniques of this disclosure. As described herein, the term "video coder" refers generically to both video encoders and video decoders. In this disclosure, the terms "video coding" or "coding" may refer generically to video encoding or video decoding.

As shown in FIG. 1, video coding system 10 includes a source device 12 and a destination device 14. Source device 12 generates encoded video data. Accordingly, source device 12 may be referred to as a video encoding device or a video encoding apparatus. Destination device 14 may decode the encoded video data generated by source device 12. Accordingly, destination device 14 may be referred to as a video decoding device or a video decoding apparatus. Source device 12 and destination device 14 may be examples of video coding devices or video coding apparatuses. Source device 12 and destination device 14 may comprise a wide range of devices, including desktop computers, mobile computing devices, notebook (e.g., laptop) computers, tablet computers, set-top boxes, telephone handsets such as so-called "smart" phones, televisions, cameras, display devices, digital media players, video gaming consoles, in-car computers, or the like.

Destination device 14 may receive encoded video data from source device 12 via a channel 16. Channel 16 may comprise one or more media and/or devices capable of moving the encoded video data from source device 12 to destination device 14. In one example, channel 16 may comprise one or more communication media that enable source device 12 to transmit encoded video data directly to destination device 14 in real-time. In this example, source device 12 may modulate the encoded video data according to a communication standard, such as a wireless communication protocol, and may transmit the modulated video data to destination device 14. The one or more communication media may include wireless and/or wired communication media, such as a radio frequency (RF) spectrum or one or more physical transmission lines. The one or more communication media may form part of a packet-based network, such as a local area network, a wide-area network, or a global network (e.g., the Internet). The one or more communication media may include routers, switches, base stations, or other equipment that facilitate communication from source device 12 to destination device 14.

In another example, channel 16 may include to a storage medium that stores encoded video data generated by source device 12. In this example, destination device 14 may access the storage medium via disk access or card access. The storage medium may include a variety of locally-accessed data storage media such as Blu-ray discs, DVDs, CD-ROMs, flash memory, or other suitable digital storage media for storing encoded video data.

In a further example, channel 16 may include a file server or another intermediate storage device that stores encoded video data generated by source device 12. In this example, destination device 14 may access encoded video data stored at the file server or other intermediate storage device via streaming or download. The file server may be a type of server capable of storing encoded video data and transmitting the encoded video data to destination device 14. Example file servers include web servers (e.g., for a website), file transfer protocol (FTP) servers, network attached storage (NAS) devices, and local disk drives.

Destination device 14 may access the encoded video data through a standard data connection, such as an Internet connection. Example types of data connections include wireless channels (e.g., Wi-Fi connections), wired connections (e.g., DSL, cable modem, etc.), or combinations of both that are suitable for accessing encoded video data stored on a file server. The transmission of encoded video data from the file server may be a streaming transmission, a download transmission, or a combination of both.

The techniques of this disclosure are not limited to wireless applications or settings. The techniques may be applied to video coding in support of a variety of multimedia applications, such as over-the-air television broadcasts, cable television transmissions, satellite television transmissions, streaming video transmissions, e.g., via the Internet, encoding of video data for storage on a data storage medium, decoding of video data stored on a data storage medium, or other applications. In some examples, video coding system 10 may be configured to support one-way or two-way video transmission to support applications such as video streaming, video playback, video broadcasting, and/or video telephony.

In the example of FIG. 1, source device 12 includes a video source 18, a video encoder 20, and an output interface 22. In some examples, output interface 22 may include a modulator/demodulator (modem) and/or a transmitter. Video source 18 may include a video capture device, e.g., a video camera, a video archive containing previously-captured video data, a video feed interface to receive video data from a video content provider, and/or a computer graphics system for generating video data, or a combination of such sources of video data.

Video encoder 20 may encode video data from video source 18. In some examples, source device 12 directly transmits the encoded video data to destination device 14 via output interface 22. The encoded video data may also be stored onto a storage medium or a file server for later access by destination device 14 for decoding and/or playback.

In the example of FIG. 1, destination device 14 includes an input interface 28, a video decoder 30, and a display device 32. In some examples, input interface 28 includes a receiver and/or a modem. Input interface 28 may receive encoded video data over channel 16. Display device 32 may be integrated with or may be external to destination device 14. In general, display device 32 displays decoded video data. Display device 32 may comprise a variety of display devices, such as a liquid crystal display (LCD), a plasma display, an organic light emitting diode (OLED) display, or another type of display device.

Video encoder 20 and video decoder 30 may operate according to a video compression standard, such as the High Efficiency Video Coding (HEVC) standard presently under development, and may conform to a HEVC Test Model (HM). A draft of the upcoming HEVC standard, referred to as "HEVC Working Draft 5" or "WD5," is described in document JCTVC-G1103, Bross et al., "WD5: Working Draft 5 of High Efficiency Video Coding," Joint Collaborative Team on Video Coding (JCT-VC) of ITU-T SG16 WP3 and ISO/IEC JTC1/SC29/WG11, 7th Meeting: Geneva, Switzerland, November, 2011, which, as of Nov. 26, 2012, is downloadable from http://phenix.it-sudparis.eu/jct/doc_end_user/documents/7_Geneva/wg11/JCTVC-G1103-v12.zip, the entire content of which is hereby incorporated by reference. Another draft of the upcoming HEVC standard, referred to as "HEVC Working Draft 9," is described in Bross et al., "High Efficiency Video Coding (HEVC) text specification draft 9," Joint Collaborative Team on Video Coding (JCT-VC) of ITU-T SG16 WP3 and ISO/IEC JTC1/SC29/WG11, 11th Meeting: Shanghai, China, October, 2012, which, as of Nov. 26, 2012, is downloadable from http://phenix.int-evry.fr/jct/doc_end_user/documents/11_Shanghai/wg11/JCTVC-K1003-v8.zip, the entire content of which is incorporated herein by reference.

Alternatively, video encoder 20 and video decoder 30 may operate according to other proprietary or industry standards, including ITU-T H.261, ISO/IEC MPEG-1 Visual, ITU-T H.262 or ISO/IEC MPEG-2 Visual, ITU-T H.263, ISO/IEC MPEG-4 Visual and ITU-T H.264 (also known as ISO/IEC MPEG-4 AVC), including its Scalable Video Coding (SVC) and Multiview Video Coding (MVC) extensions. The techniques of this disclosure, however, are not limited to any particular coding standard or technique.

Again, FIG. 1 is merely an example and the techniques of this disclosure may apply to video coding settings (e.g., video encoding or video decoding) that do not necessarily include any data communication between encoding and decoding devices. In other examples, data is retrieved from a local memory, streamed over a network, or the like. An encoding device may encode and store data to memory, and/or a decoding device may retrieve and decode data from memory. In many examples, the encoding and decoding is performed by devices that do not communicate with one another, but simply encode data to memory and/or retrieve and decode data from memory.

Video encoder 20 and video decoder 30 each may be implemented as any of a variety of suitable circuitry, such as one or more microprocessors, digital signal processors (DSPs), application-specific integrated circuits (ASICs), field-programmable gate arrays (FPGAs), discrete logic, hardware, or any combinations thereof. If the techniques are implemented partially in software, a device may store instructions for the software in a suitable, non-transitory computer-readable storage medium and may execute the instructions in hardware using one or more processors to perform the techniques of this disclosure. Any of the foregoing (including hardware, software, a combination of hardware and software, etc.) may be considered to be one or more processors. Each of video encoder 20 and video decoder 30 may be included in one or more encoders or decoders, either of which may be integrated as part of a combined encoder/decoder (CODEC) in a respective device.

This disclosure may generally refer to video encoder 20 "signaling" certain information to another device, such as video decoder 30. The term "signaling" may generally refer to the communication of syntax elements and/or other data that represent encoded video data. Such communication may occur in real- or near-real-time. Alternately, such communication may occur over a span of time, such as might occur when storing syntax elements to a computer-readable storage medium in an encoded bitstream at the time of encoding, which then may be retrieved by a decoding device at any time after being stored to this medium.

As mentioned briefly above, video encoder 20 encodes video data. The video data may comprise one or more pictures. Each of the pictures may be a still image. Video encoder 20 may generate a bitstream that includes a sequence of bits that form a coded representation of the video data. The coded representation of the video data may include coded pictures and associated data. A coded picture is a coded representation of a picture. The associated data may include sequence parameter sets (SPSs), picture parameter sets (PPSs), and other syntax structures. A SPS may contain parameters applicable to zero or more sequences of pictures. A PPS may contain parameters applicable to zero or more pictures. A syntax structure may be a set of zero or more syntax elements present together in a bitstream in a specified order.

A picture includes a block of luminance (i.e., luma or Y) samples and two blocks of chrominance (i.e., chroma) samples. For ease of explanation, this disclosure may refer to a two-dimensional array of samples as a sample block. To generate an encoded representation of a picture, video encoder 20 may generate a plurality of coding tree blocks (CTBs) for the picture. In some instances, a treeblock may also be referred to as a largest coding unit (LCU) or a treeblock. Each CTB of the picture may be associated with a luma block and two chroma blocks. The CTB's luma block is a sub-block of the picture's luma block and the CTB's chroma blocks are sub-blocks of the picture's chroma blocks. The CTB's chroma blocks correspond to the same area within the picture as the CTB's luma block. The CTBs of HEVC may be broadly analogous to the macroblocks of previous video coding standards, such as H.264/AVC. However, a CTB is not necessarily limited to a particular size and may include one or more coding units (CUs). Video encoder 20 may use quad-tree partitioning to partition the sample blocks associated with a CTB into sample blocks associated with CUs, hence the name "coding tree blocks."

The CTBs of a picture may be grouped into one or more slices. In some examples, each of the slices includes an integer number of CTBs. As part of encoding a picture, video encoder 20 may generate encoded representations of each slice of the picture (i.e., coded slices). To generate a coded slice, video encoder 20 may encode each CTB of the slice to generate encoded representations of each of the CTBs of the slice (i.e., coded CTBs).

To generate a coded CTB, video encoder 20 may recursively perform quad-tree partitioning on the sample blocks associated with a CTB to divide the sample blocks into progressively-smaller sample blocks. A CU of a CTB may be associated with a luma sample block and two chroma sample blocks. The CU's luma sample block may be a sub-block of the CTB's luma sample block and the CU's chroma sample blocks may be sub-blocks of the CTB's chroma sample blocks. The CU's luma sample block and chroma sample blocks may correspond to a same area within a picture. A partitioned CU may be a CU whose sample blocks are partitioned into sample blocks associated with other CUs. A non-partitioned CU may be a CU whose sample blocks are not partitioned into sample blocks associated with other CUs.

Video encoder 20 may generate one or more prediction units (PUs) for each non-partitioned CU. Each of the PUs of a CU may correspond to an area of a picture within the area of the picture that corresponds to the CU. Video encoder 20 may generate predictive sample blocks for each PU of the CU. The predictive sample blocks of a PU may be blocks of samples.

Video encoder 20 may use intra prediction or inter prediction to generate the predictive sample blocks for a PU. If video encoder 20 uses intra prediction to generate the predictive sample blocks of a PU, video encoder 20 may generate the predictive sample blocks of the PU based on decoded samples of the picture associated with the PU. If video encoder 20 uses inter prediction to generate the predictive sample blocks of the PU, video encoder 20 may generate the predictive sample blocks of the PU based on decoded pixels of one or more pictures other than the picture associated with the PU.

Video encoder 20 may generate residual blocks for a CU based on predictive sample blocks of the PUs of the CU. The residual sample block for the CU may indicate differences between samples in the predictive sample blocks for the PUs of the CU and corresponding samples in the original sample blocks of the CU.

Furthermore, as part of encoding a non-partitioned CU, video encoder 20 may perform recursive quad-tree partitioning on the residual sample blocks of the CU to partition the residual sample blocks of the CU into one or more smaller residual sample blocks associated with transform units (TUs) of the CU. Each of the TUs may be associated with a residual sample block of luma samples and two residual sample blocks of chroma samples.

Video encoder 20 may apply one or more transforms to the residual sample blocks associated with the TUs to generate coefficient blocks (i.e., blocks of coefficients). Video encoder 20 may perform a quantization process on each of the coefficient blocks. Quantization generally refers to a process in which coefficients are quantized to possibly reduce the amount of data used to represent the coefficients, providing further compression. After quantization, video encoder 20 may entropy encode syntax elements that represent the values of the coefficients. For example, video encoder 20 may perform Context-Adaptive Binary Arithmetic Coding (CABAC) encoding on at least some of the syntax elements that represent the values of the coefficients. Entropy encoding the syntax elements may provide further compression. Video encoder 20 may output a bitstream that includes the entropy-encoded syntax elements.

Video decoder 30 may receive a bitstream. The bitstream may include a coded representation of video data encoded by video encoder 20. Video decoder 30 may parse the bitstream to extract syntax elements from the bitstream. As part of extracting at least some syntax elements from the bitstream, video decoder 30 may entropy decode (e.g., CABAC decode, exponential-Golomb decode, etc.) data in the bitstream.

Video decoder 30 may reconstruct the pictures of the video data based on the syntax elements extracted from the bitstream. The process to reconstruct the video data based on the syntax elements may be generally reciprocal to the process performed by video encoder 20 to generate the syntax elements. For instance, video decoder 30 may generate, based on syntax elements associated with a CU, predictive sample blocks for PUs of the CU. In addition, video decoder 30 may inverse quantize coefficient blocks associated with TUs of the CU. Video decoder 30 may perform inverse transforms on the coefficient blocks to reconstruct residual sample blocks associated with the TUs of the CU. Video decoder 30 may reconstruct the sample block of a CU based on the predictive sample blocks and the residual sample blocks.

As mentioned briefly above, video encoder 20 may generate a coefficient block by applying one or more transforms to a residual sample block. (In some examples, video encoder 20 may skip application of the one or more transforms to the residual sample block.) Furthermore, in some examples, video encoder 20 may divide the coefficient block into sub-blocks. For instance, video encoder 20 may divide the coefficient block into four square sub-blocks. The sub-blocks may also be referred to herein as "chunks." In some examples, the size of a sub-block is sixteen. Hence, each of the sub-blocks contains sixteen coefficients in inverse scan order. Thus, each 4×4 sub-block corresponds to a subset or chunk. Furthermore, in some examples, all TUs, except for certain 8×8 TUs that use horizontal or vertical scans, use a 4×4 sub-block scan.

Video encoder 20 may perform five coding passes on each of the sub-blocks. Video encoder 20 may perform all five coding passes on a sub-block before performing the five coding passes on a next one of the sub-blocks. Video encoder 20 may process the sub-blocks in various orders. For example, video encoder 20 may process the sub-blocks in a reverse z-scan that processes the lower-right sub-block first followed by the lower-left sub-block, the upper-right sub-block and finally the upper-left sub-block. Other scans such as diagonal down-left scan are also possible.

When video encoder 20 performs the coding passes on a sub-block, video encoder 20 processes each of the coefficients in the sub-block according to a coding order associated with a specific coding pass. Different coding passes may use the same coding order or one or more different coding orders. In some examples, the coding order may be a diagonal down-left order that starts at a lower-right coefficient, and then processes diagonal lines of coefficients progressively further from the lower-right coefficient. In this example, video encoder 20 may process coefficients from top-right to bottom-left along each diagonal line of coefficients. In other examples, the coding order may be a vertical or a horizontal order. Video encoder 20 may use reverse scanning orders (i.e., coding orders that start at a lower-right coefficient) for significant and level coding (i.e., for sigMapFlags, gr1Flags, gr2Flags, signFlags, and levelRems). However, the techniques of this disclosure may be valid even when a forward scanning order is used. The techniques of this disclosure may also be valid regardless of whether a diagonal, a zigzag, a horizontal, a vertical, a 4×4 sub-block scan or any other scan is used.

When video encoder 20 performs the first coding pass on a sub-block, video encoder 20 may generate a significant_coeff_flag (abbreviated sigMapFlag) for each coefficient in the sub-block. In some examples, video encoder 20 may generate sigMapFlag for only those coefficients occurring after the first non-zero coefficient in the coding order of the first coding pass. The sigMapFlag for a coefficient indicates whether the absolute value of the coefficient is greater than zero. In this disclosure, a coefficient is said to be "significant" if the absolute value of the coefficient is greater than zero. Video encoder 20 and video decoder 30 may use regular CABAC coding to entropy code the sigMapFlags. Regular CABAC coding may use plurality of contexts.

When video encoder 20 performs the second coding pass on a sub-block, video encoder 20 generates a coeff_abs_level_greater1_flag (abbreviated gr1Flag) for each coefficient in the sub-block that has an absolute value greater than zero. The gr1Flag for a coefficient indicates whether the absolute value of the coefficient is greater than 1. In some examples, at most eight gr1Flags per sub-block may be used to indicate that the corresponding coefficients are greater than 1. Video encoder 20 and video decoder 30 may use regular CABAC coding to entropy code gr1Flags.

When video encoder 20 performs the third coding pass on a sub-block, video encoder 20 may generate a coeff_abs_level_greater2_flag (abbreviated gr2Flag) for each coefficient in the sub-block that has an absolute value greater than 1. The gr2Flag for a coefficient indicates whether the absolute value of the coefficient is greater than 2. In some examples, at most one gr2Flag per sub-block may be used to indicate that the corresponding coefficient is greater than 2. Thus, at most eight gr1Flags and one gr2Flag may be sent for each sub-block. Thus, the interpretation of levelRem may change depending on whether a gr1Flag and/or a gr2Flag have been coded. Video encoder 20 and video decoder 30 may use regular CABAC coding to entropy code gr2Flags.

When video encoder 20 performs the fourth coding pass on a sub-block, video encoder 20 may generate a coeff_sign_flag (abbreviated signFlag) for each coefficient in the sub-block that has an absolute value greater than 0. The signFlag for a coefficient indicates a positive/negative sign of the coefficient. Video encoder 20 and video decoder 30 may use bypass entropy coding to entropy code signFlags.

When video encoder 20 performs the fifth coding pass on a sub-block, video encoder 20 may generate a coeff_abs_level_remain value (abbreviated levelRem) for each coefficient in the sub-block that has an absolute value greater than 0. In some examples, video encoder 20 may signal a levelRem for each coefficient with amplitude larger than 2 (i.e., with gr2Flag=1). The levelRem for a coefficient indicates a remaining absolute value of the coefficient. Video encoder 20 may generate a levelRem for each coefficient in the sub-block for which the gr2Flag is 1 or when gr2Flag is not coded and gr1Flag is 1 or when gr1Flag and gr2Flag are not coded and the sigMapFlag is 1. If the gr2Flag for the coefficient indicates that the coefficient is greater than 2, the levelRem for the coefficient indicates the absolute value of the coefficient minus 3. If no gr2Flag is coded for a coefficient but the gr1Flag for the coefficient indicates that the coefficient is greater than 1, the levelRem for the coefficient indicates the absolute value of the coefficient minus 2. Similarly, if no gr1Flag or gr2Flag is generated for a coefficient, but the sigMapFlag is 1, the levelRem for the coefficient indicates the absolute value of the coefficient minus 1. Video encoder 20 and video decoder 30 may use bypass entropy coding to entropy code levelRems. For ease of explanation, this disclosure may refer to sigMapFlags, gr1Flags, gr2Flags, signFlags, and levelRems as "coefficient syntax elements" or "level information." In some examples, another flag may be used to indicate whether an entire sub-block is not significant.

In this disclosure, a syntax element generated during an earlier coding pass is said to have higher priority than a syntax element generated during a later coding pass. In other words, the coefficient syntax elements coded first may be referred to as having higher priority. For example, sigMapFlags have higher priority than gr1Flags, gr2Flags, signFlags, and levelRems. gr1Flags have higher priority than gr2Flags, signFlags, and levelRems, but lower priority than sigMapFlags. Similar examples can be provided for gr2Flags, signFlags, and levelRems.

As video encoder 20 performs the first, second, and third coding passes, video encoder 20 may perform regular CABAC encoding on the sigMapFlags, gr1Flags, and gr2Flags, respectively. That is, out of the five coefficient syntax elements, only three are context-coded using CABAC, namely, sigMapFlag, gr1Flag and gr2Flag. For instance, after video encoder 20 generates a gr2Flag in the third coding pass, video encoder 20 may perform regular CABAC encoding on the gr2Flag before generating a gr2Flag for the next coefficient. As video encoder 20 performs the fourth and fifth coding passes, video encoder 20 may perform bypass encoding on the signFlags and levelRems.

When video encoder 20 performs CABAC encoding on a syntax element, such as a sigMapFlag, a gr1Flag, a gr2Flag, or levelRem, video encoder 20 may binarize the syntax element to form a binary string comprising a series of one or more bits, which are referred to as "bins." Video encoder 20 may use regular CABAC encoding to encode some of the bins and may use bypass encoding to encode other ones of the bins.

When video encoder 20 uses regular CABAC encoding to encode a sequence of bins, video encoder 20 may first identify a coding context. The coding context may identify probabilities of coding bins having particular values. For instance, a coding context may indicate a 0.7 probability of coding a 0-valued bin and a 0.3 probability of coding a 1-valued bin. After identifying the coding context, video encoder 20 may divide an interval into a lower sub-interval and an upper sub-interval. One of the sub-intervals may be associated with the value 0 and the other sub-interval may be associated with the value 1. The widths of the sub-intervals may be proportional to the probabilities indicated for the associated values by the identified coding context. If a bin of the syntax element has the value associated with the lower sub-interval, the encoded value may be equal to the lower boundary of the lower sub-interval. If the same bin of the syntax element has the value associated with the upper sub-interval, the encoded value may be equal to the lower boundary of the upper sub-interval. To encode the next bin of the syntax element, video encoder 20 may repeat these steps with the interval being the sub-interval associated with the value of the encoded bit. When video encoder 20 repeats these steps for the next bin, video encoder 20 may use modified probabilities based on the probabilities indicated by the identified coding context and the actual values of bins encoded.

When video decoder 30 performs CABAC decoding, video decoder 30 may perform regular CABAC decoding on some bins and may perform bypass decoding on other bins. When video decoder 30 performs regular CABAC decoding on a syntax element, video decoder 30 may identify a coding context. Video decoder 30 may then divide an interval into a lower sub-interval and an upper sub-interval. One of the sub-intervals may be associated with the value 0 and the other sub-interval may be associated with the value 1. The widths of the sub-intervals may be proportional to the probabilities indicated for the associated values by the identified coding context. If the encoded value is within the lower sub-interval, video decoder 30 may decode a bin having the value associated with the lower sub-interval. If the encoded value is within the upper sub-interval, video decoder 30 may decode a bin having the value associated with the upper sub-interval. To decode a next bin of the syntax element, video decoder 30 may repeat these steps with the interval being the sub-interval that contains the encoded value. When video decoder 30 repeats these steps for the next bin, video decoder 30 may use modified probabilities based on the probabilities indicated by the identified coding context and the decoded bins. Video decoder 30 may then de-binarize the bins to recover the syntax element. De-binarzation may refer to selecting a syntax element value according to a mapping between the binary string and the syntax element value.

Instead of performing regular CABAC on all syntax elements, or on all bins, a video coder such as video encoder 20 or video decoder 30 may code some bins using bypass coding. Bypass coding generally refers to the process of arithmetically encoding a bin without using an adaptive coding context. For example, in bypass arithmetic coding, the video coder does not select contexts and may assume a probability of 0.5 for both symbols (0 and 1). Although bypass coding may not be as bandwidth-efficient as CABAC coding, bypass coding may be computationally less expensive than CABAC coding. Further, performing bypass coding may allow for a higher degree of parallelization and throughput.

Coding performance may be negatively affected by selecting a coding context that does not accurately reflect the probabilities of bins having values of 0 or 1. Because there are known statistical relationships between the values of neighboring coefficients, video encoder 20 may select a coding context based on previously-generated information regarding neighboring coefficients. While selecting a coding context based on information regarding neighboring coefficients may increase the accuracy with which video encoder 20 selects the coding context, video encoder 20 must generate such information regarding the neighboring coefficients before selecting the coding context. This may prevent video encoder 20 from generating information regarding neighboring coefficients in parallel with selecting a coding context for a syntax element.

The techniques of this disclosure may form the contexts for context-coded syntax elements (e.g., sigMapFlag, gr1Flag, and gr2Flag) for level information and significance information. In accordance with one or more techniques of this disclosure, video encoder 20 may, during each respective coding pass of the coefficients, select, in parallel, coding contexts for all of the respective coding pass's syntax elements for coefficients in a sub-block. In some examples, the techniques of this disclosure may enable the derivation of contexts for all the flags corresponding to a particular syntax element in a sub-block in parallel. For example, video encoder 20 may select (i.e., derive), in parallel, the coding contexts for all gr2Flags for coefficients in a sub-block.

To do so, video encoder 20 may, in some examples, select, based at least in part on all coefficient syntax elements for coefficients in previously-coded sub-blocks of a coefficient block, a coding context for a syntax element of a particular coefficient in a particular sub-block. In other words, the context may depend on all the significance and level information in previous sub-blocks. In addition, video encoder 20 may select the coding context for the syntax element based at least in part on higher-priority coefficient syntax elements for coefficients of the particular sub-block. That is, the context may depend on higher priority syntax elements from the current sub-block.

Figure 2:
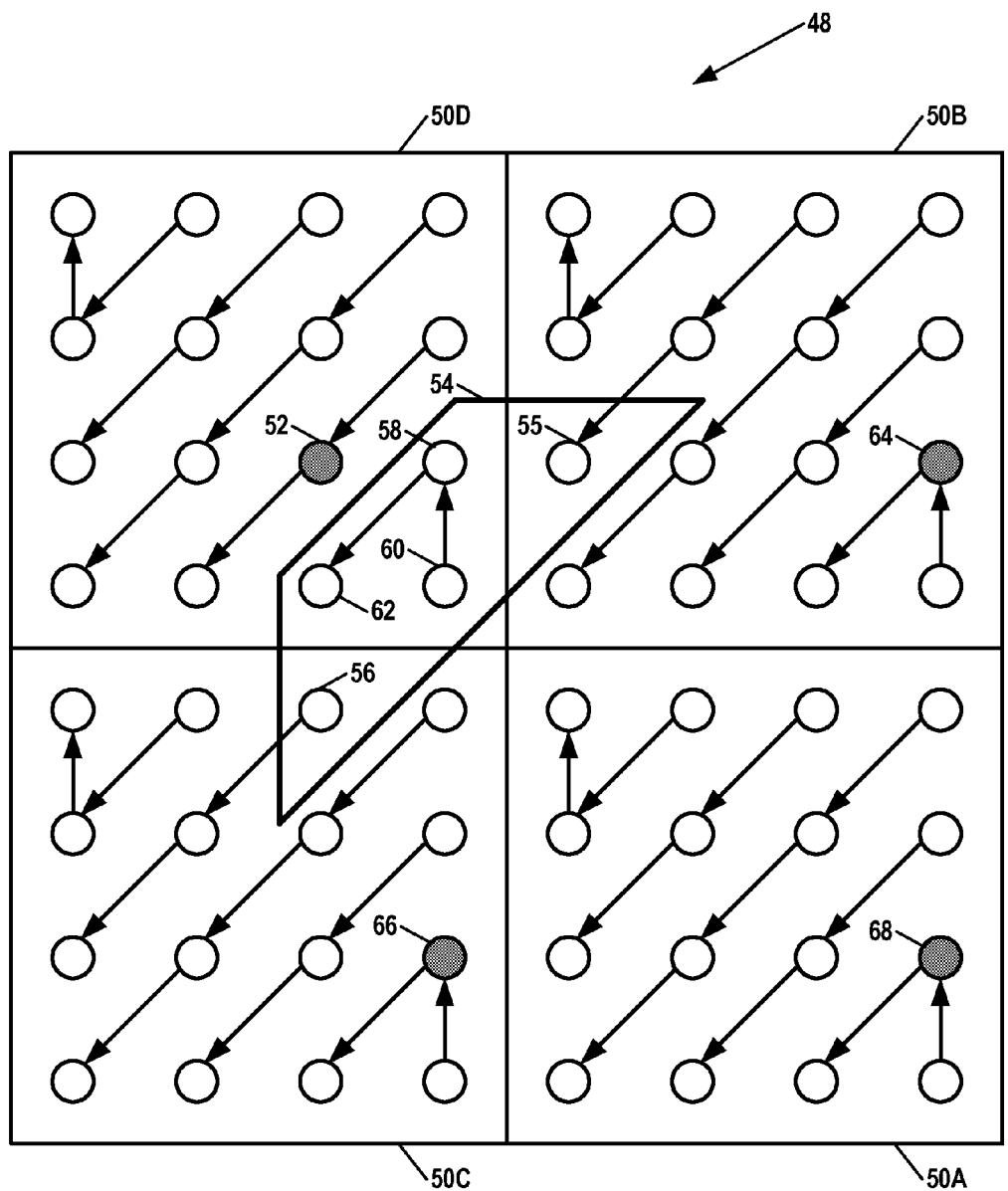
FIG. 2 is a conceptual diagram illustrating an example coefficient block that is divided into sub-blocks.

FIG. 2 is a conceptual diagram illustrating an example coefficient block 48 that is divided into sub-blocks. The example of FIG. 2 shows an example of a 4×4 sub-block scan for an 8×8 TU. Each 4×4 sub-block is a "chunk." HEVC Working Draft 5 does not use a 4×4 sub-block scan for an 8×8 TU, however it is illustrated here as an example.

In FIG. 2, circles correspond to coefficients. Coefficient block 48 includes sub-blocks 50A, 50B, 50C, and 50D. In the example of FIG. 2, the 4×4 sub-blocks are scanned in a reverse diagonal down-left order. Thus, the order of processing for the 4×4 sub-blocks is bottom-right, top-right, bottom-left, and top-left. Within each 4×4 sub-block, the coefficients are processed according to a reverse diagonal down-left scan. Arrows in FIG. 2 indicate a coding order of coefficients. In other examples, a different scanning order, such as top-right diagonal, zigzag, horizontal or vertical may be used. The techniques of this disclosure may be applicable if a forward scan is used instead of an inverse scan. In other words, the techniques of this disclosure may be applicable to forward scans as well as backward scans.

The significance and level information (e.g., the coefficient syntax elements) for each sub-block may be completely coded before proceeding to the next sub-block. Within a sub-block, significance and level information may be coded in the following order: sigMapFlag, gr1Flag, gr2Flag, signFlag, and levelRem. In the example of FIG. 2, video encoder 20 may have already encoded coefficient syntax elements for the coefficients in sub-blocks 50A, 50B, and 50C. That is, video encoder 20 may have already performed all five coding passes on the coefficients in sub-blocks 50A, 50B, and 50C. In this example, video encoder 20 may select a coding context for a coefficient syntax element of coefficient 52 based at least in part on the sigMapFlags, gr1Flags, gr2Flags, signFlags, and levelRems of the coefficients in sub-blocks 50A, 50B, and 50C. Furthermore, video encoder 20 may select the coding context for the coefficient syntax element of coefficient 52 based on higher-priority coefficient syntax elements for coefficients in sub-block 50D. For example, video encoder 20 may select the coding context for a gr2Flag of coefficient 52 based on any of the sigMapFlags and gr1Flags of coefficients in sub-block 50D. Thus, when the gr2Flag of coefficient 52 is coded, all the significance and level information (sigMapFlag, gr1Flag, gr2Flag, signFlag, and levelRem) for the three sub-blocks already processed (i.e., the top-right, bottom-left, and bottom-right sub-chuck) may be used for context formation. In addition, sigMapFlags and gr1Flags for the top-left 4×4 sub-block may be used.

In other examples, video encoder 20 may select, based only on higher-priority coefficient syntax elements of previously-coded sub-blocks and higher-priority coefficient syntax elements of a current sub-block, the coding context for a coefficient syntax element of a coefficient in the current sub-block. For instance, in the example of FIG. 2, video encoder 20 may select the coding context for a gr2Flag of coefficient 52 based on any of the sigMapFlags and gr1Flags of coefficients in sub-blocks 50A, 50B, 50C, and 50D, but not gr2Flags, signFlags, or levelRems of coefficients in any of sub-blocks 50A, 50B, 50C, or 50D.

Furthermore, in some examples, video encoder 20 selects, based on coefficient syntax elements for coefficients in a context neighborhood of a particular coefficient, a coding context for a coefficient syntax element of the particular coefficient. As indicated above, when forming a context for a coefficient syntax element, it may be possible to make the context depend on already-coded information for the coefficient syntax element from the current sub-block. In such instances, separate context derivation neighborhoods may be used for already coded information from the current syntax element and higher-priority syntax elements. In the example of FIG. 2, quadrilateral 54 indicates a context neighborhood for coefficient 52. As shown in the example of FIG. 2, the context neighborhood for coefficient 52 includes a coefficient 55 in sub-block 50B, a coefficient 56 in sub-block 50C, and three coefficients 58, 60, and 62 in sub-block 50D. In some examples, video encoder 20 may select, based on any coefficient syntax element of coefficients 54 and 56 and higher-priority coefficient syntax elements of coefficients 58, 60, and 62, a coding context for a coefficient syntax element of coefficient 52. In other examples, video encoder 20 may select, based on higher-priority coefficient syntax elements of coefficients 54, 56, 58, 60, and 62, a coding context for a coefficient syntax element of coefficient 52. For example, coefficient 52 is the $8^{th}$ coefficient in a sub-block containing sixteen coefficients. Hence, when coding a gr2Flag of coefficient 52, a context for the gr2Flag of coefficient 52 may depend on the gr2Flags coded so far for sub-block 50D (up to the $7^{th}$ coefficient) as well as all the sigMapFlags and gr1Flags for sub-block 50D. Additionally, the context for the gr2Flag of coefficient 52 may depend on significance and level information from previous sub-blocks (i.e., sub-blocks 50A, 50B, and 50C). Thus, for coding the gr2Flag for coefficient 52, it may be possible to use gr2Flag information for coefficients 58, 60, and 62 in addition to sigMapFlag and gr1Flag information for all the 4×4 sub-blocks 50A, 50B, 50C, and 50D. It may, in some examples, be more difficult to parallelize the context derivation process when the context of a coefficient syntax element depends on significance and level information from previous sub-blocks.

Figure 3:
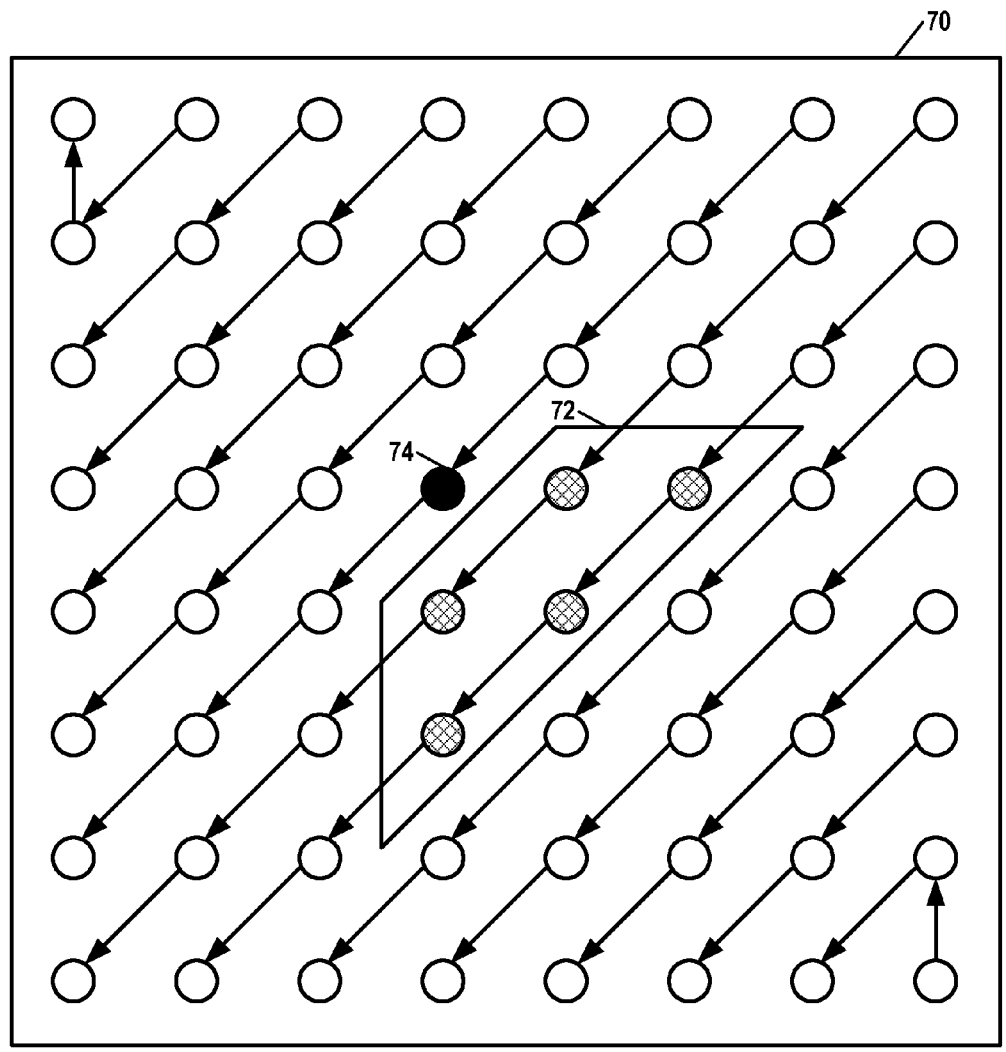
FIG. 3 is a conceptual diagram illustrating an example coefficient block that is not divided into sub-blocks.

In some examples, video encoder 20 does not divide coefficient blocks into sub-blocks as shown in the example of FIG. 2. In such examples, video encoder 20 may perform the same five encoding passes on the whole coefficient block in manner described above. FIG. 3 is a conceptual diagram illustrating an example coefficient block 70 that is not divided into sub-blocks. In FIG. 3, circles correspond to coefficients. In the example of FIG. 3, quadrilateral 72 indicates a context neighborhood for coefficient 74. Video encoder 20 may select, based on higher-priority syntax elements of coefficients in the context neighborhood for coefficient 74, a coding context for a coefficient syntax element of coefficient 72. In other words, when the size of a chunk is the same as the size of the TU, coded information for higher-priority syntax elements for the entire TU can be used in forming the context for the current syntax element. In some examples, when the gr2Flag of coefficient 74 is being coded, the sigMapFlags and gr1Flags for the entire TU may be used in context formation. Additionally, it may be possible to use all the significance and level information from previous TUs for context formation. In some examples, only higher-priority syntax elements (e.g., sigMapFlag and gr1Flag) for current and previous TUs may be used for context formation of the coding context of the gr2Flag of coefficient 74.

In another example, it is not necessary to use the entire information to form a context. Typically, higher-priority syntax element information from a neighborhood around the current coefficient may be used in the formation of the context. For instance, when the size of a sub-block (i.e., chunk) is equal to the size of a TU, any of the TU coefficients may be included in the neighborhood without regard to causality or scan. In the example of FIG. 3, quadrilateral 72 shows an example context neighborhood of coefficient 74. For coding a gr2Flag of coefficient 74, video encoder 20 may select, based on sigMapFlags and gr1Flags of coefficients in the context neighborhood for coefficient 74, a coding context for the gr2Flag of coefficient 74.

In the example of FIG. 3, instead of using sub-blocks (i.e., chunks), the whole TU may be processed using a reverse down-left scan. In this example, the size of a sub-block may be chosen to be the same size as the size of the TU. Furthermore, in the example of FIG. 3, the sigMapFlag information for the entire TU is coded first. This is followed by gr1Flag information for the entire TU, and so on. The information corresponding to each syntax element may be referred to herein as a "pass" since the coefficients in a sub-block or a TU may have to be visited (although not necessarily coded) once for each syntax element.

Furthermore, in some examples, video encoder 20 may select, based at least in part on same-priority coefficient syntax elements of causal coefficients of a current sub-block, a coding context for a coefficient syntax element of a coefficient of the current sub-block. In such examples, video encoder 20 may also select the coding context for the coefficient syntax element based on higher-priority coefficient syntax elements for coefficients in the current sub-block as well as previous sub-blocks in the coding order of the current coding pass (and in some instances any coefficient syntax elements for coefficients in sub-blocks that occur before the current sub-block in the coding order of the current coding pass.) For example, video encoder 20 may determine, based at least in part on gr2Flags of causal coefficients of a current sub-block, a coding context for a gr2Flag of a coefficient of the current sub-block.

To enable parallel context derivation in examples where a coding context for a current coefficient syntax element is formed based at least in part on coefficient syntax elements of previously-coded sub-blocks, one or more restrictions may be imposed on the context derivation neighborhood based on already-coded information for the current coefficient syntax element. That is, the context neighborhood does not contain any positions for which parallel context derivation is desired. This is similar in principle to the ideas described in U.S. application Ser. No. 13/294,869, filed Nov. 11, 2011, which is incorporated herein by reference in its entirety and U.S. Application No. 61/586,609, filed Jan. 13, 2012, which is incorporated herein by reference in its entirety.

To encode multiple coefficient syntax elements of a sub-block in parallel, video encoder 20 may select coding contexts based only on same-priority coefficient syntax elements in the sub-block that are not being encoded in parallel with the coefficient. For instance, the context neighborhood of a coefficient may be shaped such that the context neighborhood does not include any coefficients that may be coded in parallel with the coefficient. In this example, the shape of a context neighborhood may change from one position to another as described in U.S. Application No. 61/586,609. In the example of FIG. 2, a reverse 4×4 sub-block based scan is used. Coefficients on the bottom right of a 4×4 sub-block (e.g., coefficients 64, 66, and 68) may have to use modified context derivation neighbors based on already-coded information for the current syntax element. For instance, if parallelism in context derivation is desired for coding a gr2Flag of one of coefficients 64, 66, and 68, the coded gr2Flag information for the bottom-right pixel of the 4×4 sub-block is not used.

In one example, video encoder 20 may generate a first syntax element and a second syntax element in parallel and may select, in parallel, the coding context for the first syntax element and a coding context for the second syntax element. In this example, the coding context for the first syntax element is not selected based on the second syntax element and the coding context for the second syntax element is not selected based on the first syntax element. In this example, video encoder 20 may entropy encode, in parallel, the first and second syntax elements based on the coding contexts for the first and second syntax elements. Similarly, video decoder 30 may generate a first syntax element and a second syntax element in parallel and select, in parallel, the coding context for the first syntax element and a coding context for the second syntax element. In this example, the coding context for the first syntax element is not selected based on the second syntax element and the coding context for the second syntax element is not selected based on the first syntax element. In this example, video decoder 30 may entropy decode, in parallel, the first and second syntax elements based on the coding contexts for the first and second syntax elements.

In another example, the chunk size may be equal to the TU size and video encoder 20 is coding a gr2Flag of a coefficient. In this example, zigzag or diagonal scan in forward or inverse order may be used. Furthermore, in this example, if all the contexts for gr2Flags corresponding to a diagonal are to be derived in parallel, then no gr2Flag information from that diagonal can be included in the context derivation neighborhood. In this example, any of the TU positions could be included in the context derivation neighborhood for a gr2Flag dependent on sigMap and gr1Flags. The example context neighborhood in FIG. 2 follows this restriction.

In another example, video encoder 20 may select, in parallel, coding contexts for gr2Flags of a first and a second coefficient of a current sub-block. In this example, the context neighborhood of the first coefficient does not include the second coefficient and the context neighborhood of the second coefficient does not include the first coefficient. Hence, in this example, video encoder 20 does not select the coding context for the gr2Flag of the first coefficient based on the gr2Flag of the second coefficient, and vice versa.

In some such examples, the context neighborhood of the particular coefficient may include coefficients in a different sub-block than the particular coefficient. Furthermore, in some examples, the context neighborhood of the particular coefficient block may include causal and non-causal neighbors of the particular coefficient that are in the same sub-block as the particular coefficient. A first coefficient is a causal neighbor of a second coefficient if the first coefficient occurs before the second coefficient according to a coding order of a coding pass. A first coefficient is a non-causal neighbor of a second coefficient if the first coefficient occurs after the second coefficient according to a coding order of a coding pass.

Figure 4:
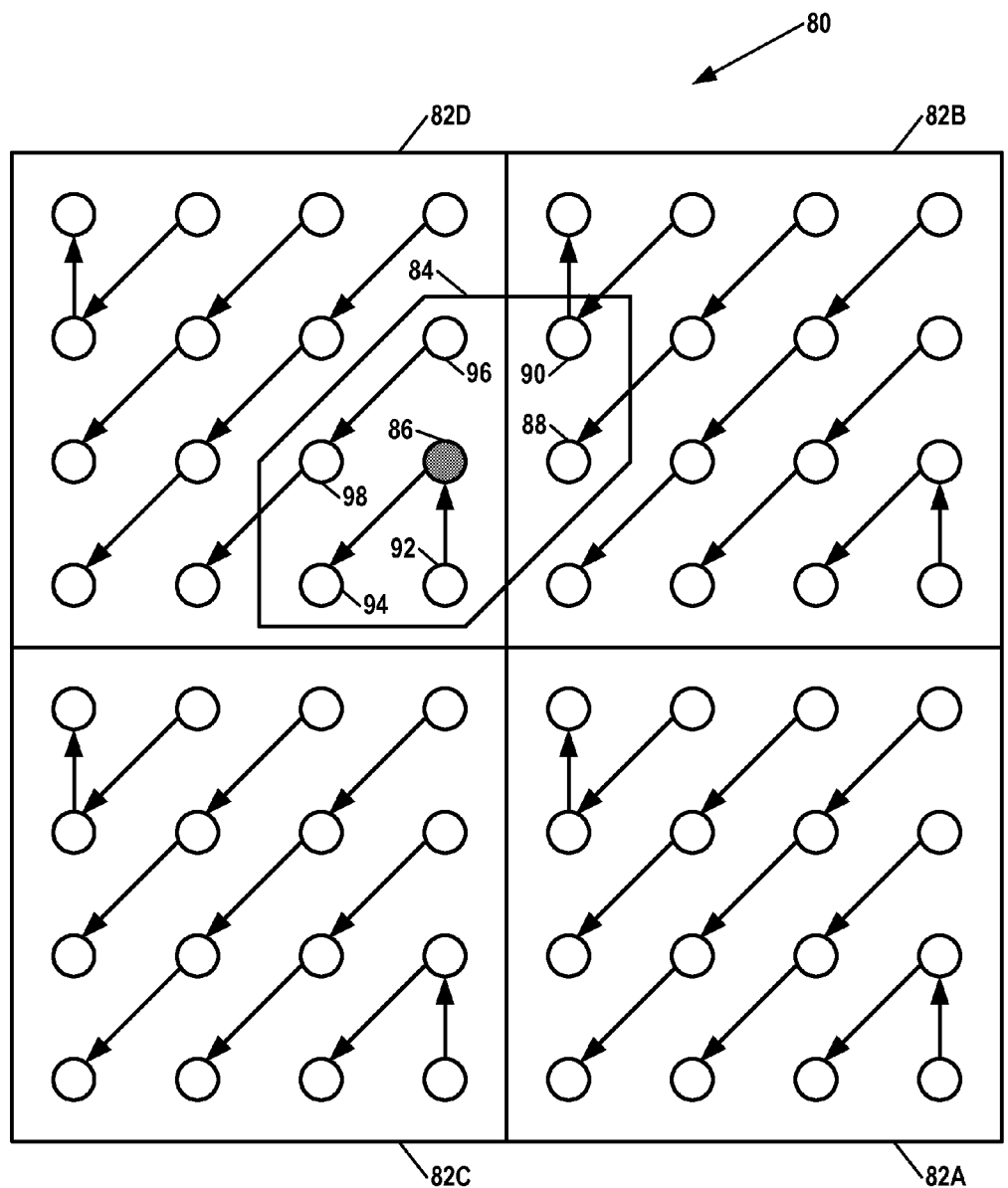
FIG. 4 is a conceptual diagram illustrating an example coefficient block that is divided into sub-blocks and shows a context neighborhood that includes non-causal coefficients.

FIG. 4 is a conceptual diagram illustrating an example context neighborhood that includes causal and non-causal coefficients. Circles in FIG. 4 correspond to coefficients in coefficient block 80. In the example of FIG. 4, a coefficient block 80 is divided into sub-blocks 82A, 82B, 82C, and 82D. A shape 84 indicates a context neighborhood for a coefficient 86. In the example of FIG. 4, the context neighborhood for coefficient 86 includes coefficients 88, 90, 92, 94, 96, and 98. Coefficients 88, 90, and 92 occur before coefficient 86 in coding order and hence are causal coefficients. Coefficients 94, 96, and 98 occur after coefficient 86 in coding order and hence are non-causal coefficients.

In accordance with the techniques of this disclosure, video encoder 20 may encode, during a first coding pass of coefficients of the coefficient block, a first set of syntax elements that correspond to coefficients of the coefficient block. Furthermore, video encoder 20 may encode, during a second coding pass of the coefficients of the coefficient block, a second set of syntax elements that correspond to coefficients of the coefficient block. When video encoder 20 performs the second coding pass, video encoder 20 may generate a first syntax element. The first syntax element may be in the second set of syntax elements and may correspond to a current coefficient of the coefficient block. Furthermore, video encoder 20 may select, based at least in part on a second syntax element and a third syntax element, a coding context for the first syntax element. The second syntax element is in the first set of syntax elements and corresponds to a non-causal coefficient. The third syntax element is in the second set of syntax elements and corresponds to a causal coefficient. The non-causal coefficient occurs after the current coefficient in a coding order of the current (second) coding pass. The causal coefficient occurs before the current coefficient in the coding order of the second coding pass. Video encoder 20 may entropy encode, based at least in part on the coding context selected for the first syntax element, the first syntax element.

Similarly, video decoder 30 may decode, during a first coding pass of coefficients of a coefficient block, a first set of syntax elements that correspond to coefficients of the coefficient block. In addition, video decoder 30 may decode, during a second coding pass of the coefficients of the coefficient block, a second set of syntax elements that correspond to coefficients of the coefficient block. When video decoder 30 performs the second coding pass, video decoder 30 may select, based at least in part on a second syntax element and a third syntax element, a coding context for the first syntax element. The second syntax element is in the first set of syntax elements and corresponds to a non-causal coefficient. The third syntax element is in the second set of syntax elements and corresponds to a causal coefficient. Video decoder 30 may entropy decode, based at least in part on the coding context selected for the first syntax element, the first syntax element.

It should be noted that the context derivation need not use all of the above information. For example, context derivation may be based only on a neighborhood as shown in FIG. 3 and FIG. 4. In another example, the context derivation may be based only on the syntax elements having higher priority. As an example, for coding a gr2Flag for a given coefficient, for context derivation purposes, only information related to syntax elements sigMapFlag and gr1Flag may be used. It may be possible to restrict the information used for context formation in other ways than the ones specified above.

Figure 5:
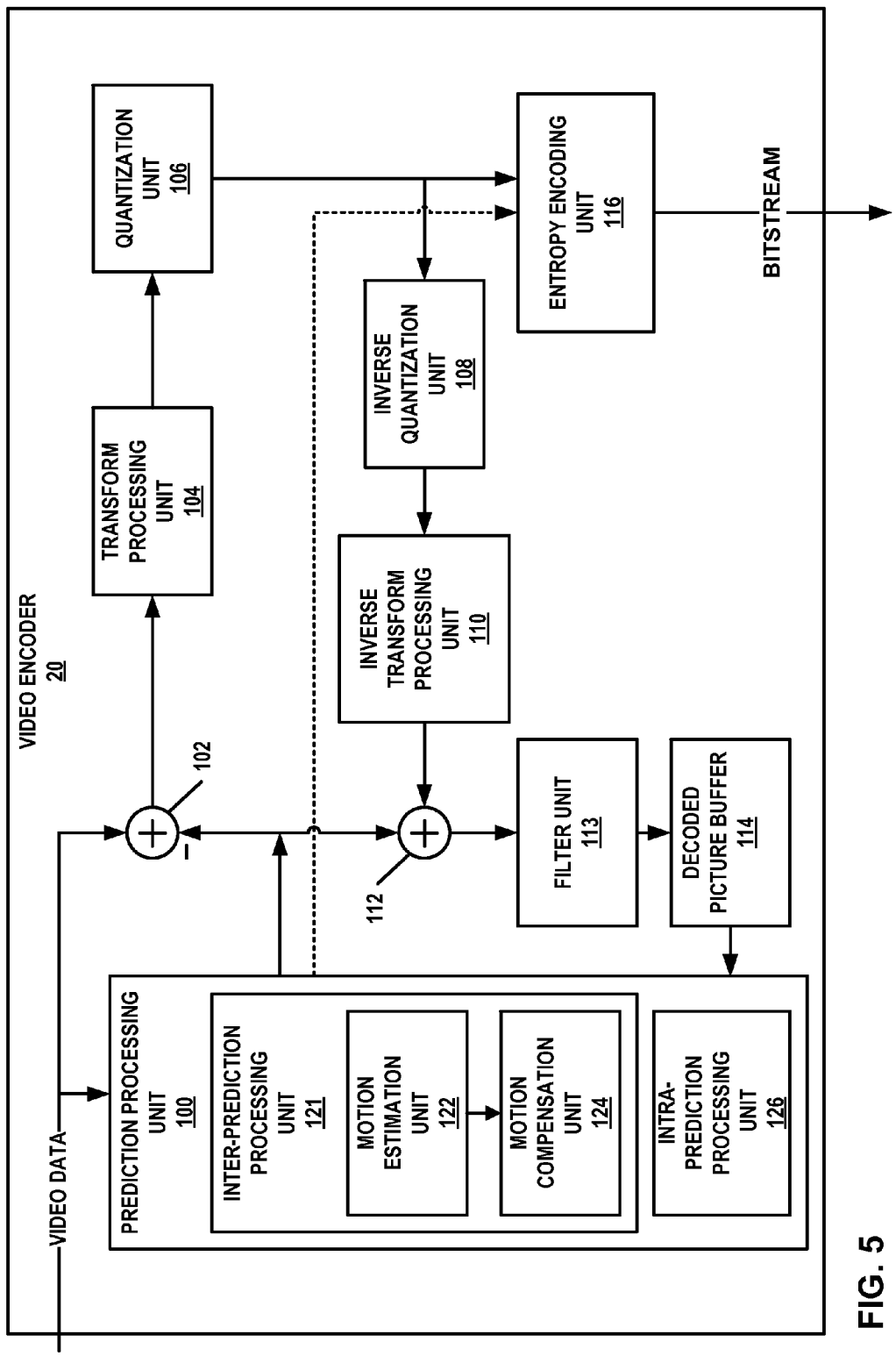
FIG. 5 is a block diagram illustrating an example video encoder that may implement the techniques described in this disclosure.

FIG. 5 is a block diagram that illustrates an example video encoder 20 that is configured to implement the techniques of this disclosure. FIG. 5 is provided for purposes of explanation and should not be considered limiting of the techniques as broadly exemplified and described in this disclosure. For purposes of explanation, this disclosure describes video encoder 20 in the context of HEVC coding. However, the techniques of this disclosure may be applicable to other coding standards or methods.

In the example of FIG. 5, video encoder 20 includes a prediction processing unit 100, a residual generation unit 102, a transform processing unit 104, a quantization unit 106, an inverse quantization unit 108, an inverse transform processing unit 110, a reconstruction unit 112, a filter unit 113, a decoded picture buffer 114, and an entropy encoding unit 116. Prediction processing unit 100 includes an inter-prediction processing unit 121 and an intra-prediction processing unit 126. Inter-prediction processing unit 121 includes a motion estimation unit 122 and a motion compensation unit 124. In other examples, video encoder 20 may include more, fewer, or different functional components.

Video encoder 20 may receive video data. To encode the video data, video encoder 20 may encode each slice of each picture of the video data. As part of encoding a slice, video encoder 20 may encode each CTB in the slice. As part of encoding a CTB, prediction processing unit 100 may perform quad-tree partitioning on the sample blocks associated with the CTB to divide the sample blocks into progressively-smaller sample blocks. The smaller sample blocks may be associated with CUs. For example, prediction processing unit 100 may partition each of the sample blocks of a CTB into four equally-sized sub-blocks, partition one or more of the sub-blocks into four equally-sized sub-sub-blocks, and so on.

Video encoder 20 may encode CUs of a CTB in a picture to generate encoded representations of the CUs (i.e., coded CUs). Video encoder 20 may encode the CUs of a CTB according to a z-scan order. In other words, video encoder 20 may encode a top-left CU, a top-right CU, a bottom-left CU, and then a bottom-right CU, in that order. When video encoder 20 encodes a partitioned CU, video encoder 20 may encode CUs associated with sub-blocks of the sample blocks of the partitioned CU according to the z-scan order.

Furthermore, as part of encoding a CU, prediction processing unit 100 may partition the sample blocks of the CU among one or more PUs of the CU. Video encoder 20 and video decoder 30 may support various PU sizes. Assuming that the size of a particular CU is 2N×2N, video encoder 20 and video decoder 30 may support PU sizes of 2N×2N or N×N for intra prediction, and symmetric PU sizes of 2N×2N, 2N×N, N×2N, N×N, or similar for inter prediction. Video encoder 20 and video decoder 30 may also support asymmetric partitioning for PU sizes of 2N×nU, 2N×nD, nL×2N, and nR×2N for inter prediction.

Inter-prediction processing unit 121 may generate predictive data for a PU by performing inter prediction on each PU of a CU. The predictive data for the PU may include predictive sample blocks that correspond to the PU and motion information for the PU. Slices may be I slices, P slices, or B slices. Inter-prediction unit 121 may perform different operations for a PU of a CU depending on whether the PU is in an I slice, a P slice, or a B slice. In an I slice, all PUs are intra predicted. Hence, if the PU is in an I slice, inter-prediction unit 121 does not perform inter prediction on the PU.

If a PU is in a P slice, motion estimation unit 122 may search the reference pictures in a list of reference pictures (e.g., "list 0") for reference blocks for the PU. The reference blocks of the PU may be a set of sample blocks that correspond to a same area of a reference picture and that most closely corresponds to the sample blocks of the PU. Motion estimation unit 122 may generate a reference picture index that indicates the reference picture in list 0 containing the reference block of the PU and a motion vector that indicates a spatial displacement between the luma sample block of the PU and the luma reference sample block. Motion estimation unit 122 may output the reference picture index and the motion vector as the motion information of the PU. Motion compensation unit 124 may generate the predictive sample blocks of the PU based on the reference blocks indicated by the motion information of the PU.

If a PU is in a B slice, motion estimation unit 122 may perform uni-directional inter prediction or bi-directional inter prediction for the PU. To perform uni-directional inter prediction for the PU, motion estimation unit 122 may search the reference pictures of a first reference picture list ("list 0") or a second reference picture list ("list 1") for a reference block for the PU. Motion estimation unit 122 may output, as the motion information of the PU, a reference picture index that indicates a position in list 0 or list 1 of the reference picture that contains the reference block, a motion vector that indicates a spatial displacement between the sample blocks of the PU and the reference block, and a prediction direction indicator that indicates whether the reference picture is in list 0 or list 1.

To perform bi-directional inter prediction for a PU, motion estimation unit 122 may search the reference pictures in list 0 for a reference block for the PU and may also search the reference pictures in list 1 for another reference block for the PU. Motion estimation unit 122 may generate reference picture indexes that indicate positions in list 0 and list 1 of the reference pictures that contain the reference blocks. In addition, motion estimation unit 122 may generate motion vectors that indicate spatial displacements between the reference blocks and the sample blocks of the PU. The motion information of the PU may include the reference picture indexes and the motion vectors of the PU. Motion compensation unit 124 may generate the predictive sample blocks of the PU based on the reference blocks indicated by the motion information of the PU.

Intra-prediction processing unit 126 may generate predictive data for a PU by performing intra prediction on the PU. The predictive data for the PU may include predictive sample blocks for the PU and various syntax elements. Intra-prediction processing unit 126 may perform intra prediction on PUs in I slices, P slices, and B slices.

To perform intra prediction on a PU, intra-prediction processing unit 126 may use multiple intra prediction modes to generate multiple sets of predictive data for the PU. To use an intra prediction mode to generate a set of predictive data for the PU, intra-prediction processing unit 126 may extend samples from sample blocks of neighboring PUs across the sample blocks of the PU in a direction associated with the intra prediction mode. The neighboring PUs may be above, above and to the right, above and to the left, or to the left of the PU, assuming a left-to-right, top-to-bottom encoding order for PUs, CUs, and CTBs. Intra-prediction processing unit 126 may use various numbers of intra prediction modes, e.g., 33 directional intra prediction modes. In some examples, the number of intra prediction modes may depend on the size of the sample blocks of the PU.

Prediction processing unit 100 may select the predictive data for PUs of a CU from among the predictive data generated by inter-prediction processing unit 121 for the PUs or the predictive data generated by intra-prediction processing unit 126 for the PUs. In some examples, prediction processing unit 100 selects the predictive data for the PUs of the CU based on rate/distortion metrics of the sets of predictive data. The predictive sample blocks of the selected predictive data may be referred to herein as the selected predictive sample blocks.

Residual generation unit 102 may generate, based on the sample blocks of a CU and the selected predictive sample blocks of the PUs of the CU, residual sample blocks of a CU. For instance, residual generation unit 102 may generate the residual sample blocks of the CU such that each sample in the residual sample blocks has a value equal to a difference between a sample in an original sample block of the CU and a corresponding sample in a selected predictive sample block of a PU of the CU.

Transform processing unit 104 may generate a set of one or more TUs for a CU. Each of the TUs of the CU may be associated with a luma residual sample block and two chroma sample blocks. A TU's luma residual sample block may be a sub-block of the CU's luma residual sample block and the TU's chroma residual sample blocks may be sub-blocks of the CU's chroma residual sample blocks. The TU's chroma residual sample blocks correspond to the same area of the picture as the TU's luma residual sample block. Transform processing unit 104 may perform quad-tree partitioning to partition the residual sample blocks of a CU into residual sample blocks associated with the CU's TUs. The sizes and positions of the residual sample blocks associated with TUs of a CU may or may not be based on the sizes and positions of sample blocks of the PUs of the CU.

Transform processing unit 104 may generate coefficient blocks for each TU of a CU by applying one or more transforms to the residual sample blocks associated with the TU. Transform processing unit 104 may apply various transforms to a residual sample block associated with a TU. For example, transform processing unit 104 may apply a discrete cosine transform (DCT), a directional transform, or a conceptually-similar transform to a residual sample block. The transforms may convert the residual sample block from a pixel domain to a frequency domain. Thus, the coefficients in the coefficient block may be said to be at particular frequencies.

Quantization unit 106 may quantize the coefficients in a coefficient block. The quantization process may reduce the bit depth associated with some or all of the coefficients. For example, an n-bit coefficient may be rounded down to an m-bit coefficient during quantization, where n is greater than m. Quantization unit 106 may quantize a coefficient block associated with a TU of a CU based on a quantization parameter (QP) value associated with the CU. Video encoder 20 may adjust the degree of quantization applied to the coefficient blocks associated with a CU by adjusting the QP value associated with the CU.

Inverse quantization unit 108 and inverse transform processing unit 110 may apply inverse quantization and inverse transforms to a coefficient block, respectively, to reconstruct a residual sample block from the coefficient block. Reconstruction unit 112 may add samples of the reconstructed residual sample block to corresponding samples from one or more predictive sample blocks generated by prediction processing unit 100 to produce a reconstructed sample block associated with a TU. By reconstructing sample blocks for each TU of a CU in this way, video encoder 20 may reconstruct the sample blocks of the CU.

Filter unit 113 may perform a deblocking operation to reduce blocking artifacts in the sample blocks of a CU. Decoded picture buffer 114 may store the reconstructed sample blocks. Inter-prediction unit 121 may use a reference picture that contains the reconstructed sample blocks to perform inter prediction on PUs of other pictures. In addition, intra-prediction processing unit 126 may use reconstructed sample blocks in decoded picture buffer 114 to perform intra prediction on other PUs in the same picture as the CU.

Entropy encoding unit 116 may receive data from other functional components of video encoder 20. For example, entropy encoding unit 116 may receive coefficient blocks from quantization unit 106 and may receive syntax elements from prediction processing unit 100. Entropy encoding unit 116 may perform one or more entropy encoding operations on the data to generate entropy-encoded data. For example, entropy encoding unit 116 may perform a context-adaptive variable length coding (CAVLC) operation, a CABAC operation, a variable-to-variable (V2V) length coding operation, a syntax-based context-adaptive binary arithmetic coding (SBAC) operation, a Probability Interval Partitioning Entropy (PIPE) coding operation, an Exponential-Golomb encoding operation, or another type of entropy encoding operation on the data. Video encoder 20 may output a bitstream that includes entropy-encoded data generated by entropy encoding unit 116.

Entropy encoding unit 116 may divide a coefficient block associated with a leaf node of an RQT (i.e., a coefficient block associated with a TU) into a plurality of sub-blocks. Entropy encoding unit 116 may process the sub-blocks sequentially, such that entropy encoding unit 116 completely processes one of the sub-blocks before processing a next one of the sub-blocks. Entropy encoding unit 116 may process the sub-blocks in a reverse order, starting at a lower-right sub-block. Entropy encoding unit 116 may process luma coefficient blocks (i.e., coefficient blocks derived from luma residual sample blocks) and chroma coefficient blocks (i.e., coefficient blocks derived from chroma residual sample blocks) in this way.

Nguyen et al., "Non-CE11: Proposed Cleanup for Transform Coefficient Coding," document no. JCTVC-H0228, Jan. 20, 2011, the entire content of which is incorporated herein by reference, proposes a different method for transform coefficient coding. In the proposal of JCTVC-H0228, the same five syntax elements described above are used. However, a context neighborhood of the current coefficient is used to derive the context for sigMapFlag, gr1Flag, and gr2Flag, as well as the Golomb-Rice parameter for levelRem. An example context neighborhood used for context derivation for coefficient 74 (in case of a diagonal down-left scan) is shown in FIG. 3 with quadrilateral 72. The context neighborhood is the same as the one used by the HEVC committee draft for coding of sigMapFlags. Other context neighborhoods may be used as well. In the proposal of JCTVC-H0228, the context derivation for different syntax elements is based on a function of absolute levels of coefficients in the context neighborhood. Furthermore, in JCTVC-H0228, instead of coding each chunk in five passes, one for each coefficient syntax element mentioned above, all the necessary coefficient syntax elements for one coefficient are coded before proceeding to the next coefficient. Furthermore, the proposal of JCTVC-H0228 provides that in some scans (such as 4×4 sub-block scans), two consecutive coefficients may belong to different diagonals. In this case, the context for one coefficient may depend on the actual decoded (absolute) value of the previous coefficient.

In the proposal of JCTVC-H0228, the following quantities are defined using the context neighborhood. Summation is over all coefficients in the context neighborhood.

$$\text{num\_significant\_coeff} = \sum \delta_i(x_i) \text{ with } \delta_i(x_i) = \begin{cases} 1 & x_i \neq 0 \\ 0 & x_i = 0 \end{cases}$$

$$\text{sum\_absolute\_level} = \sum |x_i|$$

$$\text{sum\_absolute\_levelMinus1} = \sum \delta_j(x_i) \text{ with}$$

$$\delta_j(x_i) = \begin{cases} |x_i| - 1 & |x_i| > 0 \\ 0 & |x_i| = 0 \end{cases}$$

In the proposal of JCTVC-H0228, the sum_absolute_level value is used to derive a context index for sigMapFlags and the sum_absolute_levelMinus1 value is used to derive the context indexes for gr1Flags and gr2Flags. The context indexes may identify coding contexts.

In the proposal of JCTVC-H0228, after calculating num_significant_coeff, sum_absolute_level, and sum_absolute_levelMinus1, the context model indices for sigMapFlag, gr1Flag, and gr2Flag (i.e., $c_0$, $c_1$, and $c_2$, respectively) are derived as:

$c_0$=min(sum_absolute_level,5)

$c_1$=min(sum_absolute_levelMinus1,4)+1

$c_2$=min(sum_absolute_levelMinus1,4)+1

The proposal of JCTVC-H0228 may have several drawbacks. For example, the number of syntax elements that need to be coded for each coefficient can vary from one to five. This may create a bottleneck in the coding process and may make it difficult to use look-ahead strategies in order to parallelize or code multiple bins in one cycle. Furthermore, in some coding orders, such as 4×4 sub-block coding orders, two consecutive coefficients may belong to different diagonals. In this case, the coding context for one coefficient may depend on the actual decoded value of the previous coefficient. Another drawback is that for context derivation, significance as well as level information for the coefficients in the neighborhood is needed. Storing significance and level information of coefficients in the context neighborhood may increase the amount of storage needed. In another example, the context-coded syntax elements and the bypass coded syntax element are interleaved, which may penalize the parallelization parsing capability of bypass coded syntax elements.

One or more techniques of this disclosure may address the drawbacks of the proposal of JCTVC-H0228. As described above, a video coder (e.g., video encoder 20 or video decoder 30) facilitates processing of multiple bins in one cycle (or in parallel) by dividing each TU include one or more subsets (e.g., sub-blocks or chunks). The video coder may then use the five coding passes described in HEVC Working Draft 5. However, in accordance with one or more techniques of this disclosure, context derivation for sigMapFlag, gr1Flag and gr2Flag, as well as the Golomb-rice parameter selection for the syntax element levelRem is performed as described in JCTVC-H0228 using a context neighborhood. However, unlike the proposal of JCTVC-H0228, the context neighborhood may include non-causal coefficients.

In accordance with one or more techniques of this disclosure, when entropy encoding unit 116 processes a sub-block, entropy encoding unit 116 may perform the five coding passes described above. That is, entropy encoding unit 116 may perform a first coding pass to encode sigMapFlags for coefficients of the sub-block, a second coding pass to encode gr1Flags for coefficients of the sub-block, a third coding pass to encode gr2Flags for coefficients of the sub-block, a fourth coding pass to encode signFlags for coefficients of the sub-block, and a fifth coding pass to encode levelRems for coefficients of the sub-block.

When entropy encoding unit 116 performs any of the coding passes, entropy encoding unit 116 processes each of the coefficients in the sub-block according to a coding order. The coding order may be a reverse down-left diagonal coding order, a horizontal coding order, a vertical coding order, or another coding order. Coefficients that occur at consecutive positions in the coding order may be referred to as consecutive coefficients.

During each respective coding pass, entropy encoding unit 116 entropy encodes syntax elements generated during the respective coding pass. For example, entropy encoding unit 116 may CABAC encode sigMapFlags during the first coding pass, gr1Flags during the second coding pass, and gr2Flags during the third coding pass. To encode a coefficient syntax element using regular CABAC coding, entropy encoding unit 116 may select a coding context for the coefficient syntax element. Entropy encoding unit 116 may select a coding context for a coefficient syntax element of a particular coefficient by determining a context index and then using the context index to look up the coding context.

In some examples, entropy encoding unit 116 determines a context index based on actual or estimated absolute values of coefficients in a context neighborhood of the current coefficient. If entropy encoding unit 116 already encoded each coefficient syntax element of a coefficient, entropy encoding unit 116 may determine the actual absolute value of the coefficient. For instance, entropy encoding unit 116 does not need to determine estimated absolute values of causal neighbor coefficients outside the current sub-block because entropy encoding unit 116 is able to use the sigMapFlags, gr1Flags, gr2Flags, and levelRems of these coefficients to determine the actual absolute values of these coefficients. For example, a coefficient block may comprise a plurality of sub-blocks and the coding order of the current coding pass may be based on the sub-blocks. In this example, a causal coefficient may be in a different one of the sub-blocks than a current coefficient.

However, if entropy encoding unit 116 has not yet encoded each coefficient syntax element of a coefficient, entropy encoding unit 116 may be unable to determine the actual absolute value of the coefficient based on the coefficient syntax elements of the coefficient. Accordingly, if entropy encoding unit 116 has not yet encoded each coefficient syntax element of a coefficient, entropy encoding unit 116 may determine an estimated or actual absolute value of the coefficient. For instance, entropy encoding unit 116 may use current-priority coefficient syntax elements and lower-priority coefficient syntax elements of causal neighbor coefficients of a particular coefficient to determine estimated or actual absolute values of the causal neighbor coefficients. As an example, in the 3$^{rd}$ coding pass (i.e., when the gr2Flag for a coefficient is being coded), the minimum absolute level values that can be inferred from sigMapFlag and gr1Flag are used for coefficients in the current coefficient's context neighborhood. If the sigMapFlag of a coefficient is 0, the estimated absolute value of the coefficient is 0. If the sigMapFlag of the coefficient is 0 and the gr1Flag of the coefficient is 0, the estimated absolute level is inferred to be 1. If the sigMapFlag of a coefficient is 1 and the gr1Flag of the coefficient is 1, the absolute level is inferred to be 2. Thus, the inferred values are based on assigning a value of 0 to syntax elements that have not been coded so far. For a causal coefficient in the neighborhood, the gr2Flag has a value 1, the actual absolute value of the causal coefficient is unknown, but may be estimated as 3.

For instance, the example of FIG. 2 shows a causal neighborhood. Thus, the context neighborhood only includes coefficients for which the current syntax element (i.e., the coefficient syntax element associated with the current coding pass) has already been encoded (or decoded). However, in accordance with the techniques of this disclosure, a video coder (e.g., video encoder 20 or video decoder 30) may use a non-causal neighborhood (in scan order) as shown in the example of FIG. 4. Particularly, for the context neighborhood coefficients that are non-causal (i.e., coefficients 94, 96, and 98 in FIG. 4), only information up to the previous syntax element (i.e., coding pass) can be used in the context derivation. For context neighborhood coefficients that are causal and that belong to the same sub-block as the current coefficient, the absolute levels of such coefficients may be inferred from all the coefficient syntax elements of such coefficients up to the syntax element of the current coding pass. For the context neighborhood coefficients that are causal and outside the sub-block of the current coefficient, the actual absolute level values of the context neighborhood coefficients may be used.

In general, entropy encoding unit 116 may determine a coding context for a coefficient syntax element Y of a coefficient X based on, for all causal coefficients in a sub-block containing coefficient X, estimated (or actual) absolute values of the causal coefficients based on syntax elements having priority greater than or equal to the priority of coefficient syntax element Y. For example, to determine an estimated (or actual) absolute value of a causal neighbor coefficient in the same sub-block as a current coefficient when entropy encoding unit 116 is encoding a sigMapFlag for the current coefficient, entropy encoding unit 116 may determine whether the sigMapFlag of the causal neighbor coefficient is equal to 0 or 1. If the sigMapFlag of the causal neighbor coefficient is equal to 0, entropy encoding unit 116 may determine that the absolute value of the causal neighbor coefficient is equal to 0. If the sigMapFlag of the causal neighbor coefficient is equal to 1, entropy encoding unit 116 may determine that the estimated absolute value of the causal neighbor coefficient is equal to 1.

To determine an estimated (or actual) absolute value of a causal neighbor coefficient in the same sub-block as a current coefficient when entropy encoding unit 116 is encoding a gr1Flag for the current coefficient, entropy encoding unit 116 may determine whether the sigMapFlag for the causal neighbor coefficient is equal to 0 or 1. If the sigMapFlag for the causal neighbor coefficient is equal to 0, entropy encoding unit 116 may determine that the absolute value of the causal neighbor coefficient is equal to 0. If the sigMapFlag for the causal neighbor coefficient is equal to 1, entropy encoding unit 116 may determine whether the gr1Flag of the causal neighbor coefficient is equal to 0 or 1. If the gr1Flag of the causal neighbor coefficient is equal to 0, entropy encoding unit 116 may determine that the absolute value of the causal neighbor coefficient is equal to 1. If the gr1Flag of the causal neighbor coefficient is equal to 1, entropy encoding unit 116 may determine that the estimated absolute value of the causal neighbor coefficient is equal to 2.

To determine an estimated (or actual) absolute value of a causal neighbor coefficient in the same sub-block as a current coefficient when entropy encoding unit 116 is encoding a gr2Flag for the current coefficient, entropy encoding unit 116 may determine whether the sigMapFlag for the causal neighbor coefficient is equal to 0 or 1. If the sigMapFlag for the causal neighbor coefficient is equal to 0, entropy encoding unit 116 may determine that the absolute value of the causal neighbor coefficient is equal to 0. If the sigMapFlag for the causal neighbor coefficient is equal to 1, entropy encoding unit 116 may determine whether the gr1Flag of the causal neighbor coefficient is equal to 0 or 1. If the gr1Flag of the causal neighbor coefficient is equal to 0, entropy encoding unit 116 may determine that the absolute value of the causal neighbor coefficient is equal to 1. If the gr1Flag of the causal neighbor coefficient is equal to 1, entropy encoding unit 116 may determine whether the gr2Flag of the causal neighbor coefficient is equal to 0 or 1. If the gr2Flag of the causal neighbor coefficient is equal to 0, entropy encoding unit 116 may determine that the absolute value of the causal neighbor coefficient is equal to 2. If the gr2Flag of the causal neighbor coefficient is equal to 1, entropy encoding unit 116 may determine that the estimated absolute value of the causal neighbor coefficient is equal to 3.

In addition, entropy encoding unit 116 may use lower priority syntax elements of non-causal neighbor coefficients to determine estimated (or actual) absolute values of non-causal coefficients. That is, the coding context determination for a coefficient syntax element Y for a coefficient X may be based on, for all non-causal coefficients in a sub-block, estimated (or actual) absolute values based on syntax elements having higher priority than the priority of coefficient syntax element Y. For instance, entropy encoding unit 116 may determine, based at least in part on a syntax element encoded in a previous pass, an estimated (or actual) absolute value of a non-causal coefficient, determining, based at least in part on a syntax element encoded in the current coding pass, an estimated (or actual) absolute value of a causal coefficient, and select, based at least in part on the estimated (or actual) absolute value of the non-causal coefficient and the estimated (or actual) absolute value of the causal coefficient, the coding context of a syntax element.

For example, if entropy encoding unit 116 is currently coding a sigMapFlag, entropy encoding unit 116 may determine that an estimated absolute value of a non-causal neighbor coefficient is equal to 0. If entropy encoding unit 116 is currently coding a gr1Flag and the sigMapFlag of the non-causal neighbor coefficient is equal to 0, entropy encoding unit 116 may determine that the absolute value of a non-causal neighbor coefficient is equal to 0. If entropy encoding unit 116 is currently coding a gr1Flag and the sigMapFlag of the non-causal neighbor coefficient is equal to 1, entropy encoding unit 116 may determine that an estimated absolute value of the non-causal neighbor coefficient is equal to 1.

If entropy encoding unit 116 is encoding a gr2Flag and the sigMapFlag of a non-causal neighbor coefficient is equal to 0, entropy encoding unit 116 may determine that the absolute value of the non-causal neighbor coefficient is equal to 0. If entropy encoding unit 116 is encoding a gr2Flag, the sigMapFlag of a non-causal neighbor coefficient is equal to 1, and the gr1Flag of the non-causal neighbor coefficient is equal to 0, entropy encoding unit 116 may determine that the absolute value of the non-causal neighbor coefficient is equal to 1. If entropy encoding unit 116 is encoding a gr2Flag, the sigMapFlag of a non-causal neighbor coefficient is equal to 1, and the gr1Flag of the non-causal neighbor coefficient is equal to 1, entropy encoding unit 116 may determine that an estimated absolute value of the non-causal neighbor coefficient is equal to 2.

As entropy encoding unit 116 performs the fourth and/or fifth coding passes, entropy encoding unit 116 may identify Golomb-Rice codes associated with the levelRems of the coefficients. To identify a Golomb-Rice code for a coefficient syntax element of a coefficient, entropy encoding unit 116 may select a coding context for the coefficient syntax element based on estimated or actual absolute values of coefficients in a context neighborhood of the coefficient. Entropy encoding unit 116 may then use the selected context to identify the Golomb-Rice parameter and the Golomb-Rice code for the coefficient syntax element. Entropy encoding unit 116 may output the Golomb-Rice codes.

If entropy encoding unit 116 is performing a Golomb-Rice coding operation on a levelRem, entropy encoding unit 116 does not need to determine the estimated absolute values of the causal neighbor coefficients within the current sub-block because entropy encoding unit 116 is able to use the sigMapFlags, gr1Flags, gr2Flags, and levelRems of these coefficients to determine the actual absolute values of these coefficients.

In some examples, a video coder (e.g., video encoder 20 or video decoder 30) determines coding contexts based on context indexes. The video coder may calculate a context index for a sigMapFlag of a coefficient by calculating a context index $c_0$, where $c_0$=min (sum_absolute_level, 5), where sum_absolute_level is a sum of actual or estimated absolute values of coefficients in a context neighborhood of the coefficient. In other words, $$\text{sum\_absolute\_level} = \Sigma \delta_i(x_i)$$

In the proposal of JCTVC-H0228, the context neighborhood of a coefficient is limited to causal neighbors, as shown in the example of FIGS. 2 and 3. Furthermore, in the proposal of JCTVC-H0228, the video coder performs a single pass through each sub-block. During the single pass, the video coder generates and encodes a sigMapFlag, a gr1Flag, a gr2Flag, a signFlag, and LevelRem for a coefficient of the sub-block before processing a next coefficient of the sub-block.

Furthermore, in the proposal of JCTVC-H0228, the video coder may calculate a context index $c_1$ for a gr1Flag, where $c_1$=min (sum_absolute_levelMinus1, 4)+1. To calculate a context index for a gr2Flag, the video coder may calculate a context index $c_2$, where $c_2$=min (sum_absolute_levelMinus1, 4)+1. The value sum_absolute_levelMinus1 may be determined by subtracting a value num_significant_coeff from sum_absolute_level, where num_significant_coeff is equal to the number of non-zero coefficients in the context neighborhood.

$$\text{sum\_absolute\_levelMinus1} = \Sigma \delta_i(x_i)$$

In the equation above, the summation is over all coefficients in the context neighborhood. In the equation above, $\partial_j(x_i)$ is equal to $|x_i|-1$ if $|x_i|>0$ and equal to 0 if $x_i$ is equal to 0, where $x_i$ is an actual or estimated absolute value of a coefficient i. The video coder may determine sum_absolute_levelMinus1 by subtracting a value num_significant_coeff from sum_absolute_level. The value num_significant_coeff is equal to:

$$\text{num\_significant\_coeff} = \Sigma \partial_i(x_i)$$

with $$\partial_i(x_i) = \begin{cases} 1 & x_i \neq 0 \\ 0 & x_i = 0 \end{cases}$$

Furthermore, if the proposal of JCTVC-H0228 were extended to coding passes and non-causal neighbor coefficients, too much importance may be accorded to the estimated (or actual) absolute values of non-causal neighbor coefficients, which could degrade coding efficiency. For example, the absolute values of coefficients typically decrease, on average, for coefficients at higher frequencies. Hence, if a causal coefficient is significant and has a high absolute magnitude, it is likely that the current coefficient is significant and has a high absolute magnitude. One example of a high absolute magnitude may be 3 or higher. However, this relationship does not apply for non-causal coefficients. For example, the current coefficient is typically at a higher frequency than a non-causal coefficient. Hence, if a non-causal coefficient is significant, the inference that the current coefficient is significant is weaker than it would be for causal coefficients. For this reason, entropy encoding unit 116 may, in accordance with the techniques of this disclosure, treat causal and non-causal coefficients differently when determining coding contexts.

For example, entropy encoding unit 116 may, in accordance with the techniques of this disclosure, apply different weights to the estimated or actual absolute values of non-causal coefficients as opposed to the actual or estimated absolute values of causal coefficients when determining coding contexts. In other words, different weights may be given to the causal and non-causal coefficients. In this example, the weight applied to a non-causal coefficient (or the causal coefficient) may depend on the distance, in terms number of coefficients in coding order, between the non-causal coefficient and the current coefficient. Moreover, in general, non-causal coefficients may be assigned lower weights than causal coefficients within the coding context for a given coefficient.

In accordance with one or more techniques of this disclosure, entropy encoding unit 116 may decrease a total significance of non-causal neighbor coefficients by 1. For example, entropy encoding unit 116 may maintain separate sums for causal and non-causal coefficients. In this example, entropy encoding unit 116 may decrease the importance of total significant non-causal coefficients in the context neighborhood by reducing the total by one. Hence, if the number of significant non-causal coefficients is four, for calculating num_significant_coeff, the number of significant non-causal coefficients is treated to be three. That is, entropy encoding unit 116 may calculate num_significant_coeff as:

$$\text{num\_significant\_coeff} = \left(\sum_{non\text{-}causal} d_i(x_i) - 1\right) + \sum_{causal} d_i(x_i)$$

Entropy encoding unit 116 may determine the sum_absolute_levelMinus1 by calculating:

sum_absolute_level−num_significant_coeff

Entropy encoding unit 116 may determine the context index for a gr1Flag or a gr2Flag as the lesser of sum_absolute_level_Minus1 and 4. Similar modifications can be made to calculation of other values such as sum_absolute_level and sum_absolute_levelMinus1. Instead of reduction by one, entropy encoding unit 116 may apply other adjustments to the context derivation calculations for non-causal coefficients in the context neighborhood. For instance, in other examples, entropy encoding unit 116 may decrease the number of significant non-causal neighbor coefficients by values other than 1, e.g., 2, 3, 4, etc. The higher the adjustment applied to the number of significant non-causal context neighborhood coefficients, the lower the effective weight of non-causal coefficients. In this way, entropy encoding unit 116 may apply a formula to determine, based on the estimated or actual absolute values of one or more non-causal coefficients and estimated absolute values of one or more causal coefficients, an index, wherein the formula applies a weighting value to the estimated or actual absolute values of the one or more non-causal coefficient or the estimated or actual absolute value of the one or more causal coefficients. Entropy encoding unit 116 may select, based at least in part on the index, the coding context of a syntax element.

In other examples, entropy encoding unit 116 may determine context indexes for sigMapFlags, gr1Flags, and gr2Flags in ways other than those described above. For example, entropy encoding unit 116 may determine a context index for a gr1Flag based on the number of context neighborhood coefficients with absolute values greater than 1. In another example, entropy encoding unit 116 may use two sets of coding contexts for gr1Flags. In this example, entropy encoding unit 116 may use a first set of coding contexts for a gr1Flag if there are no context neighborhood coefficients with absolute values greater than 1. Furthermore, in this example, entropy encoding unit 116 may use a second set of coding contexts for a gr1Flag if there are one or more context neighborhood coefficients with absolute values greater than 1. In this example, entropy encoding unit 116 may determine a context index into either the first or the second set of coding contexts to be equal to the lesser of sum_absolute_levelMinus1 or 4. In this way, entropy encoding unit 116 may select a coding context for a gr1Flag based on how many coefficients in the context neighborhood of the current coefficient have absolute values greater than 1. In other examples, entropy encoding unit 116 may use more than two sets of coding contexts for a gr1Flag. Similarly, entropy encoding unit 116 may use multiple sets of coding contexts for sigMapFlags and gr2Flags. In another example, entropy encoding unit 116 may determine a context index for a sigMapFlag based on the number of neighbor coefficients with absolute values greater than 1 and greater than 2.

Entropy encoding unit 116 may store absolute values of coefficients in order to calculate context indexes $c_0$, $c_1$, and $c_2$, as defined above. From the definitions of $c_0$, $c_1$, and $c_2$, if sum_absolute_level is greater than 4, the value of $c_0$ is capped at 5. Similarly, if sum_absolute_levelMinus1 is greater than 3, the values of $c_1$ and $c_2$ are capped at 4. Thus, instead of storing absolute level values for each coefficient, it is adequate to truncate the absolute level values to three bits while producing identical values for $c_0$, $C_1$ and $c_2$. Hence, in accordance with the techniques of this disclosure, instead of storing absolute values for each coefficient, entropy encoding unit 116 may clip (e.g., truncate) the absolute values of coefficients to 7 (3 bits) while producing identical values for $c_0$, $c_1$ and $c_2$. Furthermore, in some examples, entropy encoding unit 116 may clip the absolute values of coefficients to 3 (2 bits). In this way, entropy encoding unit 116 may clip the estimated (or actual) absolute value of a non-causal coefficient to 3 (two bits) or 7 (three bits), truncate the estimated absolute value of the causal coefficient to 3 (two bits) or 7 (three bits), and select, based at least in part on the clipped estimated (or actual) absolute values of the non-causal and causal coefficients, a coding context for a syntax element. However, in examples where entropy encoding unit 116 clips the absolute values of coefficients to 3 (2 bits), the values of $c_0$, $c_1$ and $c_2$ may be affected.

In some examples, entropy encoding unit 116 may encode coefficient syntax elements of multiple coefficients of a sub-block during a single coding pass. Entropy encoding unit 116 may accomplish this in various ways. According to a first example approach, entropy encoding unit 116 may, within each coding pass, process up to n consecutive coefficients in parallel, where n is a number greater than zero. For instance, entropy encoding unit 116 may process up to four consecutive coefficients in parallel. If entropy encoding unit 116 is currently processing a current coefficient, entropy encoding unit 116 may not access a syntax element associated with another coefficient if the syntax element is associated with the current coding pass, the other coefficient is a member of the group of n consecutive coefficients, and the other coefficient and the current coefficient are within the same sub-block. In other words, a restriction is imposed that context derivation for the current coefficient may not depend on information from other coefficients for which parallel context derivation is desired. Preventing entropy encoding unit 116 from accessing the syntax element in such conditions may facilitate parallelism. In accordance with one or more techniques of this disclosure, the concepts of "holes" and "partial holes" are used to enable parallel context derivation for multiple bins.

A causal coefficient may be referred to as a "hole" when entropy encoding unit 116 is unable to use the current-priority syntax element of the coefficient to select a context for coding the current-priority syntax element of the current coefficient. A current-priority syntax element is the syntax element processed during the coding pass that entropy encoding unit 116 is currently performing. In some examples, the position of a hole is never outside the 4×4 sub-block that contains the current coefficient.

Because entropy encoding unit 116 does not access current-priority syntax elements of holes, entropy encoding unit 116 may be unable to use the current-priority syntax elements of holes to determine actual or estimated absolute values of the holes. Because entropy encoding unit 116 may be unable to determine the actual absolute values of the holes, entropy encoding unit 116 may be unable to use the actual absolute values of the holes to select a context for CABAC or Golomb-Rice coding a syntax element of the current coefficient. FIGS. 10A-10G, discussed in detail below, illustrate example positions of holes in context neighborhoods of coefficients in a 4×4 sub-block when an entropy coding unit, such as entropy encoding unit 116, processes four coefficients in parallel during a coding pass.

Accordingly, entropy encoding unit 116 may determine estimated (or actual) absolute values for the holes. In some examples, entropy encoding unit 116 may always determine that the absolute values of holes are equal to zero or another pre-defined value. In other words, entropy encoding unit 116 may determine the absolute value of the causal coefficient to be equal to a predefined value. For instance, entropy encoding unit 116 may use a fixed absolute level value for hole positions. Furthermore, in this example, if entropy encoding unit 116 uses four-bin parallelism for a 4×4 sub-block scan, holes are introduces such that if any of the previous three coefficients in the scan order from the same sub-block belongs to a context neighborhood of a current coefficient, the previous three coefficients are assumed to have absolute values of 0 for context derivation purposes.

In another example, instead of assuming that the coefficient at a hole is insignificant (i.e., equal to 0), entropy encoding unit 116 may use an absolute level value for another coefficient. That is, when entropy encoding unit 116 is selecting a coding context for a coefficient syntax element of a particular coefficient, entropy encoding unit 116 may use the actual or estimated absolute value of another coefficient as the absolute value of a hole in the context neighborhood of the particular coefficient. This other coefficient may be within the context neighborhood of the particular coefficient. In other examples, entropy encoding unit 116 may modify the context neighborhood of the particular coefficient to exclude the hole and include the other coefficient that is outside the original context neighborhood. In some examples, the other coefficient may be the coefficient to the right of the hole. Thus, for context derivation, the coefficient on the right is counted twice.

In others example, entropy encoding unit 116 may determine an absolute value for a hole based at least in part on higher-priority syntax elements of the hole. In such examples, the hole may be referred to as a "partial hole." Furthermore, in such examples, entropy encoding unit 116 may determine an absolute value for a hole as though the current- and lower-priority coefficient syntax elements of the hole are equal to 0. For example, if entropy encoding unit 116 is selecting a coding context for a gr2Flag of a particular coefficient, entropy encoding unit 116 may determine an absolute value of a hole in the context neighborhood of the particular coefficient based on a sigMapFlag and, if present, a gr1Flag of the hole. Furthermore, in this example, if entropy encoding unit 116 is encoding a gr2Flag of a particular coefficient, entropy encoding unit 116 may determine the absolute value of the hole as though the gr2Flag and the levelRem of the hole are equal to 0.

In another example where entropy encoding unit 116 determines an absolute value for a hole based on higher-priority coefficient syntax elements of the hole, entropy encoding unit 116 may determine the absolute value of the hole based in part on a current-priority coefficient syntax element of a coefficient adjacent to (e.g., to the right of) the hole. In other words, entropy encoding unit 116 may determine the absolute value of a causal coefficient to be equal to an absolute value of a coefficient adjacent to the causal coefficient. For example, if entropy encoding unit 116 is encoding a gr2Flag of a particular coefficient, entropy encoding unit 116 may determine an absolute value of a hole in the context neighborhood of the particular coefficient based on the sigMapFlag of the hole, the gr1Flag of the hole, and a gr2Flag of a coefficient adjacent to the hole. The coefficient adjacent to the hole may be outside the context neighborhood of the particular coefficient. In some instances, the coefficient adjacent to the hole may be outside the sub-block that contains the particular coefficient.

Entropy encoding unit 116 may use the absolute values and of the coefficients in the context neighborhood of the current coefficient to select a context for CABAC or Golomb-Rice coding of a syntax element of the current coefficient. Thus, entropy encoding unit 116 may determine an absolute value of a neighboring coefficient in response to determining that the neighboring coefficient belongs to the group of n consecutive positions according to a coding order.

In other examples where entropy encoding unit 116 determines, during a coding pass, the coding contexts of n coefficient syntax elements in parallel, entropy encoding unit 116 may divide the coefficients of a sub-block into groups of n coefficients. For example, if entropy encoding unit 116 determines the coding contexts of four coefficient syntax elements in parallel, entropy encoding unit 116 may divide a sub-block into groups of four coefficients. In some instances, a group may include fewer than n coefficients. Typically, the group including fewer than n coefficients is a last group of coefficients in the sub-block. The context neighborhoods of coefficients are defined such that, for each coefficient in the sub-block, the context neighborhood of the coefficient does not include coefficients that are in the same group as the coefficient. FIGS. 11A-11F, described in detail below, are conceptual diagrams that illustrate example groups of coefficients in a 4×4 sub-block of a coefficient block.

In examples where encoding unit 116 divides the coefficients of a sub-block into groups of n coefficients as described in the previous paragraph, the context neighborhoods of coefficients may include holes. Entropy coding unit 116 may determine absolute values of holes according to any of the techniques described above. For example, when entropy coding unit 116 is selecting a coding context for a coefficient syntax element of a particular coefficient, entropy coding unit 116 may determine an absolute value of a hole based on an actual or estimated absolute value of another coefficient that may, or may not be, in the context neighborhood of the particular coefficient. That is, the context neighborhood may be modified to include a coefficient that was not originally in the context neighborhood of the particular coefficient. In another example, when entropy encoding unit 116 is selecting a coding context for a coefficient syntax element of a particular coefficient, entropy coding unit 116 may determine an absolute value of a hole based on higher-priority coefficient syntax elements of the hole and the current- and lower-priority coefficient syntax elements of the hole assumed to be equal to 0.

Furthermore, in some examples where entropy encoding unit 116 divides the coefficients of a sub-block into groups of n coefficients, the context neighborhood of a coefficient may include fewer than five coefficients. In such examples, entropy encoding unit 116 may use adjusted values of sum_absolute_level, sum_absolute_level_Minus1, and num_significant_coeff to determine context indexes. For example, entropy encoding unit 116 may scale sum_absolute_level, sum_absolute_level_Minus1, and num_significant_coeff by particular scaling factors. In this example, if the context neighborhood of a particular coefficient has one hole, entropy encoding unit 116 may scale sum_absolute_level, sum_absolute_level_Minus1, and num_significant_coeff by a factor of 5/4. In some examples, entropy encoding unit 116 may use a lookup table to implement the scaling of sum_absolute_level, sum_absolute_level_Minus1, and num_significant_coeff.

Figure 12:
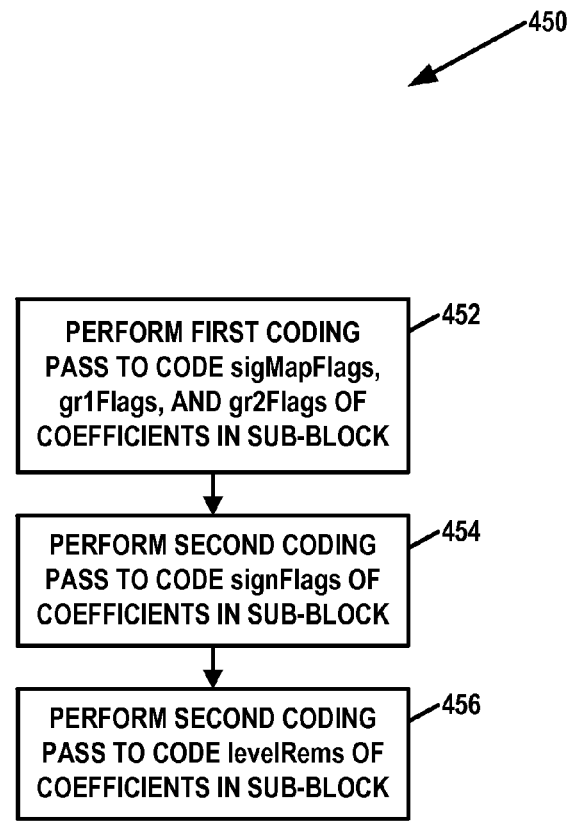
FIG. 12 is a flowchart illustrating an example operation in which a video coder codes coefficient syntax elements of a sub-block in three coding passes, in accordance with one or more techniques of this disclosure.

In other examples, entropy encoding unit 116 divides each sub-block of a coefficient block into groups of coefficients. In some examples, each of the groups of coefficients may include n coefficients, except possibly a last group of coefficients. FIG. 12, described in detail below, is a conceptual diagram that illustrates another example grouping of coefficients within a 4×4 sub-block of a coefficient block. In such examples, entropy encoding unit 116 processes all coefficient syntax elements of coefficients within a group before processing any coefficient syntax element of a coefficient in a next group. That is, instead of performing one coding pass for the entire sub-block before performing a next coding pass for the entire sub-block, entropy encoding unit 116 may perform all five coding passes for a group of coefficients in the sub-block before performing the five coding passes for a next group of coefficients in the sub-block. Thus, within a group, entropy encoding unit 116 performs all five coding passes.

In the example of the previous paragraph, entropy encoding unit 116 may determine absolute values of holes in context neighborhoods of coefficients in the same manner as described in the examples above. However, in the example of the previous paragraph, entropy encoding unit 116 may be able to determine actual absolute values of more coefficients as opposed to estimated absolute values of coefficients.

In some examples, the coding contexts available for entropy coding a coefficient syntax element may be divided into context sets. Each of the context sets may include a plurality of coding contexts. To select a coding context for a particular syntax element, entropy encoding unit 116 may determine a context set index for the particular coefficient syntax element and determine a context index for the particular coefficient syntax element. The determined context index indicates a coding context in a context set indicated by the determined context set index.

In one example, entropy encoding unit 116 uses position-based context modeling for sigMapFlags of coefficients in 4×4 and 8×8 TUs. In position-based context modeling, entropy encoding unit 116 selects a coding context for a particular coefficient based, at least in part, on a position of the particular coefficient within a coefficient block. In this example, context indexes for sigMapFlags are defined in a set of tables. The tables may correspond to different context sets. There may be three tables, one for 4×4 luma coefficient blocks, one for 4×4 chroma coefficient blocks, and one for 8×8 luma or chroma coefficient blocks. Luma coefficient blocks are coefficient blocks derived from luma sample blocks. Chroma coefficient blocks are coefficient blocks derived from chroma sample blocks. Furthermore, entropy encoding unit 116 may use a mixture of position-based context modeling and template-based context modeling for larger coefficient blocks, such as 16×16 and 32×32 coefficient blocks. For coefficients in such larger coefficient blocks, entropy encoding unit 116 may use a single coding context for sigMapFlags of coefficients that are at higher frequencies (i.e., coefficients that are closer to the bottom right corner of the coefficient block). For other coefficients in such larger coefficient blocks, entropy encoding unit 116 may select a coding context based on whether coefficients in context neighborhoods of the coefficients are equal to 0. In other words, entropy encoding unit 116 may use the significances of coefficients in a context neighborhood of a particular low-frequency coefficient to determine a coding context for a sigMapFlag of the particular coefficient.

In one example, entropy encoding unit 116 uses four context sets for entropy encoding gr1Flags of coefficients in luma coefficient blocks and uses two context sets for entropy encoding gr1Flags of coefficients in chroma coefficient blocks. In this example, entropy encoding unit 116 may determine, based on a location of a particular coefficient within a coefficient block and also based on a number (numGreater1) of gr1Flags that are equal to 1 in a previously-coded group of coefficients, a context set index for a gr1Flag of the particular coefficient. In this example, entropy encoding unit 116 may determine a context index (ctxIdx_level_greater1) within a context set based on the number of trailing ones (i.e., gr1Flags equal to 0) in the context neighborhood of the particular coefficient, with a maximum of three. For instance, entropy encoding unit 116 may determine the context index as:

$$ctxIdx\_level\_greater1 = (ctxSet*4) + \min(3, \text{number of trailing ones})$$

In some examples, entropy encoding unit 116 uses four context sets for entropy encoding gr2Flags of coefficients in luma coefficient blocks and uses two context sets for entropy encoding gr1Flags of coefficients in chroma coefficient blocks. Entropy encoding unit 116 may determine, based on the location of a particular coefficient within a coefficient block and the number (numGreater1) of gr1Flags being equal to 1 in a previously-coded group of coefficients, a context set index for a gr2Flag of the particular coefficient. The context index of the gr2Flag may be equal to the context set index for the gr2Flag.

In another example, there are three context sets for entropy coding coefficient syntax elements for luma coefficient blocks and two context sets for entropy coding coefficient syntax elements for chroma coefficient blocks. In this example, there are six coding contexts in each of the context sets for entropy encoding sigMapFlags. In other words, for a sigMapFlag of a coefficient of a luma coefficient block, there may be three context sets, each including six coding contexts. For a sigMapFlag of a coefficient of a chroma coefficient block, there may be two context sets, each including six coding contexts. Furthermore, in this example, there are five coding contexts in each of the context sets for entropy encoding gr1Flags and gr2Flags.

In the example of the previous paragraph, entropy encoding unit 116 may determine, based on a position within a coefficient block of a particular coefficient, a context set index (ctx_set_idx) that indicates a context set that includes a selected coding context for entropy encoding a coefficient syntax element of the particular coefficient. In this example, entropy encoding unit 116 may determine the context set index as:

$$\text{ctx\_set\_idx} = (posX<2 \ \&\&\ posY<2)?0:(LUMA? ((posX<4 \ \&\&\ posY<4)?1:2):1$$

In the equation above, posX and posY indicate the column and row, respectively, within the coefficient block of the particular coefficient. In the equation above, ctx_set_idx is equal to 0 if posX is less than 2 and posY is less than 2. Furthermore, in the equation above, ctx_set_idx is equal to 1 if posX is not less than 2 or posY is not less than 2 and the coefficient block is not a luma coefficient block. In the equation above, ctx_set_idx is equal to 1 if either posX or posY is not less than 2, the coefficient block is a luma coefficient block, and both posX and posY are less than 4. In the equation above, ctx_set_idx is equal to 2 if the coefficient block is a luma coefficient block, and either posX or posY is not less than 4. In this example, entropy encoding unit 116 may determine the context index in accordance with one or more of the examples described elsewhere in this disclosure.

In another example of how entropy encoding unit 116 may use context sets, there may be three context sets of entropy coding coefficient syntax elements for luma coefficient blocks. Furthermore, in this example there may be two context sets for encoding sigMapFlags of coefficients in chroma coefficient blocks and there may be one context set for encoding gr1Flags and gr2Flags of coefficients in chroma coefficient blocks. Each of the context sets for encoding sigMapFlags of coefficients in luma and chroma coefficient blocks may include six coding contexts. Each of the context sets for encoding gr1Flags and gr2Flags of coefficients in luma and chroma coefficient blocks may include five coding contexts. In this example, entropy encoding unit 116 may determine a context set index (ctx_set_idx) for a coefficient syntax element of a luma coefficient block using the following equation:

$$\text{ctx\_set\_idx} = (posX<4 \ \&\&\ posY<4)?((posX<2 \ \&\&\ posY<2)?2:1):0$$

In the equation above, posX and posY indicate the column and row, respectively, within the coefficient block of the particular coefficient. Furthermore, in the equation above, ctx_set_idx is equal to 0 if either posX or posY is not less than 4. In the equation above, ctx_set_idx is equal to 1 if both posX and posY are less than 4 and either posX or posY is not less than 2. In the equation above, ctx_set_idx is equal to 2 if both posX and posY are less than 2.

In the example of the previous paragraph, entropy encoding unit 116 may determine a context set index (ctx_set_idx) for sigMapFlags of coefficients of chroma coefficient blocks using the following equation:

$$\text{ctx\_set\_idx} = (posX<2 \ \&\&\ posY<2)?1:0$$

In the equation above, posX and posY indicate the column and row, respectively, within the coefficient block of the particular coefficient. Furthermore, in the equation above, ctx_set_idx is equal to 1 if both posX and posY are less than 2. ctx_set_idx is equal to 0 if either posX or posY is greater than or equal to 2. In this example, entropy encoding unit 116 may determine the context index in accordance with one or more of the examples described elsewhere in this disclosure.

Figure 6:
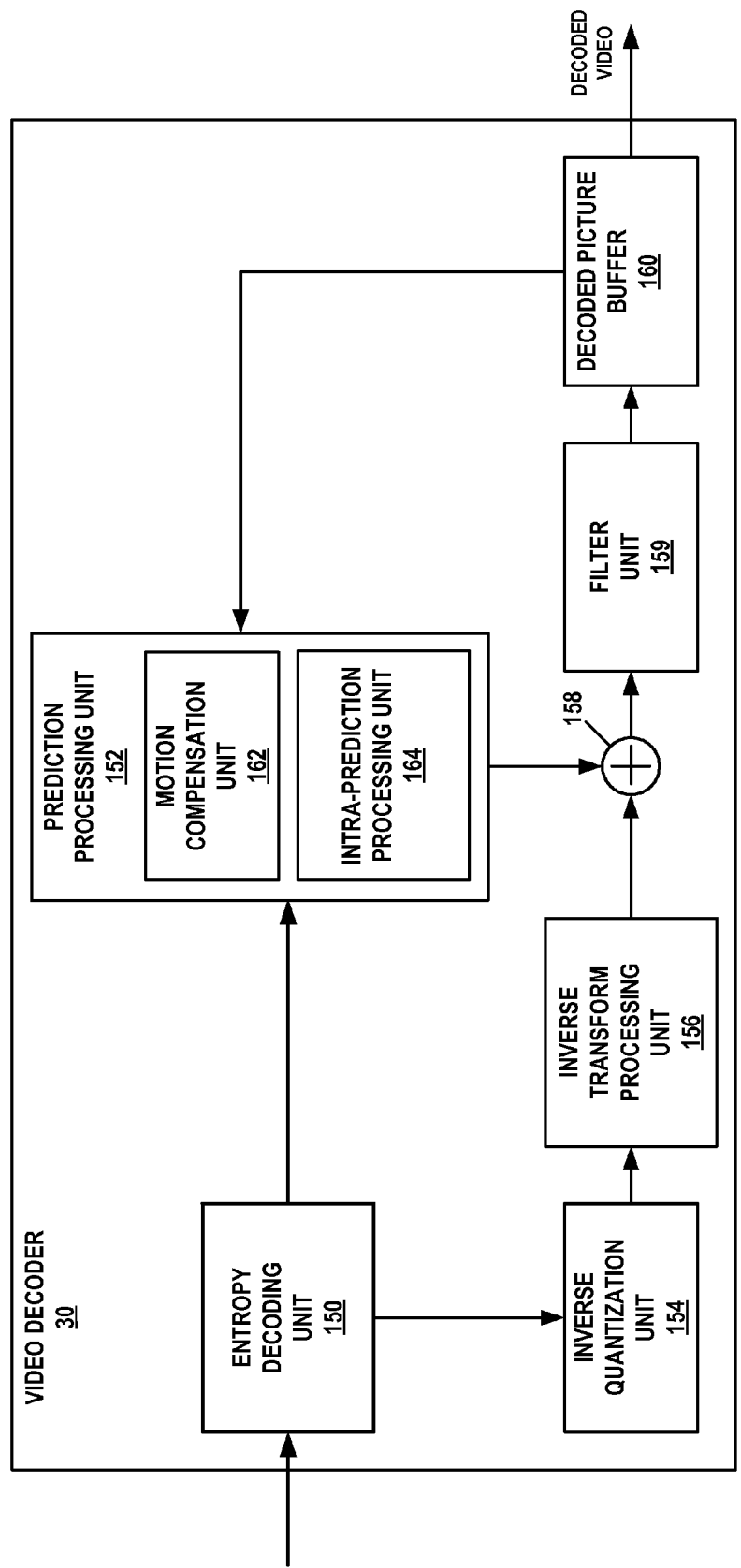
FIG. 6 is a block diagram illustrating an example video decoder that may implement the techniques described in this disclosure.

FIG. 6 is a block diagram illustrating an example video decoder 30 that is configured to implement the techniques of this disclosure. FIG. 6 is provided for purposes of explanation and is not limiting on the techniques as broadly exemplified and described in this disclosure. For purposes of explanation, this disclosure describes video decoder 30 in the context of HEVC coding. However, the techniques of this disclosure may be applicable to other coding standards or methods.

In the example of FIG. 6, video decoder 30 includes an entropy decoding unit 150, a prediction processing unit 152, an inverse quantization unit 154, an inverse transform processing unit 156, a reconstruction unit 158, a filter unit 159, and a decoded picture buffer 160. Prediction processing unit 152 includes a motion compensation unit 162 and an intra-prediction processing unit 164. In other examples, video decoder 30 may include more, fewer, or different functional components.

Video decoder 30 receives a bitstream. Entropy decoding unit 150 may parse the bitstream to extract syntax elements from the bitstream. Prediction processing unit 152, inverse quantization unit 154, inverse transform processing unit 156, reconstruction unit 158, and filter unit 159 may generate decoded video data based on the syntax elements extracted from the bitstream.

As part of parsing the bitstream, entropy decoding unit 150 may entropy decode entropy-encoded syntax elements in the bitstream. For instance, entropy decoding unit 150 may perform regular CABAC decoding on some syntax elements, such as sigMapFlags, gr1Flags, and gr2Flags of coefficients in coefficient blocks. Moreover, entropy decoding unit 150 may perform bypass entropy decoding on other syntax elements, such as signFlags and levelRems of coefficients in coefficient blocks.

When entropy decoding unit 150 performs regular CABAC decoding on a coefficient syntax element, such as a sigMapFlag, a gr1Flag, or a gr2Flag, entropy decoding unit 150 may select a coding context for the coefficient syntax element. Entropy decoding unit 150 may select a coding context for a coefficient syntax element in accordance with any of the examples, and others, described above with regard to entropy encoding unit 116 selecting the coefficient syntax element.

In addition, video decoder 30 may perform a reconstruction operation on a non-partitioned CU. To perform the reconstruction operation on a non-partitioned CU, video decoder 30 may perform a reconstruction operation on each TU of the CU. By performing the reconstruction operation for each TU of the CU, video decoder 30 may reconstruct residual sample block associated with the CU.

As part of performing a reconstruction operation on a TU of a CU, inverse quantization unit 154 may inverse quantize, i.e., de-quantize, coefficient blocks associated with the TU. Inverse quantization unit 154 may use a QP value associated with the CU of the TU to determine a degree of quantization and, likewise, a degree of inverse quantization for inverse quantization unit 154 to apply.

After inverse quantization unit 154 inverse quantizes a coefficient block, inverse transform processing unit 156 may apply one or more inverse transforms to the coefficient block in order to generate a residual sample block associated with the TU. For example, inverse transform processing unit 156 may apply an inverse DCT, an inverse integer transform, an inverse Karhunen-Loeve transform (KLT), an inverse rotational transform, an inverse directional transform, or another inverse transform to the coefficient block.

If a PU is encoded using intra prediction, intra-prediction processing unit 164 may perform intra prediction to generate a predictive sample block for the PU. Intra-prediction processing unit 164 may use an intra prediction mode to generate the predictive sample blocks for the PU based on the sample blocks of spatially-neighboring PUs. Intra-prediction processing unit 164 may determine the intra prediction mode for the PU based on one or more syntax elements parsed from the bitstream.

Motion compensation unit 162 may construct a first reference picture list (list 0) and a second reference picture list (list 1) based on syntax elements extracted from the bitstream. Furthermore, if a PU is encoded using inter prediction, entropy decoding unit 150 may extract motion information for the PU. Motion compensation unit 162 may determine, based on the motion information of the PU, one or more reference blocks for the PU. Motion compensation unit 162 may generate, based on the one or more reference blocks for the PU, predictive sample blocks for the PU.

Reconstruction unit 158 may use the residual sample blocks associated with TUs of a CU and the predictive sample blocks of the PUs of the CU, i.e., either intra-prediction data or inter-prediction data, as applicable, to reconstruct the sample blocks of the CU. In particular, reconstruction unit 158 may add samples of the residual sample blocks to corresponding samples of the predictive sample blocks to reconstruct the sample blocks of the CU.

Filter unit 159 may perform a deblocking operation to reduce blocking artifacts associated with the sample blocks of the CUs of a CTB. Video decoder 30 may store the sample blocks of the CU in decoded picture buffer 160. Decoded picture buffer 160 may provide reference pictures for subsequent motion compensation, intra prediction, and presentation on a display device, such as display device 32 of FIG. 1. For instance, video decoder 30 may perform, based on the sample blocks in decoded picture buffer 160, intra prediction or inter prediction operations on PUs of other CUs.

Figure 7:
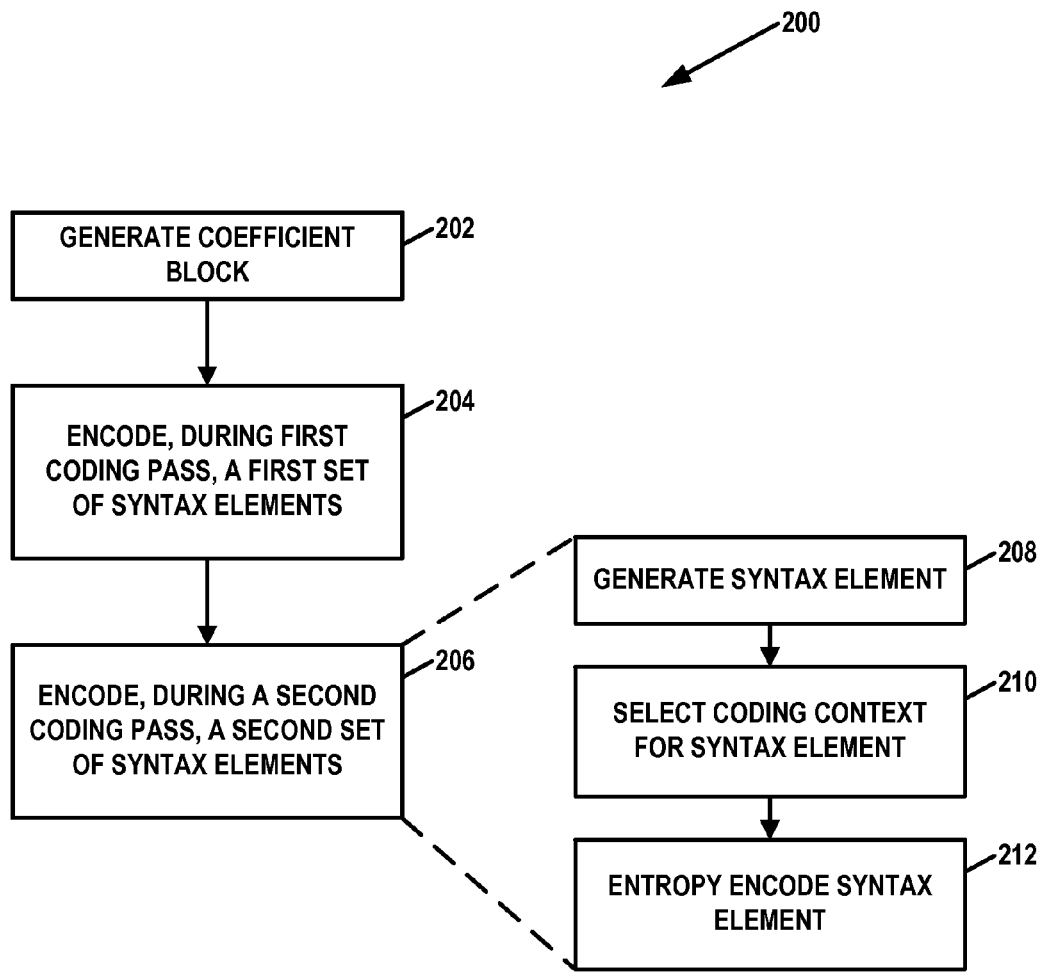
FIG. 7 is a flowchart illustrating an example operation of a video encoder for encoding video data, in accordance with one or more techniques of this disclosure.

FIG. 7 is a flowchart illustrating an example operation 200 of video encoder 20 for encoding video data, in accordance with one or more techniques of this disclosure. FIG. 7 is provided as an example. In other examples, the techniques of this disclosure may be implemented using more, fewer, or different steps than those shown in the example of FIG. 7.

In the example of FIG. 7, transform processing unit 104 may generate, based on a residual sample block, a coefficient block (202). As described above, transform processing unit 104 may generate the coefficient block by applying one or more transforms, such as a discrete cosine transform, to the residual sample block. In certain cases, transform processing unit 104 does not apply a transform to the residual sample block, but rather may skip application of the transform. Although not shown in the example of FIG. 7, quantization unit 106 may quantize coefficients in the coefficient block.

Entropy encoding unit 116 may encode, during a first coding pass of coefficients of the coefficient block, a first set of syntax elements that correspond to coefficients of the coefficient block (204). For example, entropy encoding unit 116 may perform a coding pass of coefficients in a sub-block of the coefficient block to encode sigMapFlags, gr1Flags, gr2Flags, signFlags, and levelRems of the coefficients in the sub-block. When entropy encoding unit 116 encodes the first set of syntax elements, entropy encoding unit 116 may, for each coefficient in the sub-block, generate a coefficient syntax element. If the coefficient syntax element is context coded, entropy encoding unit 116 may select a coding context for the coefficient syntax element and use the selected entropy coding context to entropy encode the coefficient syntax element. Otherwise, entropy encoding unit 116 may bypass encode the coefficient syntax element.

Furthermore, entropy encoding unit 116 may encode, during a second coding pass of the coefficients of the coefficient block, a second set of syntax elements that correspond to coefficients of the coefficient block (206). For example, entropy encoding unit 116 may encode sigMapFlags during the first coding pass and may encode gr1Flags during the second coding pass.

When entropy encoding unit 116 encodes a syntax element during the second coding pass, entropy encoding unit 116 may generate the syntax element (208). The syntax element may be in the second set of syntax elements and may correspond to a current coefficient of the coefficient block. Furthermore, entropy encoding unit 116 selects a coding context for the syntax element (210). In accordance with the techniques of this disclosure, entropy encoding unit 116 may select the coding context for the syntax element based at least in part on a second syntax element and a third syntax element. The second syntax element may be in the first set of syntax elements and may correspond to a non-causal coefficient. For instance, the second syntax element may be a higher-priority syntax element of the non-causal coefficient. The third syntax element is in the second set of syntax elements and corresponds to a causal coefficient. For example, if the first syntax element is a gr2Flag, the second syntax element may be a gr1Flag or a sigMapFlag and the third syntax element may be a gr2Flag. The non-causal coefficient occurs after the current coefficient in a coding order of the current (e.g., second) coding pass. The causal coefficient occurs before the current coefficient in the coding order.

After selecting the coding context for the syntax element, entropy encoding unit 116 may entropy encode, based at least in part on the coding context selected for the first syntax element, the syntax element (212). For example, entropy encoding unit 116 may encode the syntax element using regular CABAC encoding.

Figure 8:
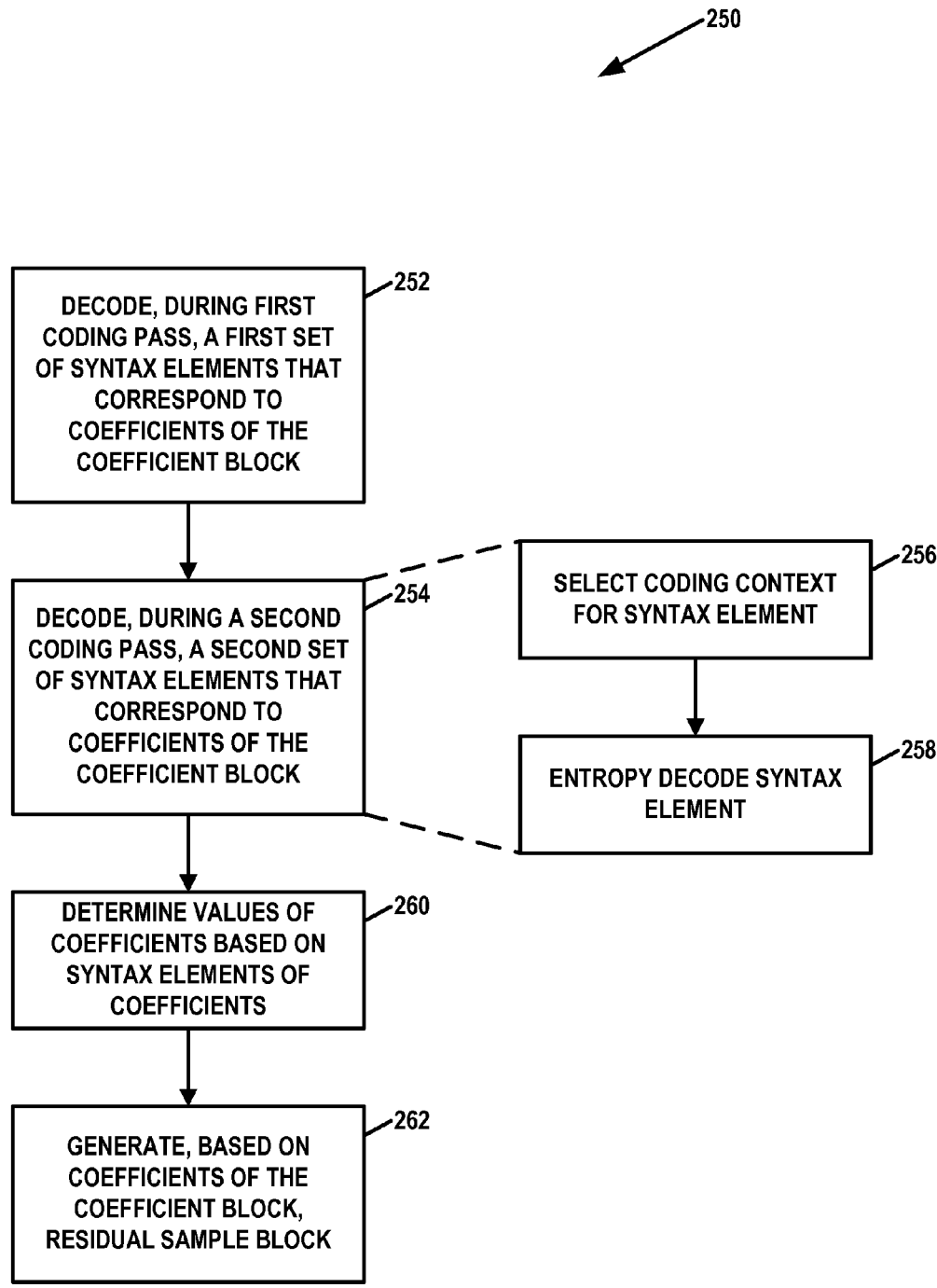
FIG. 8 is a flowchart illustrating an example operation of a video decoder for decoding video data, in accordance with one or more techniques of this disclosure.

FIG. 8 is a flowchart illustrating an example operation 250 of video decoder 30 for decoding video data, in accordance with one or more techniques of this disclosure. As illustrated in the example of FIG. 8, entropy decoding unit 150 decodes, during a first coding pass of coefficients of a coefficient block, a first set of syntax elements that correspond to coefficients of the coefficient block (252). In addition, entropy decoding unit 150 decodes, during a second coding pass of the coefficients of the coefficient block, a second set of syntax elements that correspond to coefficients of the coefficient block (254).

When entropy decoding unit 150 decodes a current syntax element during the second coding pass, entropy decoding unit 150 may select, based at least in part on a second syntax element and a third syntax element, a coding context for the first syntax element (256). The second syntax element is in the first set of syntax elements and corresponds to a non-causal coefficient. The third syntax element is in the second set of syntax elements and corresponds to a causal coefficient. The non-causal coefficient occurs after the current coefficient in a coding order of the current (second) coding pass. The causal coefficient occurs before the current coefficient in the coding order. After selecting the coding context for the current syntax element, entropy decoding unit 150 may entropy decode, based at least in part on the coding context selected for the current syntax element, the current syntax element (258). For example, entropy decoding unit 150 may decode the current syntax element using regular CABAC decoding.

Entropy decoding unit 150 may determine, based at least in part on the first and second sets of syntax elements the coefficients, the values of the coefficients in the coefficient block (260). Inverse quantization unit 154 and inverse transform processing unit 156 may generate, based on the coefficients of the coefficient block, a residual sample block (262). Subsequently, reconstruction unit 158 may add samples in the residual sample block may be added to corresponding samples in a predictive sample block to reconstruct a sample block of a PU.

Figure 9A:
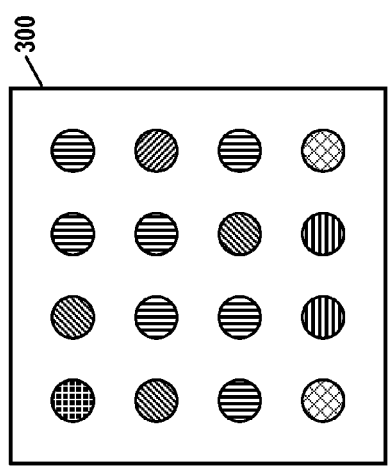
FIG. 9A is a conceptual diagram illustrating an example 4×4 sub-block.

FIG. 9A is a conceptual diagram that illustrates an example 4×4 sub-block 300. FIGS. 9B-9G are conceptual diagrams that illustrate example holes in context neighborhoods of coefficients in sub-block 300 of FIG. 9A. Circles in FIGS. 9A-9G correspond to coefficients in the sub-block. Circles in FIG. 9A have various types of cross-hatching. The type of cross-hatching of a circle in FIG. 9A indicates which context neighborhood in FIGS. 9B-9G is applicable to the coefficient that corresponds to the circle. For example, circles in FIG. 9A with horizontal cross-hatching have context neighborhoods of the type shown in FIG. 9B. Circles in FIG. 9A with vertical cross-hatching have context neighborhoods of the type shown in FIG. 9C. Circles in FIG. 9A with down-right diagonal cross-hatching have context neighborhoods of the type shown in FIG. 9D. Circles in FIG. 9A with up-right diagonal cross-hatching have context neighborhoods of the type shown in FIG. 9E. Circles in FIG. 9A with grid cross-hatching have context neighborhoods of the type shown in FIG. 9F. Circles in FIG. 9A with diagonal cross cross-hatching have context neighborhoods of the type shown in FIG. 9G.

Figure 9G:
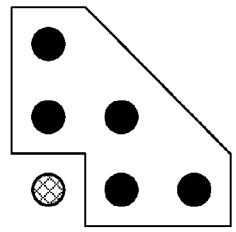
FIGS. 9B-9G are conceptual diagrams illustrating example holes in context neighborhoods of coefficients in the sub-block of FIG. 9A.
Figure 9F:
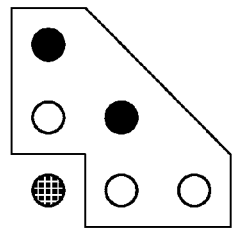
Figure 9E:
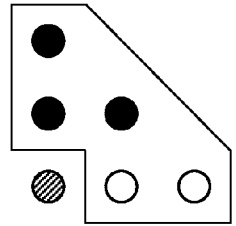
Figure 9D:
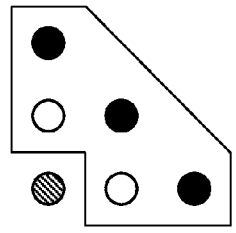
Figure 9C:
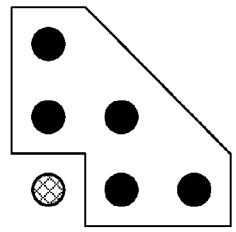
Figure 9B:
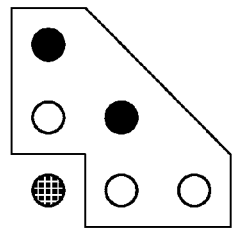

In FIGS. 9B-9G, white-filled circles correspond to holes and black-filled circles correspond to coefficients that are not holes. In some examples, an entropy coding unit (such as entropy encoding unit 116 or entropy decoding unit 150) may be unable to access the current-priority coefficient syntax elements of "holes" because the entropy coding unit may be processing the holes in parallel with the current coefficient. As shown in FIG. 9G, for circles in FIG. 9A with diagonal cross cross-hatching, no holes are used. The positions of holes may not be outside the current 4×4 sub-block because the coefficients outside the current 4×4 sub-block may belong to a previous chunk and all the coefficient syntax elements of that chunk are available. In the example of FIGS. 9A-9G, it is assumed that the entropy coding unit encodes four coefficients in parallel during a coding pass. Although the example of FIGS. 9A-9G assume 4-bin parallelism, similar techniques may be used to enable n-bin parallelism, where $n \geq 1$.

Although FIGS. 9A-9E have described the use of holes with respect to a 4×4 sub-block coding order, an entropy coding unit may apply the holes to other coding orders, such as horizontal, vertical, etc. Thus, in general, to enable parallel context derivation for n bins, if the context neighborhood for a coefficient contains any of the previous (n−1) coefficients in the coding order belonging to the same sub-block as the current coefficient, the previous (n−1) coefficient are replaced by holes or other coefficients as described above. One advantage of the use of holes is that if the entropy coding unit is designed for n-bin parallelism, the entropy coding unit can be used for m-bin parallelism as long as m≤n. No redesign of context neighborhoods may be necessary to account for the difference between designed and implemented degrees of parallelism.

Figure 10A:
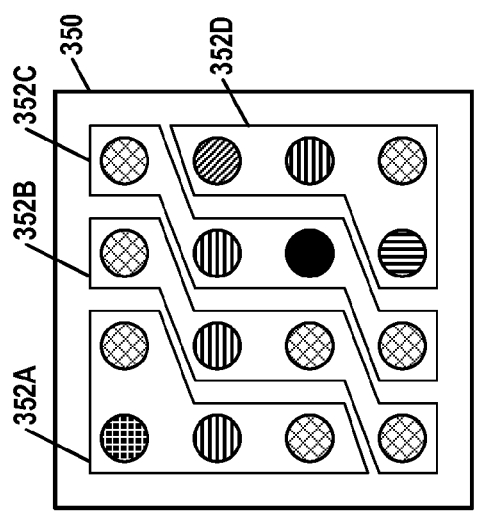
FIGS. 10A-10F are conceptual diagrams illustrating example groups of coefficients in a 4×4 sub-block of a coefficient block.
Figure 10F:
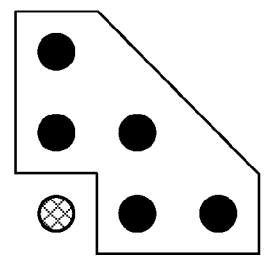
Figure 10E:
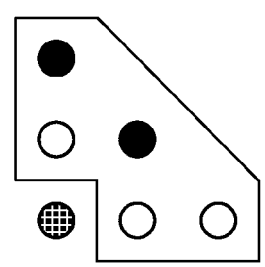
Figure 10D:
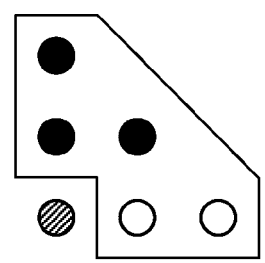
Figure 10C:
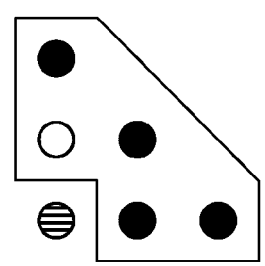
Figure 10B:
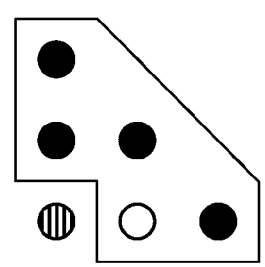

FIGS. 10A-10F, described in detail below, are conceptual diagrams that illustrate example groups of coefficients in a 4×4 sub-block 350 of a coefficient block. Circles in FIGS. 10A-10F correspond to coefficients in the sub-block. In FIG. 10A, shapes 352A-352D surrounding coefficients indicate example groups of coefficients. In the example of FIGS. 10A-10F, it is assumed that an entropy coding unit (e.g., entropy encoding unit 116 or entropy decoding unit 150) processes four coefficients of sub-block 350 in parallel. Although the examples of FIGS. 10A-10F assume 4-bin parallelism, the example of FIGS. 10A-10F may be modified for processing other numbers of coefficients in parallel, i.e., n-bin parallelism where n is greater than 1. Furthermore, in the example of FIGS. 10A-10F, it is assumed that an entropy coding unit processes the coefficients according to a 4×4 sub-block down-left coding order. The example of FIGS. 10A-10F may be modified for other coding orders, such as a horizontal coding order, a vertical coding order, and so on.

FIGS. 10B-10F illustrate exemplary context neighborhoods for coefficients. Circles in FIG. 10A have various types of cross-hatching. The type of cross-hatching of a circle in FIG. 10A indicates which type of context neighborhood in FIGS. 10B-10F is applicable to the coefficient that corresponds to the circle. For example, circles in FIG. 10A with vertical cross-hatching have context neighborhoods of the type shown in FIG. 10B. Circles in FIG. 10A with horizontal cross-hatching have context neighborhoods of the type shown in FIG. 10C. Circles in FIG. 10A with diagonal cross-hatching have context neighborhoods of the type shown in FIG. 10D. Circles in FIG. 10A with grid cross-hatching have context neighborhoods of the type shown in FIG. 10E. Circles in FIG. 10A with diagonal crisscross cross-hatching have context neighborhoods of the type shown in FIG. 10F.

In FIGS. 10B-10F, white-filled circles correspond to holes and black-filled circles correspond to coefficients that are not holes. However, if FIGS. 10B-10F indicate that a coefficient in a context neighborhood is a hole and the coefficient is outside sub-block 350, each coefficient syntax element of the coefficient is available and an entropy coding unit may determine the actual absolute value of the coefficient based on the coefficient syntax elements of the coefficient.

In some examples, the entropy coding unit may finish all coding passes for a group of four coefficients before proceeding to a next group of coefficients. Thus, when the entropy coding unit codes the next group of coefficients, the actual absolute values for the coefficients in the initial group of coefficients are available. For example, the entropy coding unit may code a sigMapFlag, a gr1Flag, a gr2Flag, a signFlag, and a levelRem for each coefficient in group 352D before coding any coefficient syntax element in group 352C. Thus, when coding the coefficient syntax elements for the coefficients in group 352C, the actual absolute values of the coefficients in group 352D are available.

Comparing FIGS. 9A-9G with FIGS. 10A-10F, it is apparent that there are more coefficients that have context neighborhoods with no holes in FIGS. 10A-10F. However, in the example of FIGS. 10A-10F, if the groups include n coefficients, m-bin parallelism (i.e., the ability to process m coefficient syntax elements in parallel) may only be possible if m is less than or equal to n and m is divisible by n. For example, if the groups each include four coefficients, an entropy coding unit may only process four or two coefficient syntax elements in parallel.

Figure 11:
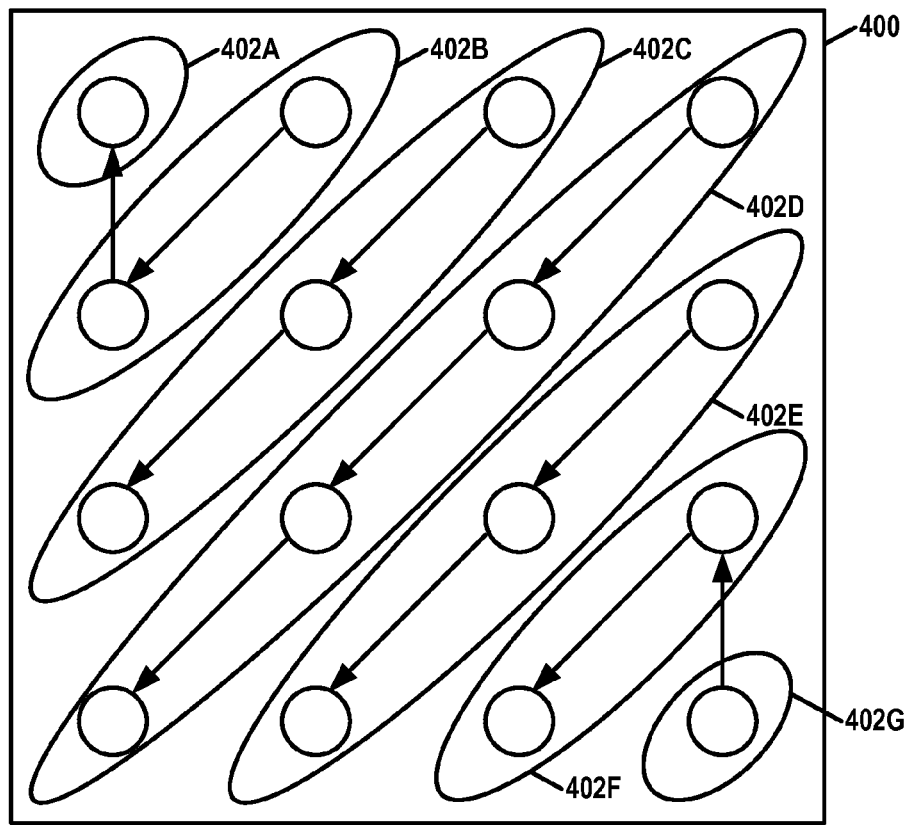
FIG. 11 is a conceptual diagram illustrating another example grouping of coefficients within a 4×4 sub-block of a coefficient block.

FIG. 11 is a conceptual diagram illustrating another example grouping of coefficients within a 4×4 sub-block 400 of a coefficient block. In the example of FIG. 11, each circle corresponds to a coefficient in sub-block 400. Ovals 402A-402G indicate groups of coefficients within sub-block 400. Unlike the example of FIGS. 10A-10G described above, in the example of FIG. 11, an entropy coding unit such as entropy encoding unit 116 or entropy decoding unit 150 may perform all five coding passes on a group of coefficients before performing any coding passes on a coefficient of a next group of coefficients. For this reason, when the entropy coding unit selects coding contexts for coefficient syntax elements in a group, the entropy coding unit may determine actual absolute values of coefficients in previously-processed groups.

In addition to the drawbacks of the proposal of JCTVC-H0228 described above, the proposal of JCTVC-H0228 may require a video coder to interleave coding of CABAC-coded syntax elements and bypass-coded syntax elements. This is because the proposal of JCTVC-H0228 calls for coding a sigMapFlag, a gr1Flag, a gr2Flag, a signFlag, and a levelRem for a coefficient before coding a next coefficient. Typically, sigMapFlags, gr1Flags, and gr2Flags are CABAC coded while signFlags and levelRems are bypass coded. Interleaving coding of CABAC-coded syntax elements and bypass-coded syntax elements may decrease coding efficiency. In addition, the proposal of JCTVC-H0228 may require a video coder to store entire absolute values of coefficients in a coefficient neighborhood of a particular coefficient in order to select a coding context for the particular coefficient. Storing entire absolute values of coefficients may significantly increase the storage required by the video coder.

In accordance with one or more techniques of this disclosure, to facilitate the parallelization parsing capability of by-pass coded syntax elements, each TU may be divided into one or more subsets. In some examples, each subset is coded using mainly two passes: one pass for context-coded syntax elements and another pass for bypass coded syntax elements. Context-coded syntax elements may be sigMapFlag, gr1Flag and gr2Flag and bypass coded syntax elements may be signFlag and levelRem. In the context-coded syntax elements pass, the sigMapFlag, the gr1Flag and the gr2Flag (if available) of one coefficient is encoded/decoded before proceeding to the next coefficients. SignFlag and levelRem may also be processed with separated passes. In this example, three coding passes are applied in each chunk. The two or three coding pass examples described above may also be applied to coefficients coding in an entire TU.

As mentioned previously, storage of absolute level values may be needed for context model selection of sigMapFlag, gr1Flag and gr2Flag syntax element by using the proposal of JCTVC-H0228. In the separate coding passes techniques of this disclosure, the syntax elements that have already been encoded (or decoded) can be used for context model selection. With such logic, when deriving the context model of a coefficient syntax element, the neighboring coefficients which belong to the same chunk may have the maximum level of 3 (reconstructed with already-coded context bins) and the neighboring coefficients which belong to the previous chunks could have the entire level information. For the balance between the two parts as well as to reduce the buffer size to store the entire level values for each coefficient, the stored coefficients may be truncated to a certain threshold before using the stored coefficients for context model derivation. In one example, a video coder may truncate (e.g., clip) the stored coefficients to 3, which may result in that all stored coefficients for context derivation represented with two bits and have consistent data range.

FIG. 12 is a flowchart illustrating an example operation 450 in which a video coder codes coefficient syntax elements of a sub-block in three coding passes, in accordance with one or more techniques of this disclosure. Operation 450 may resolve the drawbacks of the proposal of JCTVC-H0228 described above.

In the example of FIG. 12, an entropy coding unit (e.g., entropy encoding unit 116 or entropy decoding unit 150) may perform a first coding pass to code sigMapFlags, gr1Flags, and gr2Flags of coefficients in a sub-block of a coefficient block (452). When the entropy coding unit performs the first coding pass, the entropy coding unit may generate and CABAC code a sigMapFlag, a gr1Flag, and a gr2Flag of a coefficient before generating and CABAC coding a sigMapFlag, a gr1Flag, and a gr2Flag of a next coefficient.

After completing the first coding pass, the entropy coding unit may perform a second coding pass to code signFlags of coefficients in the sub-block (454). When the entropy coding unit performs the second coding pass, the entropy coding unit may generate and bypass code a signFlag of a coefficient before coding a signFlag of a next coefficient. Furthermore, after completing the second coding pass, the entropy coding unit may perform a third coding pass to code levelRems of coefficients in the sub-block (456). When the entropy coding unit performs the third coding pass, the entropy coding unit may generate and bypass code a levelRem of a coefficient before coding a levelRem of a next coefficient.

In an alternative example, the entropy coding unit may code both the signFlags and the levelRems of coefficients in the sub-block in a single pass. That is, the entropy coding unit may bypass code a signFlag and a levelRem of a coefficient before bypass coding a signFlag and a levelRem of a next coefficient in the sub-block. In this way, the entropy coding unit may perform two passes: one coding pass for CABAC-coded syntax elements and one coding pass for bypass-coded syntax elements. Furthermore, in other examples, the entropy coding unit may perform the three or two coding passes as described above on an entire coefficient block for a TU, as opposed to sub-blocks of a coefficient block. The use of two or three coding passes may be advantageous over the use of five coding passes because more level information (i.e., sigMapFlags, gr1Flags, and gr2Flag) of coefficients earlier in a coding order are available for selection of coding contexts. That is, compared to five separate coding passes, the advantage of two or three coding passes is that more level information (level up to 3) in the context neighborhood may be used for context derivation.

Figure 13A:
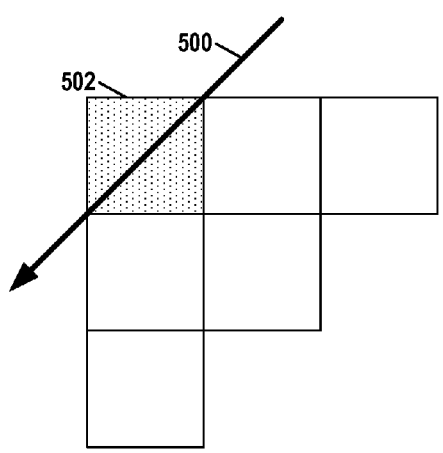
FIGS. 13A and 13B are conceptual diagrams illustrating example templates for context neighborhoods used for selecting a coding context for a sigMapFlag when coding passes are performed according to a diagonal coding order.
Figure 13B:
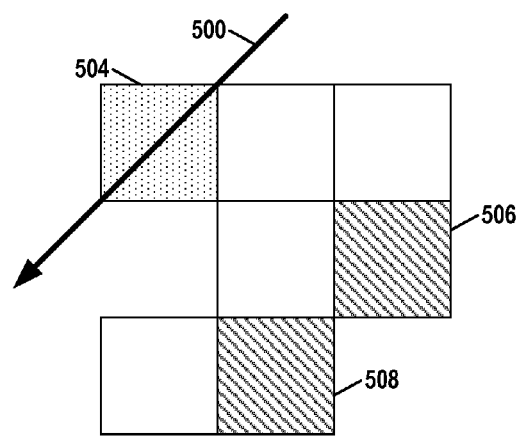
Figure 14B:
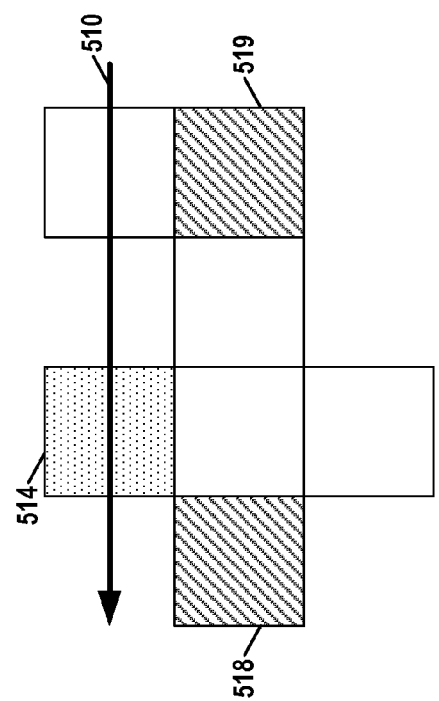
FIGS. 14A and 14B are conceptual diagrams illustrating example templates for context neighborhoods used for selecting a coding context for a sigMapFlag when coding passes are performed according to a horizontal coding order.
Figure 14A:
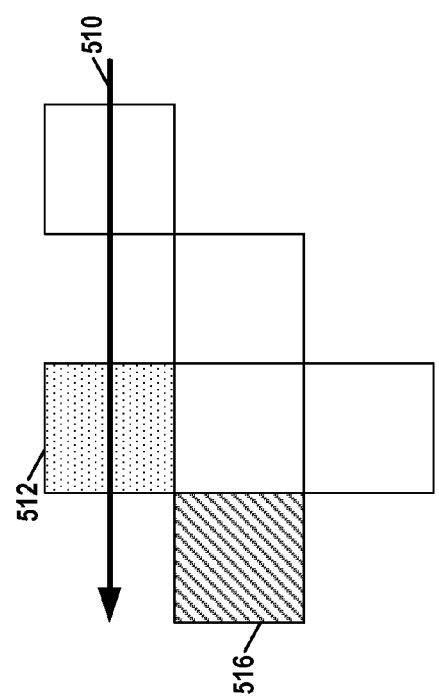
Figure 15B:
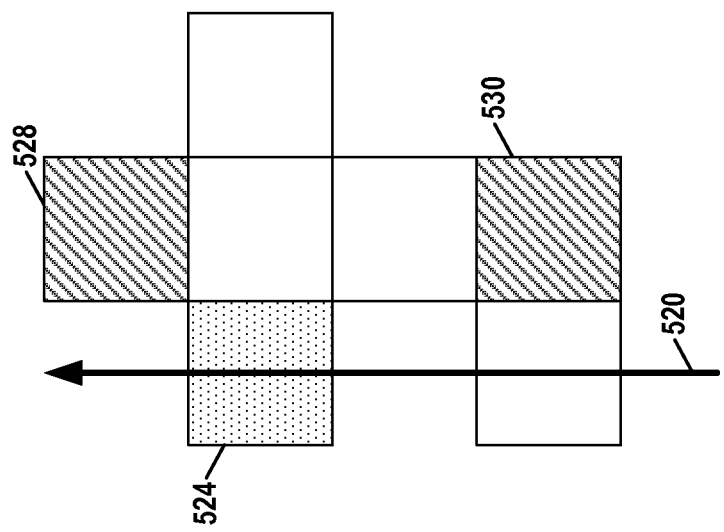
FIGS. 15A and 15B are conceptual diagrams illustrating example templates for context neighborhoods used for selecting a coding context for a sigMapFlag when coding passes are performed according to a vertical coding order.
Figure 15A:
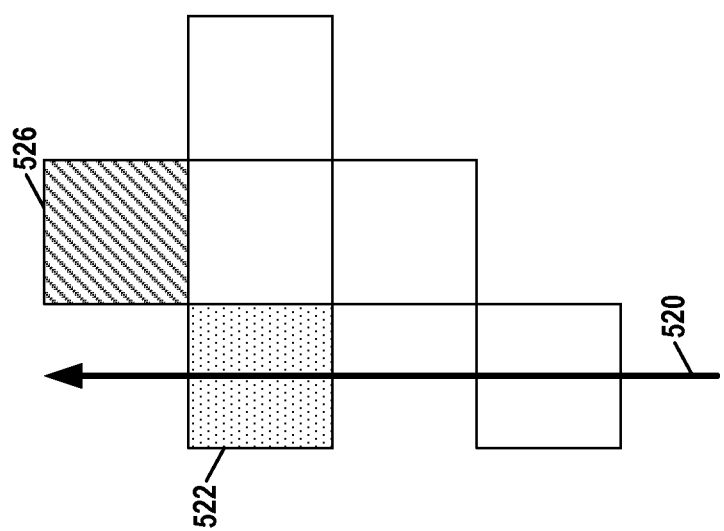

FIGS. 13A and 13B are conceptual diagrams illustrating example templates for context neighborhoods used for selecting a coding context for a sigMapFlag when coding passes are performed according to a diagonal coding order. FIGS. 14A and 14B are conceptual diagrams illustrating example templates for context neighborhoods used for selecting a coding context for a sigMapFlag when coding passes are performed according to a horizontal coding order. FIGS. 15A and 15B are conceptual diagrams illustrating example templates for context neighborhoods used for selecting a coding context for a sigMapFlag when coding passes are performed according to a vertical coding order. The templates of FIGS. 13A, 13B, 14A, 14B, 15A, and 15B may apply for TUs of any size. In the example of FIGS. 13A, 13B, 14A, 14B, 15A, and 15B, each block corresponds to a coefficient in a coefficient block. Arrows 500 in FIGS. 13A and 13B indicate the direction of the diagonal coding order. Arrows 510 in FIGS. 14A and 14B indicate the direction of the horizontal coding order. Arrows 520 in FIGS. 15A and 15B indicate the direction of the vertical coding order.

The blocks 502, 504, 512, 514, 522, and 524 in FIGS. 13A, 13B, 14A, 14B, 15A, and 15B, respectively, with dotted crosshatching indicate a current coefficient in the coefficient block. In the examples of FIGS. 13A, 13B, 14A, 14B, 15A, and 15B, an entropy coding unit (e.g., entropy encoding unit 116 or entropy decoding unit 150) may process two syntax elements (e.g., bins) in parallel. Accordingly, the templates for the context neighborhoods of coefficients avoid using a current-priority syntax element of the previous coefficient in the coding order. Instead, the templates for the context neighborhoods of some coefficients may include additional coefficients other than the previous coefficient in the coding order. In FIG. 13B, blocks 506 and 508 correspond to the additional coefficients. In another example, the block above block 506 may correspond to an additional coefficient. In FIG. 14A, block 516 corresponds to an additional coefficient. In FIG. 14B, blocks 518 and 519 correspond to additional coefficients. In FIG. 15A, block 526 corresponds to an additional coefficient. In FIG. 15B, blocks 528 and 530 correspond to additional coefficients.

If the entropy coding unit codes the coefficient block using 4×4 sub-blocks and if the (column, row) coordinates of the current coefficient within the coefficient block (with respect to the top left corner of the coefficient block) are not (0, 0) or (3, 2), the entropy coding unit may select a coding context for a sigMapFlag of the current coefficient based on sigMapFlags of the coefficients having spatial relationships to the current coefficient shown in FIG. 13A, 14A, or 15A, depending on the coding order. If the (column, row) coordinates of the current coefficient within the coefficient block are (0, 0) or (3, 2), the entropy coding unit may select a coding context for a sigMapFlag of the current coefficient based on sigMapFlags of the coefficients having spatial relationships to the current coefficient shown in FIG. 13B, 14B, or 15B, depending on the coding order. This example may be extended to sub-blocks of different sizes and (3, 2) may be replaced with the coordinates of a coefficient that is immediately above the bottom right coefficient.

In some examples where the entropy coding unit uses the context neighborhoods of FIG. 13A, 13B, 14A, 14B, 15A, or 15B, the entropy coding unit may determine, based at least in part on a total number of non-zero coefficients in the current coefficient's context neighborhood, a context index for a sigMapFlag of the current coefficient. The total number of non-zero coefficient in the current coefficient's context neighborhood may be denoted as sumOnes. In such examples, the entropy coding unit may determine a context index (ctx_idx) for selecting a coding context for a sigMap-Flag of the current coefficient using the following equation:

$$ctx\_idx = ctx\_set\_idx \times 6 + \min(sumOnes, 5)$$

In the equation above, ctx_set_idx denotes a context set index. The entropy coding unit may determine the context set index in various ways, including the ways described elsewhere in this disclosure.

In some examples, the entropy coding unit may be able to select a coding context more accurately by selecting the coding context based on all available information. For example, if the entropy coding unit is selecting a coding context for a gr1Flag, the entropy coding unit may select a coding context based on sigMapFlags and gr1Flags in a template. In this example, the entropy coding unit may also select a coding context for a gr1Flag based on actual absolute values of coefficients, if available. However, in some examples, selecting a coding context in this way may substantially increase the computational complexity of the entropy coding unit. This is because the entropy coding unit may need to update the (actual or estimated) absolute value of a coefficient for sigMapFlags, gr1Flags and gr2Flags. To reduce the computational complexity of the entropy coding unit, the entropy coding unit may re-use the information obtained from the template of a coded syntax element for the subsequent syntax element.

For example, the entropy coding unit may select the same coding context for the gr1Flag and the gr2Flag of a coefficient. In other words, coeff_abs_level_greater1_flag and coeff_abs_level_greater2_flag may use the same context for a coefficient. Furthermore, the entropy coding unit may re-use the value of sumOnes for the coefficient to determine context indexes for the coding contexts for gr1Flags and gr2Flags. In some such examples, the entropy coding unit may use the following formula to determine the context index:

$$ctx\_idx = ctx\_set\_idx \times 5 + \min(sumOnes, 4)$$

In another example, the entropy coding unit may use, without modification, a same context index that was used to select coding contexts for sigMapFlags to select coding contexts for gr1Flags and gr2Flags. Thus, in these examples, the context modeling for gr1Flags may re-use the result of the calculation for sigMapFlags, so no additional neighborhood access is needed. The context modeling for gr2Flags may re-use the context used for the corresponding gr1Flag without any extra calculation.

The following tables show test results using techniques consistent with the techniques of this disclosure related to FIGS. 13A, 13B, 14A, 14B, 15A and 15B. The proposed method is implemented on HM 6.0 and simulated under the common test conditions. The performance is compared to HM6.0 anchor in terms of Bjøntegaard Delta (BD) Bit Rate. Table 3.1 and 3.2 summarize the experimental results for QP={22, 27, 32, 37} and QP={12, 17, 22, 27}, respectively.

TABLE 3.1

Simulation results for QP = {22, 27, 32, 37}

|  | All Intra Main | | | All Intra HE10 | | |
| --- | --- | --- | --- | --- | --- | --- |
|  | Y | U | V | Y | U | V |
| Class A | −0.1% | −0.1% | −0.2% | −0.2% | −0.2% | −0.1% |
| Class B | 0.0% | 0.1% | −0.1% | −0.1% | 0.1% | −0.1% |
| Class C | −0.2% | 0.1% | 0.1% | −0.2% | 0.2% | 0.2% |

TABLE 3.1-continued

Simulation results for QP = {22, 27, 32, 37}

| | | | | | | |
|---|---|---|---|---|---|---|
| Class D | −0.2% | 0.2% | 0.0% | −0.2% | 0.2% | 0.1% |
| Class E | −0.2% | 0.0% | 0.0% | −0.2% | 0.0% | 0.0% |
| Overall | −0.1% | 0.1% | 0.0% | −0.2% | 0.0% | 0.0% |
| | −0.1% | 0.1% | 0.0% | −0.2% | 0.0% | 0.0% |
| Class F | 0.2% | 0.5% | 0.3% | 0.2% | 0.2% | 0.2% |
| Enc Time[%] | | 103% | | | 102% | |
| Dec Time[%] | | 100% | | | 100% | |

| | Random Access Main | | | Random Access HE10 | | |
|---|---|---|---|---|---|---|
| | Y | U | V | Y | U | V |
| Class A | 0.1% | 0.4% | 0.5% | 0.0% | 0.0% | −0.2% |
| Class B | 0.0% | 0.0% | 0.0% | 0.0% | 0.2% | 0.1% |
| Class C | −0.2% | 0.2% | 0.0% | −0.1% | 0.1% | 0.0% |
| Class D | −0.2% | 0.1% | 0.2% | −0.1% | 0.2% | 0.3% |
| Class E | | | | | | |
| Overall | −0.1% | 0.2% | 0.2% | 0.0% | 0.1% | 0.0% |
| | 0.0% | 0.2% | 0.2% | 0.0% | 0.2% | 0.0% |
| Class F | 0.2% | 0.3% | 0.3% | 0.1% | 0.2% | 0.1% |
| Enc Time[%] | | 103% | | | 101% | |
| Dec Time[%] | | 100% | | | 100% | |

| | Low delay B Main | | | Low delay B HE10 | | |
|---|---|---|---|---|---|---|
| | Y | U | V | Y | U | V |
| Class A | | | | | | |
| Class B | 0.2% | 0.6% | 0.2% | 0.2% | 0.3% | 0.2% |
| Class C | 0.0% | 0.6% | 0.2% | 0.0% | 0.9% | 0.6% |
| Class D | 0.0% | 0.3% | 0.6% | 0.0% | 0.0% | 0.6% |
| Class E | 0.0% | −0.2% | 0.6% | 0.1% | 1.6% | 0.1% |
| Overall | 0.1% | 0.4% | 0.4% | 0.1% | 0.6% | 0.4% |
| | 0.1% | 0.4% | 0.3% | 0.1% | 0.7% | 0.3% |
| Class F | −0.1% | 1.1% | 0.5% | 0.1% | 0.2% | 2.7% |
| Enc Time[%] | | 101% | | | 101% | |
| Dec Time[%] | | 100% | | | 100% | |

TABLE 3.1

Simulation results for QP = {12, 17, 22, 27}

| | All Intra Main | | | All Intra HE10 | | |
|---|---|---|---|---|---|---|
| | Y | U | V | Y | U | V |
| Class A | −0.3% | −0.1% | −0.1% | −0.3% | −0.2% | −0.2% |
| Class B | 0.3% | 0.5% | 0.3% | 0.2% | 0.4% | 0.2% |
| Class C | −0.1% | 0.1% | 0.1% | −0.1% | 0.2% | 0.1% |
| Class D | −0.3% | 0.0% | 0.0% | −0.3% | 0.1% | 0.0% |
| Class E | −0.2% | 0.0% | 0.0% | −0.3% | 0.0% | 0.0% |
| Overall | −0.1% | 0.1% | 0.1% | −0.1% | 0.1% | 0.0% |
| | −0.1% | 0.2% | 0.1% | −0.1% | 0.1% | 0.0% |
| Class F | 0.3% | 0.4% | 0.3% | 0.3% | 0.2% | 0.4% |
| Enc Time[%] | | 111% | | | 108% | |
| Dec Time[%] | | #NUM! | | | #NUM! | |

| | Random Access Main | | | Random Access HE10 | | |
|---|---|---|---|---|---|---|
| | Y | U | V | Y | U | V |
| Class A | −0.1% | 0.1% | 0.2% | −0.1% | −0.1% | −0.2% |
| Class B | 0.2% | 0.4% | 0.2% | 0.2% | 0.3% | 0.0% |
| Class C | −0.1% | 0.3% | 0.1% | −0.1% | 0.3% | 0.1% |
| Class D | −0.1% | 0.2% | 0.2% | −0.1% | 0.3% | 0.1% |
| Class E | | | | | | |
| Overall | 0.0% | 0.2% | 0.2% | 0.0% | 0.2% | 0.0% |
| | 0.0% | 0.2% | 0.2% | 0.0% | 0.2% | 0.0% |
| Class F | 0.0% | 0.2% | 0.2% | 0.0% | 0.1% | 0.1% |
| Enc Time[%] | | 106% | | | 106% | |
| Dec Time[%] | | #NUM! | | | #NUM! | |

TABLE 3.1-continued

| | Simulation results for QP = {12, 17, 22, 27} | | | | | |
| --- | --- | --- | --- | --- | --- | --- |
| | Low delay B Main | | | Low delay B HE10 | | |
| | Y | U | V | Y | U | V |
| Class A | | | | | | |
| Class B | 0.2% | 0.4% | 0.2% | 0.2% | 0.4% | 0.2% |
| Class C | 0.0% | 0.6% | 0.2% | 0.0% | 0.6% | 0.4% |
| Class D | 0.0% | 0.3% | 0.2% | 0.0% | 0.4% | 0.4% |
| Class E | 0.1% | 0.5% | 0.1% | 0.0% | −0.1% | −0.1% |
| Overall | 0.1% | 0.5% | 0.2% | 0.1% | 0.3% | 0.2% |
| | 0.1% | 0.4% | 0.2% | 0.0% | 0.3% | 0.3% |
| Class F | −0.1% | 0.1% | 0.1% | 0.1% | 0.5% | 0.0% |
| Enc Time[%] | | 106% | | | 107% | |
| Dec Time[%] | | #NUM! | | | #NUM! | |

Although this disclosure is written with respect to the syntax elements used in transform coefficient described above, the techniques of this disclosure may be applicable if other syntax elements are used as long as the coding is done in at least two passes so that the concept of priority passes can be applied.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples have been described. These and other examples are within the scope of the following claims.

What is claimed is:

1. A method for encoding video data, the method comprising:
generating, based on one or more predictive blocks and a block of the video data, a residual sample block;
generating, based on the residual sample block, a coefficient block;
encoding, during a first coding pass of coefficients of the coefficient block, a first set of syntax elements that correspond to coefficients of the coefficient block; and
encoding, during a second coding pass of the coefficients of the coefficient block, a second set of syntax elements that correspond to at least some of the coefficients of the coefficient block, wherein encoding the second set of syntax elements comprises:
generating a first syntax element, the first syntax element being in the second set of syntax elements and corresponding to a current coefficient of the coefficient block;

selecting, based at least in part on a second syntax element and a third syntax element, a coding context for the first syntax element, wherein the second syntax element is in the first set of syntax elements and corresponds to a non-causal coefficient, wherein the third syntax element is in the second set of syntax elements and corresponds to a causal coefficient, the non-causal coefficient occurring after the current coefficient in a coding order of the second coding pass, the causal coefficient occurring before the current coefficient in the coding order of the second coding pass; and entropy encoding, based at least in part on the coding context selected for the first syntax element, the first syntax element.

2. The method of claim 1, wherein encoding the second set of syntax elements comprises:

generating the first syntax element and a fourth syntax element in parallel;

selecting, in parallel, the coding context for the first syntax element and a coding context for the fourth syntax element, wherein the coding context for the first syntax element is not selected based on the fourth syntax element and the coding context for the fourth syntax element is not selected based on the first syntax element; and entropy encoding, in parallel, the first and fourth syntax elements based on the coding contexts for the first and fourth syntax elements.

3. The method of claim 1, wherein the coefficient block comprises a plurality of sub-blocks, the coding order of the second coding pass is based on the sub-blocks, and the causal coefficient is in a different one of the sub-blocks than the current coefficient.

4. The method of claim 1, wherein each syntax element in the second set of syntax elements indicates one of the following: whether a coefficient associated with the syntax element is larger than one, or whether the coefficient associated with the syntax element is larger than two.

5. The method of claim 1, wherein selecting the coding context for the first syntax element comprises:

determining, based at least in part on the second syntax element, an estimated absolute value of the non-causal coefficient;

determining, based at least in part on the third syntax element, an actual absolute value of the causal coefficient; and selecting the coding context for the first syntax element based at least in part on the estimated absolute value of the non-causal coefficient and the actual absolute value of the causal coefficient.

6. The method of claim 1, wherein selecting the coding context for the first syntax element comprises:

determining, based at least in part on the second syntax element, an estimated absolute value of the non-causal coefficient;

determining, based at least in part on the third syntax element, an estimated absolute value of the causal coefficient; and selecting, based at least in part on the estimated absolute value of the non-causal coefficient and the estimated absolute value of the causal coefficient, the coding context for the first syntax element.

7. The method of claim 6, wherein the causal coefficient is within a particular number of coefficients of the current coefficient according to the coding order of the second coding pass and determining the estimated absolute value of the causal coefficient comprises determining the estimated absolute value of the causal coefficient to be equal to an estimated absolute value of a coefficient adjacent to the causal coefficient.

8. The method of claim 6, wherein the causal coefficient is within a particular number of coefficients of the current coefficient according to the coding order of the second coding pass and determining the estimated absolute value of the causal coefficient comprises determining the estimated absolute value of the causal coefficient to be equal to a predefined value.

9. The method of claim 6, wherein selecting the coding context for the first syntax element comprises:

applying a formula to determine, based on the estimated absolute value of the non-causal coefficient and the estimated absolute value of the causal coefficient, an index, wherein the formula applies a weighting value to the estimated absolute value of the non-causal coefficient or the estimated absolute value of the causal coefficient; and selecting, based at least in part on the index, the coding context for the first syntax element.

10. The method of claim 6, wherein selecting the coding context for the first syntax element comprises:

clipping the estimated absolute value of the non-causal coefficient to two or three bits;

clipping the estimated absolute value of the causal coefficient to two or three bits; and selecting, based at least in part on the clipped estimated absolute values of the non-causal and causal coefficients, the coding context for the first syntax element.

11. A video encoding device that comprises:

a memory configured to store video data; and one or more processors configured to:

generate, based on one or more predictive blocks and a block of the video data, a residual sample block;

generate, based on the residual sample block, a coefficient block;

encode, during a first coding pass of coefficients of the coefficient block, a first set of syntax elements that correspond to coefficients of the coefficient block; and encode, during a second coding pass of the coefficients of the coefficient block, a second set of syntax elements that correspond to at least some of the coefficients of the coefficient block, wherein the one or more processors are configured such that during the second coding pass the one or more processors:

generate a first syntax element, the first syntax element being in the second set of syntax elements and corresponding to a current coefficient of the coefficient block;

select, based at least in part on a second syntax element and a third syntax element, a coding context for the first syntax element, wherein the second syntax element is in the first set of syntax elements and corresponds to a non-causal coefficient, wherein the third syntax element is in the second set of syntax elements and corresponds to a causal coefficient, the non-causal coefficient occurring after the current coefficient in a coding order of the second coding pass, the causal coefficient occurring before the current coefficient in the coding order of the second coding pass; and entropy encode, based at least in part on the coding context selected for the first syntax element, the first syntax element.

12. The video encoding device of claim 11, wherein the one or more processors are configured to:
  generate the first syntax element and a fourth syntax element in parallel;
  select, in parallel, the coding context for the first syntax element and a coding context for the fourth syntax element, wherein the coding context for the first syntax element is not selected based on the fourth syntax element and the coding context for the fourth syntax element is not selected based on the first syntax element; and
  entropy encode, in parallel, the first and fourth syntax elements based on the coding contexts for the first and fourth syntax elements.

13. The video encoding device of claim 11, wherein the coefficient block comprises a plurality of sub-blocks, the coding order of the second coding pass is based on the sub-blocks, and the causal coefficient is in a different one of the sub-blocks than the current coefficient.

14. The video encoding device of claim 11, wherein each syntax element in the second set of syntax elements indicates one of the following: whether a coefficient associated with the syntax element is larger than one, or whether the coefficient associated with the syntax element is larger than two.

15. The video encoding device of claim 11, wherein the one or more processors are configured to:
  determine, based at least in part on the second syntax element, an estimated absolute value of the non-causal coefficient;
  determine, based at least in part on the third syntax element, an actual absolute value of the causal coefficient; and
  select the coding context for the first syntax element based at least in part on the estimated absolute value of the non-causal coefficient and the actual absolute value of the causal coefficient.

16. The video encoding device of claim 11, wherein the one or more processors are configured to:
  determine, based at least in part on the second syntax element, an estimated absolute value of the non-causal coefficient;
  determine, based at least in part on the third syntax element, an estimated absolute value of the causal coefficient; and
  select, based at least in part on the estimated absolute value of the non-causal coefficient and the estimated absolute value of the causal coefficient, the coding context for the first syntax element.

17. The video encoding device of claim 16, wherein the causal coefficient is within a particular number of coefficients of the current coefficient according to the coding order of the second coding pass and the one or more processors are configured to determine the estimated absolute value of the causal coefficient to be equal to an estimated absolute value of a coefficient adjacent to the causal coefficient.

18. The video encoding device of claim 16, wherein the causal coefficient is within a particular number of coefficients of the current coefficient according to the coding order of the second coding pass and the one or more processors are configured to determine the estimated absolute value of the causal coefficient to be equal to a predefined value.

19. The video encoding device of claim 16, wherein the one or more processors are configured to:
  apply a formula to determine, based on the estimated absolute value of the non-causal coefficient and the estimated absolute value of the causal coefficient, an index, wherein the formula applies a weighting value to the estimated absolute value of the non-causal coefficient or the estimated absolute value of the causal coefficient; and
  select, based at least in part on the index, the coding context for the first syntax element.

20. The video encoding device of claim 16, wherein the one or more processors are configured to:
  clip the estimated absolute value of the non-causal coefficient to two or three bits;
  clip the estimated absolute value of the causal coefficient to two or three bits; and
  select, based at least in part on the clipped estimated absolute values of the non-causal and causal coefficients, the coding context for the first syntax element.

21. A video encoding device comprising:
  means for generating, based on one or more predictive blocks and a block of video data, a residual sample block;
  means for generating, based on the residual sample block, a coefficient block;
  means for encoding, during a first coding pass of coefficients of the coefficient block, a first set of syntax elements that correspond to coefficients of the coefficient block; and
  means for encoding, during a second coding pass of the coefficients of the coefficient block, a second set of syntax elements that correspond to at least some of the coefficients of the coefficient block, wherein the means for encoding the second set of syntax element comprises:
    means for generating a first syntax element, the first syntax element being in the second set of syntax elements and corresponding to a current coefficient of the coefficient block;
    means for selecting, based at least in part on a second syntax element and a third syntax element, a coding context for the first syntax element, wherein the second syntax element is in the first set of syntax elements and corresponds to a non-causal coefficient, wherein the third syntax element is in the second set of syntax elements and corresponds to a causal coefficient, the non-causal coefficient occurring after the current coefficient in a coding order of the second coding pass, the causal coefficient occurring before the current coefficient in the coding order of the second coding pass; and
    means for entropy encoding, based at least in part on the coding context selected for the first syntax element, the first syntax element.

22. A non-transitory computer-readable storage medium that stores instructions that, when executed by one or more processors of a video encoding device, configure the video encoding device to:
  generate, based on one or more predictive blocks and a block of video data, a residual sample block;
  generate, based on the residual sample block, a coefficient block;
  encode, during a first coding pass of coefficients of the coefficient block, a first set of syntax elements that correspond to coefficients of the coefficient block; and
  encode, during a second coding pass of the coefficients of the coefficient block, a second set of syntax elements that correspond to at least some of the coefficients of the coefficient block, wherein the instructions configure the video encoding device such that during the second coding pass, the video encoding device:

generates a first syntax element, the first syntax element being in the second set of syntax elements and corresponding to a current coefficient of the coefficient block;

selects, based at least in part on a second syntax element and a third syntax element, a coding context for the first syntax element, wherein the second syntax element is in the first set of syntax elements and corresponds to a non-causal coefficient, wherein the third syntax element is in the second set of syntax elements and corresponds to a causal coefficient, the non-causal coefficient occurring after the current coefficient in a coding order of the second coding pass, the causal coefficient occurring before the current coefficient in the coding order of the second coding pass; and entropy encodes, based at least in part on the coding context selected for the first syntax element, the first syntax element.

23. A method for decoding video data, the method comprising:

decoding, during a first coding pass of coefficients of a coefficient block, a first set of syntax elements that correspond to coefficients of the coefficient block;

decoding, during a second coding pass of the coefficients of the coefficient block, a second set of syntax elements that correspond to at least some of the coefficients of the coefficient block, wherein decoding the second set of syntax elements comprises:

selecting, based at least in part on a second syntax element and a third syntax element, a coding context for a first syntax element, the first syntax element being in the second set of syntax elements and corresponding to a current coefficient of the coefficient block, wherein the second syntax element is in the first set of syntax elements and corresponds to a non-causal coefficient, wherein the third syntax element is in the second set of syntax elements and corresponds to a causal coefficient, the non-causal coefficient occurring after the current coefficient in a coding order of the second coding pass, the causal coefficient occurring before the current coefficient in the coding order of the second coding pass; and entropy decoding, based at least in part on the coding context selected for the first syntax element, the first syntax element;

generating, based on the coefficients of the coefficient block, a residual sample block; and reconstructing, based on one or more predictive blocks and the residual sample block, a block of the video data.

24. The method of claim 23, wherein decoding the second set of syntax elements comprises:

selecting, in parallel, the coding context for the first syntax element and a coding context for a fourth syntax element, wherein the coding context for the first syntax element is not selected based on the fourth syntax element and the coding context for the fourth syntax element is not selected based on the first syntax element; and entropy decoding, in parallel, the first and fourth syntax elements based on the coding contexts for the first and fourth syntax elements.

25. The method of claim 23, wherein the coefficient block comprises a plurality of sub-blocks, the coding order of the second coding pass is based on the sub-blocks, and the causal coefficient is in a different one of the sub-blocks than the current coefficient.

26. The method of claim 23, wherein each syntax element in the second set of syntax elements indicates one of the following: whether a coefficient associated with the syntax element is larger than one, or whether the coefficient associated with the syntax element is larger than two.

27. The method of claim 26, wherein selecting the coding context for the first syntax element comprises:

determining, based at least in part on the second syntax element, an estimated absolute value of the non-causal coefficient;

determining, based at least in part on the third syntax element, an actual absolute value of the causal coefficient; and selecting the coding context for the first syntax element based at least in part on the estimated absolute value of the non-causal coefficient and the actual absolute value of the causal coefficient.

28. The method of claim 26, wherein selecting the coding context for the first syntax element comprises:

determining, based at least in part on the second syntax element, an estimated absolute value of the non-causal coefficient;

determining, based at least in part on the third syntax element, an estimated absolute value of the causal coefficient; and selecting, based at least in part on the estimated absolute value of the non-causal coefficient and the estimated absolute value of the causal coefficient, the coding context for the first syntax element.

29. The method of claim 28, wherein the causal coefficient is within a particular number of coefficients of the current coefficient according to the coding order of the second coding pass and determining the estimated absolute value of the causal coefficient comprises determining the estimated absolute value of the causal coefficient to be equal to an estimated absolute value of a coefficient adjacent to the causal coefficient.

30. The method of claim 28, wherein the causal coefficient is within a particular number of coefficients of the current coefficient according to the coding order of the second coding pass and determining the estimated absolute value of the causal coefficient comprises determining the estimated absolute value of the causal coefficient to be equal to a predefined value.

31. The method of claim 28, wherein selecting the coding context for the first syntax element comprises:

applying a formula to determine, based on the estimated absolute value of the non-causal coefficient and the estimated absolute value of the causal coefficient, an index, wherein the formula applies a weighting value to the estimated absolute value of the non-causal coefficient or the estimated absolute value of the causal coefficient; and selecting, based at least in part on the index, the coding context for the first syntax element.

32. The method of claim 28, wherein selecting the coding context for the first syntax element comprises:

clipping the estimated absolute value of the non-causal coefficient to two or three bits;

clipping the estimated absolute value of the causal coefficient to two or three bits; and selecting, based at least in part on the clipped estimated absolute values of the non-causal and causal coefficients, the coding context for the first syntax element.

33. A video decoding device that comprises:
a memory configured to store video data; and
one or more processors configured to:
- decode, during a first coding pass of coefficients of a coefficient block, a first set of syntax elements that correspond to coefficients of the coefficient block;
- decode, during a second coding pass of the coefficients of the coefficient block, a second set of syntax elements that correspond to at least some of the coefficients of the coefficient block, wherein the one or more processors are configured such that during the second coding pass, the one or more processors:
  - select, based at least in part on a second syntax element and a third syntax element, a coding context for a first syntax element, the first syntax element being in the second set of syntax elements and corresponding to a current coefficient of the coefficient block, wherein the second syntax element is in the first set of syntax elements and corresponds to a non-causal coefficient, wherein the third syntax element is in the second set of syntax elements and corresponds to a causal coefficient, the non-causal coefficient occurring after the current coefficient in a coding order of the second coding pass, the causal coefficient occurring before the current coefficient in the coding order of the second coding pass; and
  - entropy decode, based at least in part on the coding context selected for the first syntax element, the first syntax element;
- generate, based on the coefficients of the coefficient block, a residual sample block; and
- reconstruct, based on one or more predictive blocks and the residual sample block, a block of the video data.

34. The video decoding device of claim 33, wherein the one or more processors are configured to:
- select, in parallel, the coding context for the first syntax element and a coding context for a fourth syntax element, wherein the coding context for the first syntax element is not selected based on the fourth syntax element and the coding context for the fourth syntax element is not selected based on the first syntax element; and
- entropy decode, in parallel, the first and fourth syntax elements based on the coding contexts for the first and fourth syntax elements.

35. The video decoding device of claim 33, wherein the coefficient block comprises a plurality of sub-blocks, the coding order of the second coding pass is based on the sub-blocks, the causal coefficient is in a different one of the sub-blocks than the current coefficient.

36. The video decoding device of claim 33, wherein each syntax element in the second set of syntax elements indicates one of the following: whether a coefficient associated with the syntax element is larger than one, or whether the coefficient associated with the syntax element is larger than two.

37. The video decoding device of claim 33, wherein the one or more processors are configured to:
- determine, based at least in part on the second syntax element, an estimated absolute value of the non-causal coefficient;
- determine, based at least in part on the third syntax element, an actual absolute value of the causal coefficient; and
- select the coding context for the first syntax element based at least in part on the estimated absolute value of the non-causal coefficient and the actual absolute value of the causal coefficient.

38. The video decoding device of claim 33, wherein the one or more processors are configured to:
- determine, based at least in part on the second syntax element, an estimated absolute value of the non-causal coefficient;
- determine, based at least in part on the third syntax element, an estimated absolute value of the causal coefficient; and
- select, based at least in part on the estimated absolute value of the non-causal coefficient and the estimated absolute value of the causal coefficient, the coding context for the first syntax element.

39. The video decoding device of claim 38, wherein the causal coefficient is within a particular number of coefficients of the current coefficient according to the coding order of the second coding pass and the one or more processors are configured to determine the estimated absolute value of the causal coefficient to be equal to an estimated absolute value of a coefficient adjacent to the causal coefficient.

40. The video decoding device of claim 38, wherein the causal coefficient is within a particular number of coefficients of the current coefficient according to the coding order of the second coding pass and the one or more processors are configured to determine the estimated absolute value of the causal coefficient to be equal to a predefined value.

41. The video decoding device of claim 38, wherein the one or more processors are configured to:
- apply a formula to determine, based on the estimated absolute value of the non-causal coefficient and the estimated absolute value of the causal coefficient, an index, wherein the formula applies a weighting value to the estimated absolute value of the non-causal coefficient or the estimated absolute value of the causal coefficient; and
- select, based at least in part on the index, the coding context for the first syntax element.

42. The video decoding device of claim 38, wherein the one or more processors are configured to:
- clip the estimated absolute value of the non-causal coefficient to two or three bits;
- clip the estimated absolute value of the causal coefficient to two or three bits; and
- select, based at least in part on the clipped estimated absolute values of the non-causal and causal coefficients, the coding context for the first syntax element.

43. A video decoding device comprising:
- means for decoding, during a first coding pass of coefficients of a coefficient block, a first set of syntax elements that correspond to coefficients of the coefficient block;
- means for decoding, during a second coding pass of the coefficients of the coefficient block, a second set of syntax elements that correspond to at least some of the coefficients of the coefficient block, wherein the means for performing the second coding pass comprises:
  - means for selecting, based at least in part on a second syntax element and a third syntax element, a coding context for a first syntax element, the first syntax element being in the second set of syntax elements and corresponding to a current coefficient of the coefficient block, wherein the second syntax element is in the first set of syntax elements and corresponds to a non-causal coefficient, wherein the third syntax element is in the second set of syntax elements and corresponds to a causal coefficient, the non-causal coefficient occurring after the current coefficient in a coding order of the second coding pass, the causal coefficient occurring before the current coefficient in the coding order of the second coding pass; and means for entropy decoding, based at least in part on the coding context selected for the first syntax element, the first syntax element;

means for generating, based on the coefficients of the coefficient block, a residual sample block; and reconstruct, based on one or more predictive blocks and the residual sample block, a block of video data.

44. A non-transitory computer-readable storage medium that stores instructions that, when executed by one or more processors of a video decoding device, configure the video decoding device to:

decode, during a first coding pass of coefficients of a coefficient block, a first set of syntax elements that correspond to coefficients of the coefficient block;

decode, during a second coding pass of the coefficients of the coefficient block, a second set of syntax elements that correspond to at least some of the coefficients of the coefficient block, wherein the instructions configure the video encoding device such that during the second coding pass, the video decoding device:

selects, based at least in part on a second syntax element and a third syntax element, a coding context for a first syntax element, the first syntax element being in the second set of syntax elements and corresponding to a current coefficient of the coefficient block, wherein the second syntax element is in the first set of syntax elements and corresponds to a non-causal coefficient, wherein the third syntax element is in the second set of syntax elements and corresponds to a causal coefficient, the non-causal coefficient occurring after the current coefficient in a coding order of the second coding pass, the causal coefficient occurring before the current coefficient in the coding order of the second coding pass; and entropy decodes, based at least in part on the coding context selected for the first syntax element, the first syntax element;

generate, based on the coefficients of the coefficient block, a residual sample block; and reconstruct, based on one or more predictive blocks and the residual sample block, a block of video data.

45. The video encoding device of claim 11, wherein the video encoding device comprises at least one of:
an integrated circuit;
a microprocessor; or
a wireless communication device.

46. The video decoding device of claim 33, wherein the video decoding device comprises at least one of:
an integrated circuit;
a microprocessor; or
a wireless communication device.

47. The video decoding device of claim 33, further comprising a display configured to display decoded video data.

48. The video encoding device of claim 11, further comprising a camera configured to capture the video data.

* * * * *